United States Patent
Baraskar et al.

(10) Patent No.: US 11,538,828 B2
(45) Date of Patent: Dec. 27, 2022

(54) THREE-DIMENSIONAL MEMORY DEVICE WITH HIGH MOBILITY CHANNELS AND NICKEL ALUMINUM SILICIDE OR GERMANIDE DRAIN CONTACTS AND METHOD OF MAKING THE SAME

(71) Applicant: SANDISK TECHNOLOGIES LLC, Addison, TX (US)

(72) Inventors: Ashish Baraskar, Santa Clara, CA (US); Raghuveer S. Makala, Campbell, CA (US); Peter Rabkin, Cupertino, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 150 days.

(21) Appl. No.: 16/984,920

(22) Filed: Aug. 4, 2020

(65) Prior Publication Data

US 2022/0045087 A1    Feb. 10, 2022

(51) Int. Cl.
| | |
|---|---|
| *H01L 29/417* | (2006.01) |
| *H01L 27/11582* | (2017.01) |
| *H01L 27/11565* | (2017.01) |
| *H01L 27/1157* | (2017.01) |
| *H01L 21/28* | (2006.01) |
| *H01L 27/11524* | (2017.01) |
| *H01L 27/11519* | (2017.01) |
| *H01L 27/11556* | (2017.01) |

(52) U.S. Cl.
CPC .... *H01L 27/11582* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 29/4011* (2019.08); *H01L 29/41725* (2013.01)

(58) Field of Classification Search
None
See application file for complete search history.

(56) References Cited

U.S. PATENT DOCUMENTS

| | | |
|---|---|---|
| 9,331,093 B2 | 5/2016 | Rabkin et al. |
| 9,870,945 B2 | 1/2018 | Pachamuthu et al. |
| 10,121,794 B2 | 11/2018 | Gunji-Yoneoka et al. |

(Continued)

OTHER PUBLICATIONS

Notification of Transmittal of the International Search Report and the Written Opinion of the International Searching Authority for International Patent Application No. PCT/US2021/035612, dated Oct. 7, 2021, 15 pages.

(Continued)

*Primary Examiner* — Sarah K Salerno
(74) *Attorney, Agent, or Firm* — The Marbury Law Group PLLC

(57) ABSTRACT

A memory device can include a strained single-crystalline silicon layer and an alternating stack of insulating layers and electrically conductive layers located over the strained single-crystalline silicon layer. A memory opening fill structure extending through the alternating stack may include an epitaxial silicon-containing pedestal channel portion, and a vertical semiconductor channel, and a vertical stack of memory elements located adjacent to the vertical semiconductor channel. Additionally or alternatively, a drain region can include a semiconductor drain portion and a nickel-aluminum-semiconductor alloy drain portion.

15 Claims, 42 Drawing Sheets

(56) References Cited

U.S. PATENT DOCUMENTS

| | | |
|---|---|---|
| 10,700,086 B2 | 6/2020 | Makala et al. |
| 2008/0230831 A1 | 9/2008 | Noda et al. |
| 2016/0099250 A1 | 4/2016 | Rabkin et al. |
| 2016/0111435 A1 | 4/2016 | Pang et al. |
| 2016/0268209 A1 | 9/2016 | Pachamuthu et al. |
| 2017/0213821 A1 | 7/2017 | Or-Bach et al. |
| 2017/0365613 A1* | 12/2017 | Gunji-Yoneoka ............... H01L 27/1157 |
| 2019/0244933 A1 | 8/2019 | Or-Bach et al. |
| 2019/0312050 A1 | 10/2019 | Lai et al. |
| 2019/0319100 A1 | 10/2019 | Chen et al. |
| 2019/0341447 A1 | 11/2019 | Siemieniec et al. |
| 2020/0006364 A1 | 1/2020 | Rabkin et al. |
| 2020/0006374 A1 | 1/2020 | Rabkin et al. |
| 2020/0006376 A1 | 1/2020 | Makala et al. |
| 2020/0194445 A1 | 1/2020 | Sharangpani et al. |
| 2021/0028282 A1* | 1/2021 | Kumar .................. H01L 29/105 |

OTHER PUBLICATIONS

USPTO Office Communication, Non-Final Office Action for U.S. Appl. No. 16/984,920, dated Mar. 3, 2022, 8 pages.

Liu, L. et al., "Ultrathin Ni silicide contacts on Si and SiGe formed with multi thin Ni/Al layers," *2014 International Workshop on Junction Technology (IWJT)*, Shanghai, 2014, pp. 1-5, doi: 10.1109/IWJT.2014.6842058.

Parton, E. et al., "Strained Silicon—the Key to Sub-45nm CMOS," Science Direct, vol. 19, Issue 3, Apr. 2006, pp. 28-31.

U.S. Appl. No. 16/221,894, filed Dec. 17, 2018, SanDisk Technologies LLC.

U.S. Appl. No. 16/221,942, filed Dec. 27, 2018, SanDisk Technologies LLC.

U.S. Appl. No. 16/887,659, filed May 29, 2020, SanDisk Technologies LLC.

U.S. Appl. No. 16/887,738, filed May 29, 2020, SanDisk Technologies LLC.

U.S. Appl. No. 16/887,818, filed May 29, 2020, SanDisk Technologies LLC.

U.S. Appl. No. 16/907,523, filed Jun. 22, 2020, SanDisk Technologies LLC.

U.S. Appl. No. 16/910,638, filed Jun. 24, 2020, SanDisk Technologies LLC.

U.S. Appl. No. 16/984,950, filed Aug. 4, 2020, SanDisk Technologies LLC.

* cited by examiner

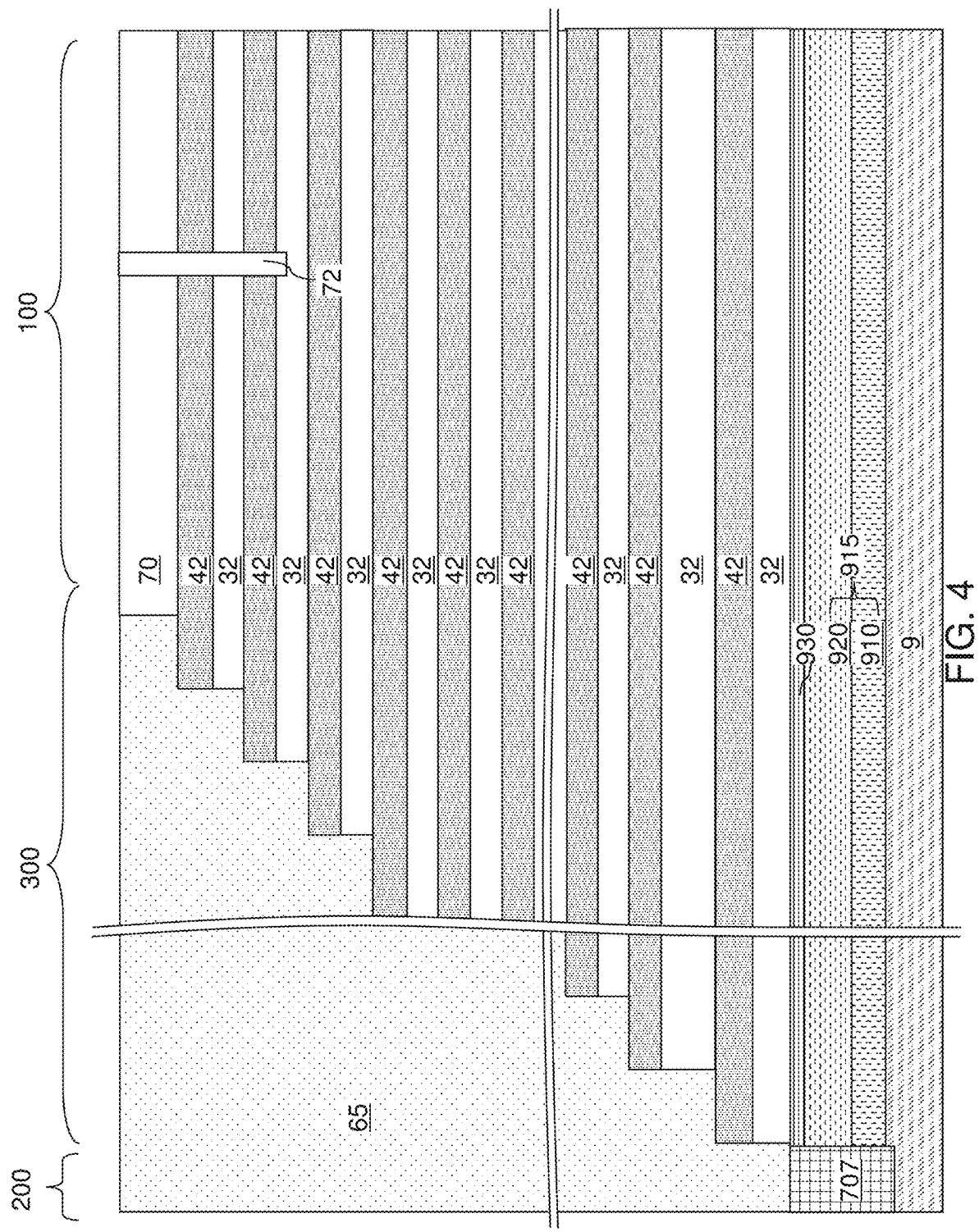

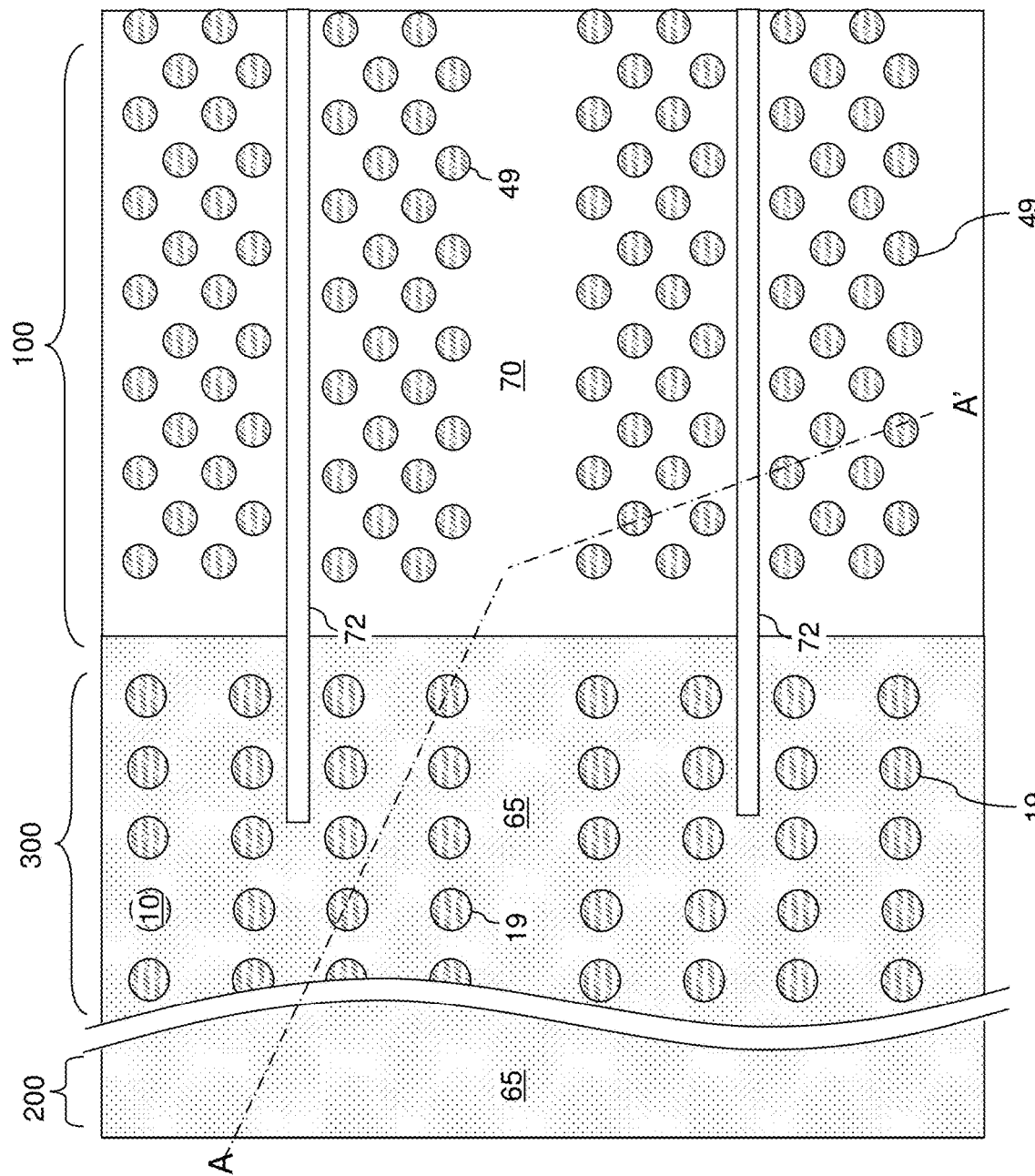

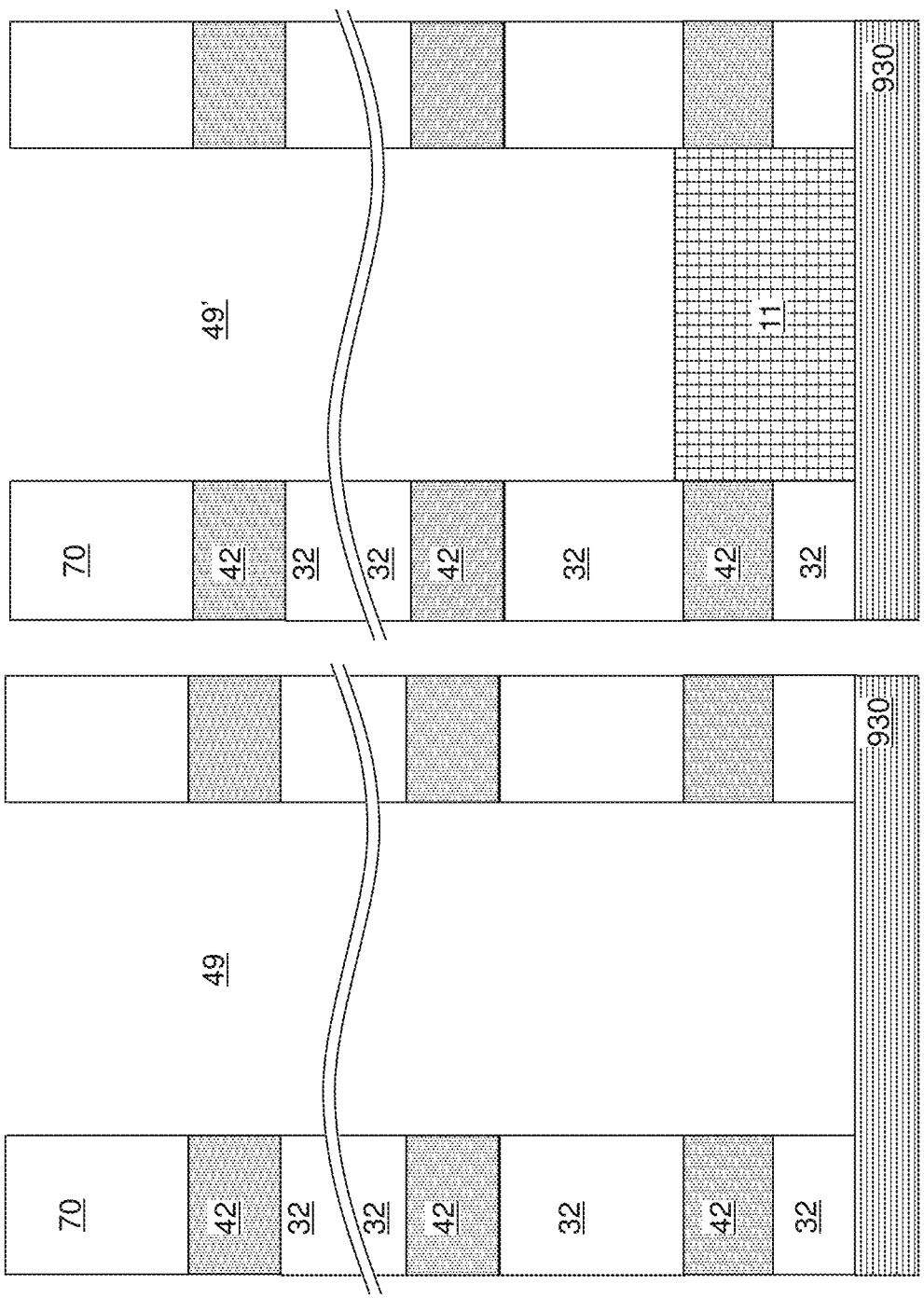

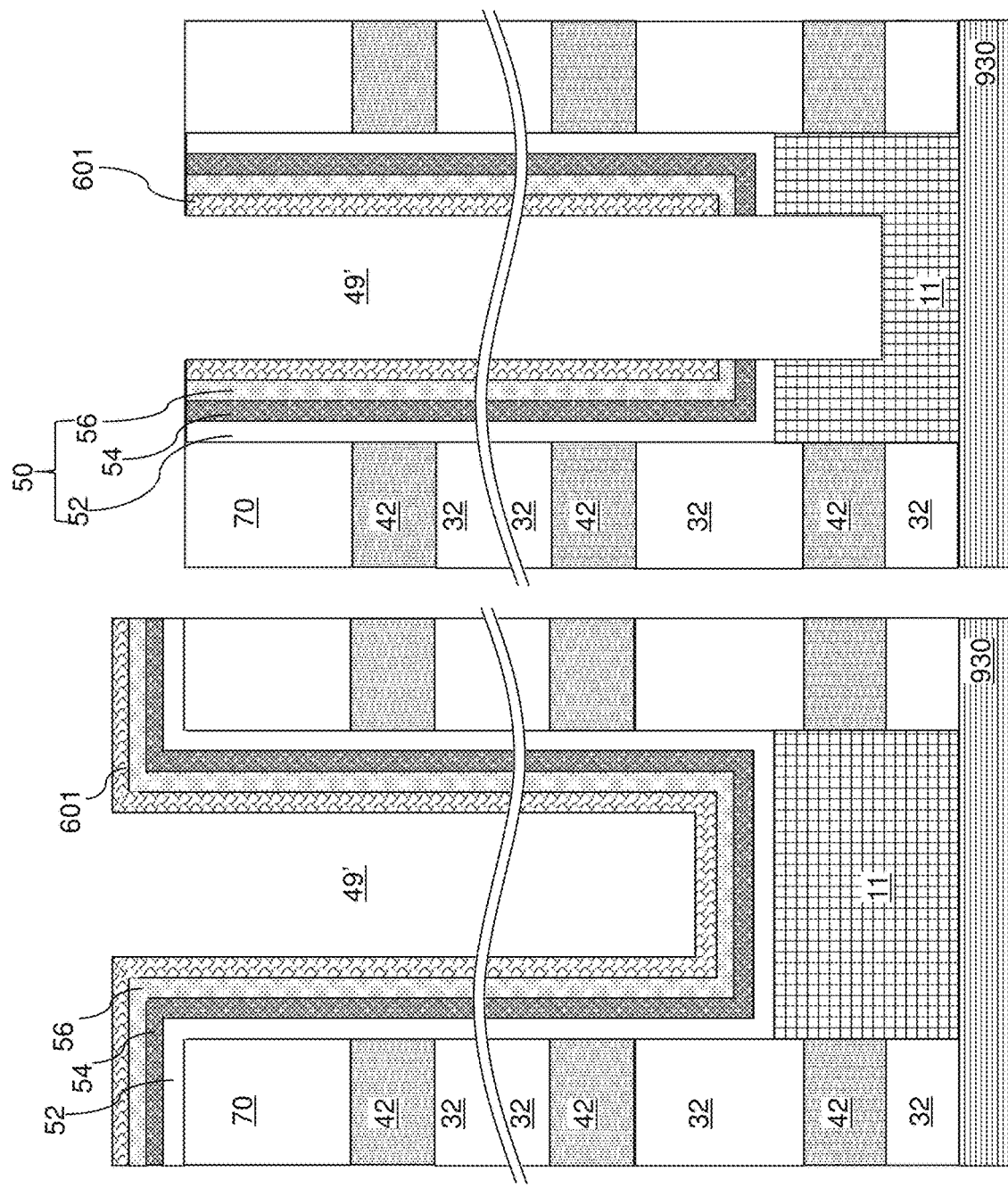

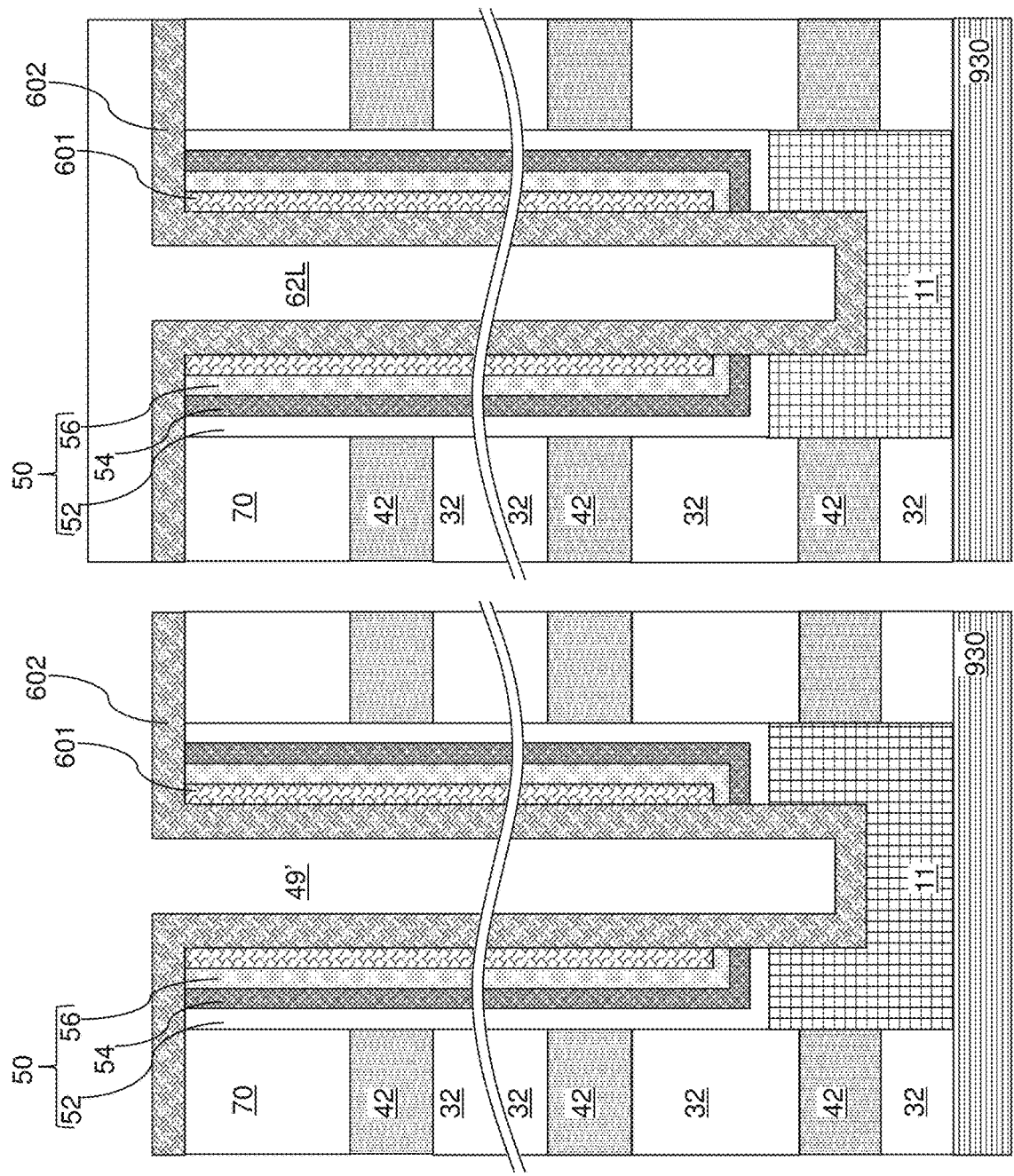

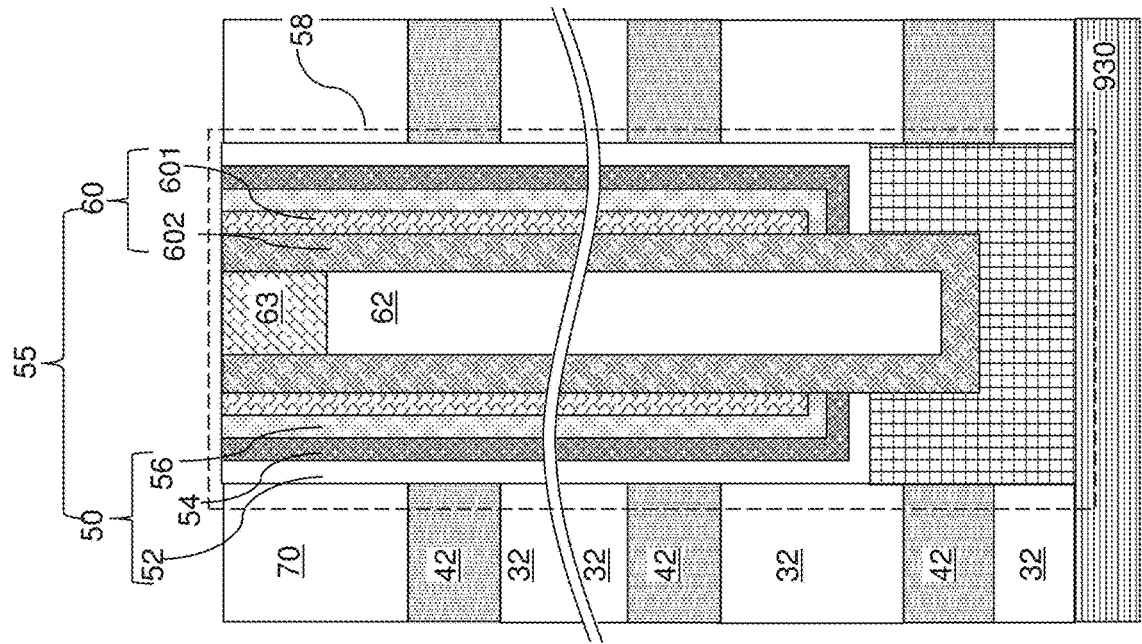
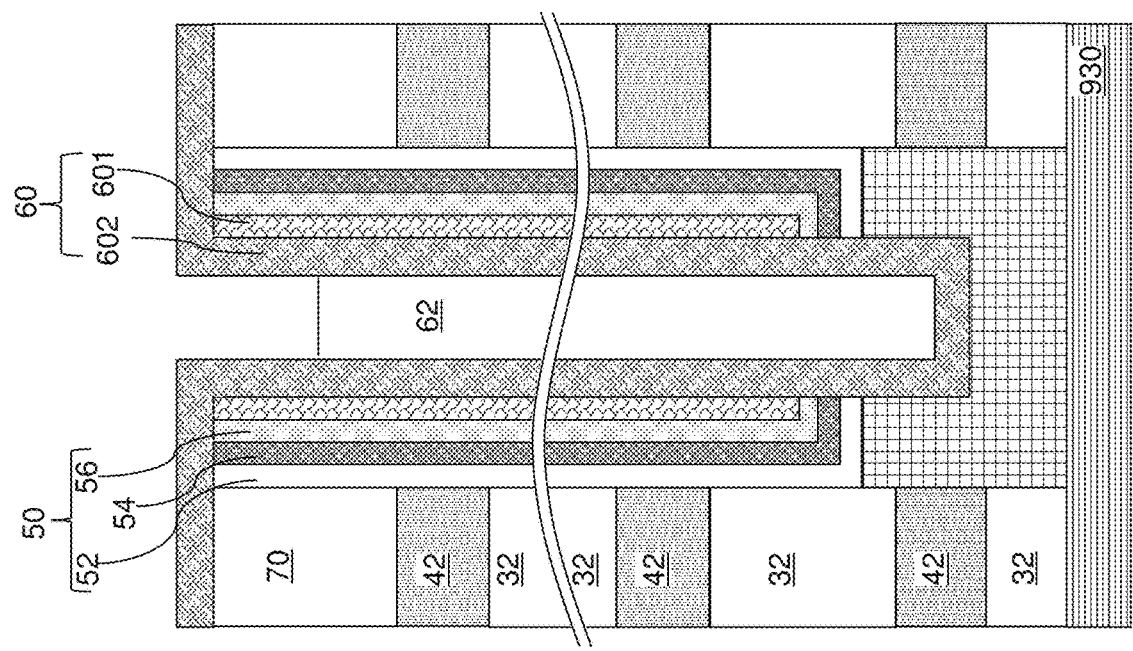

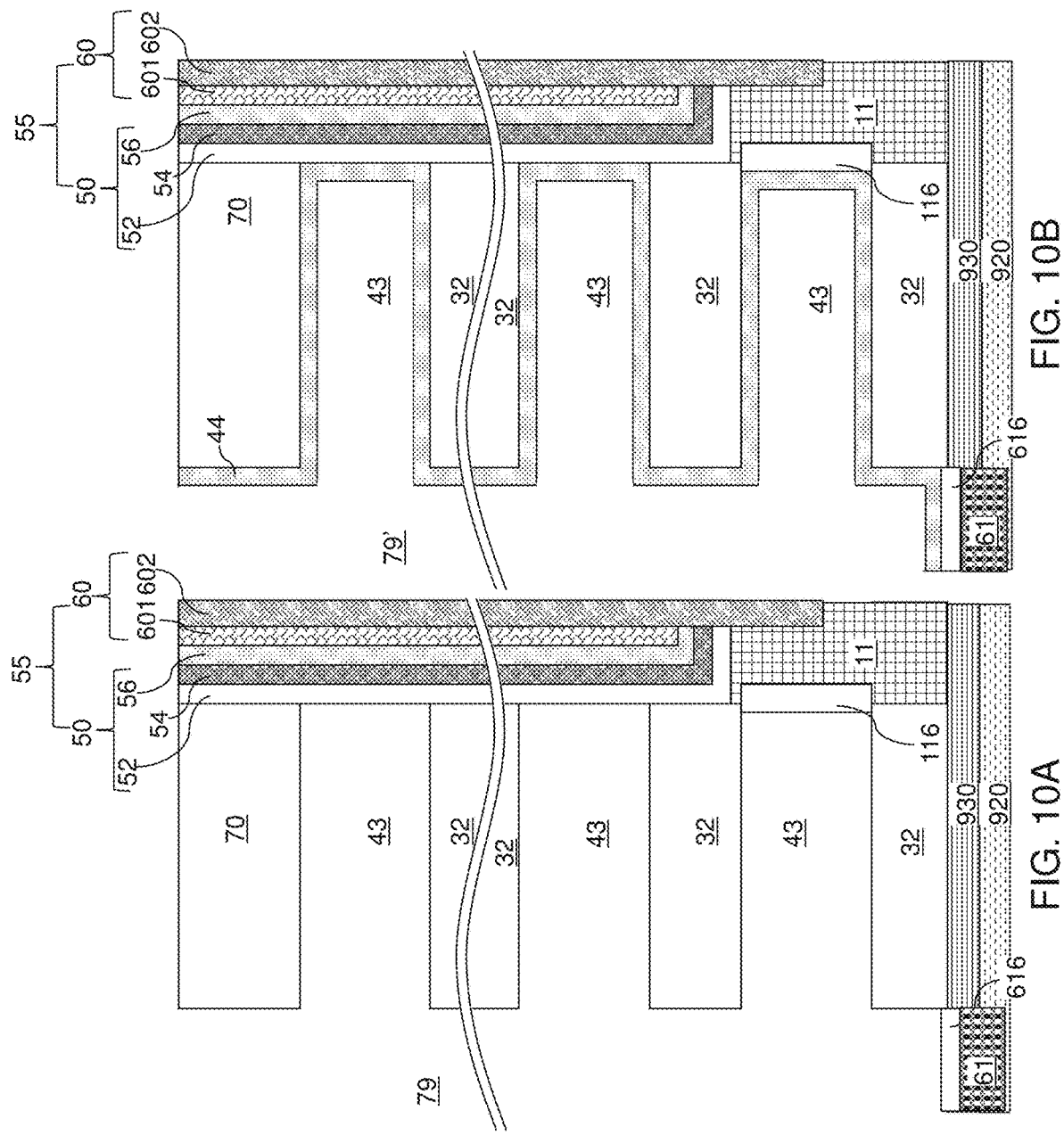

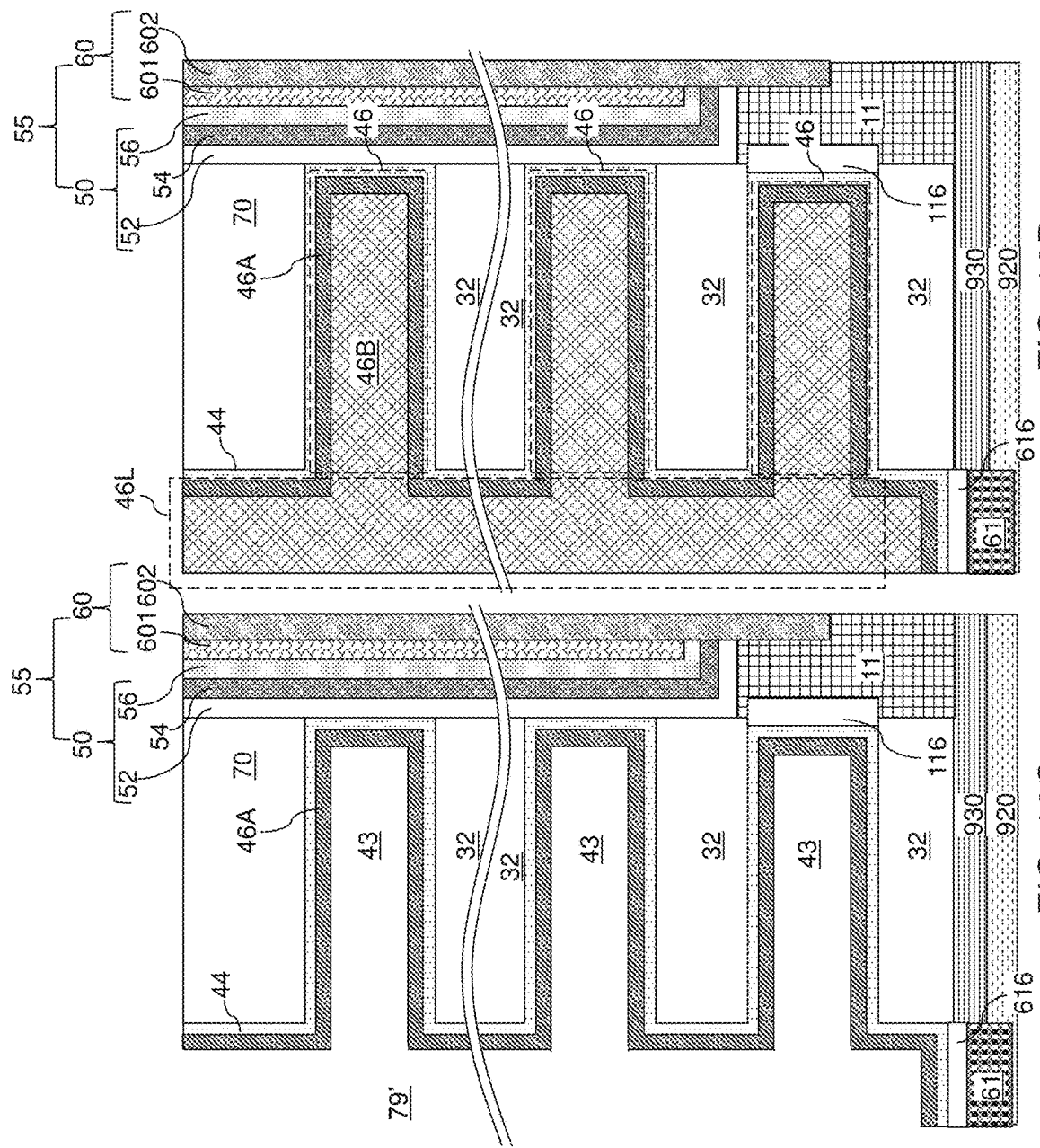

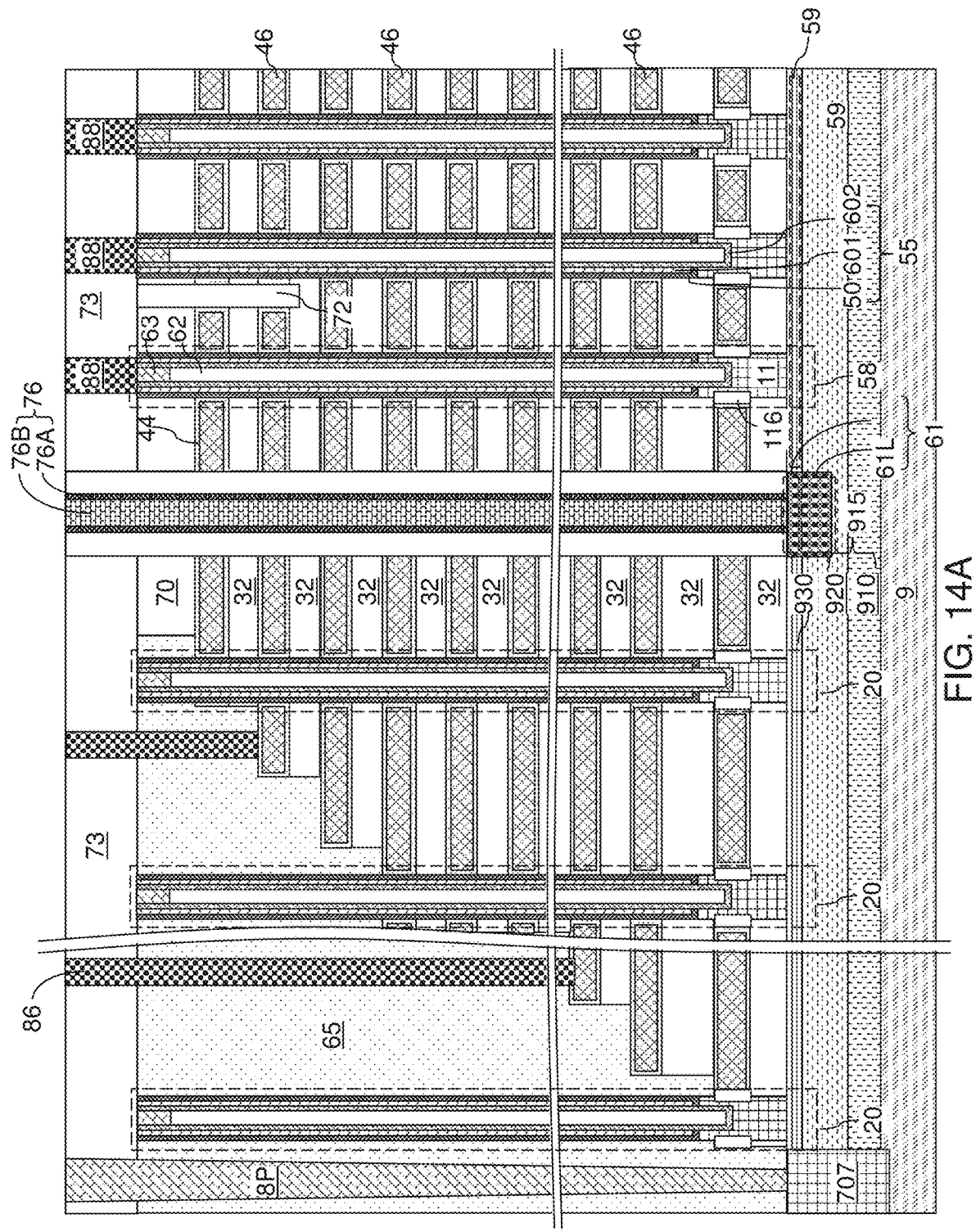

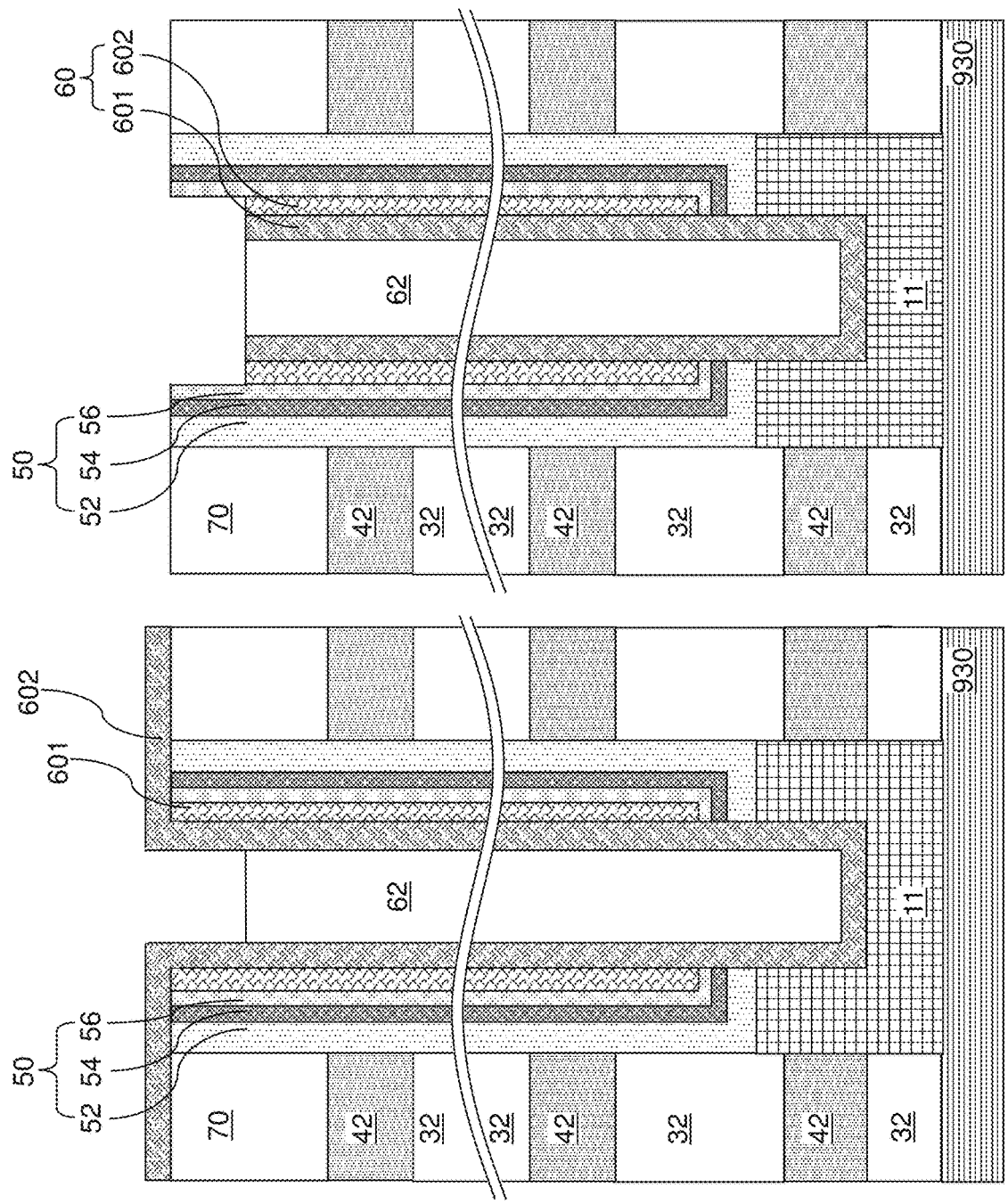

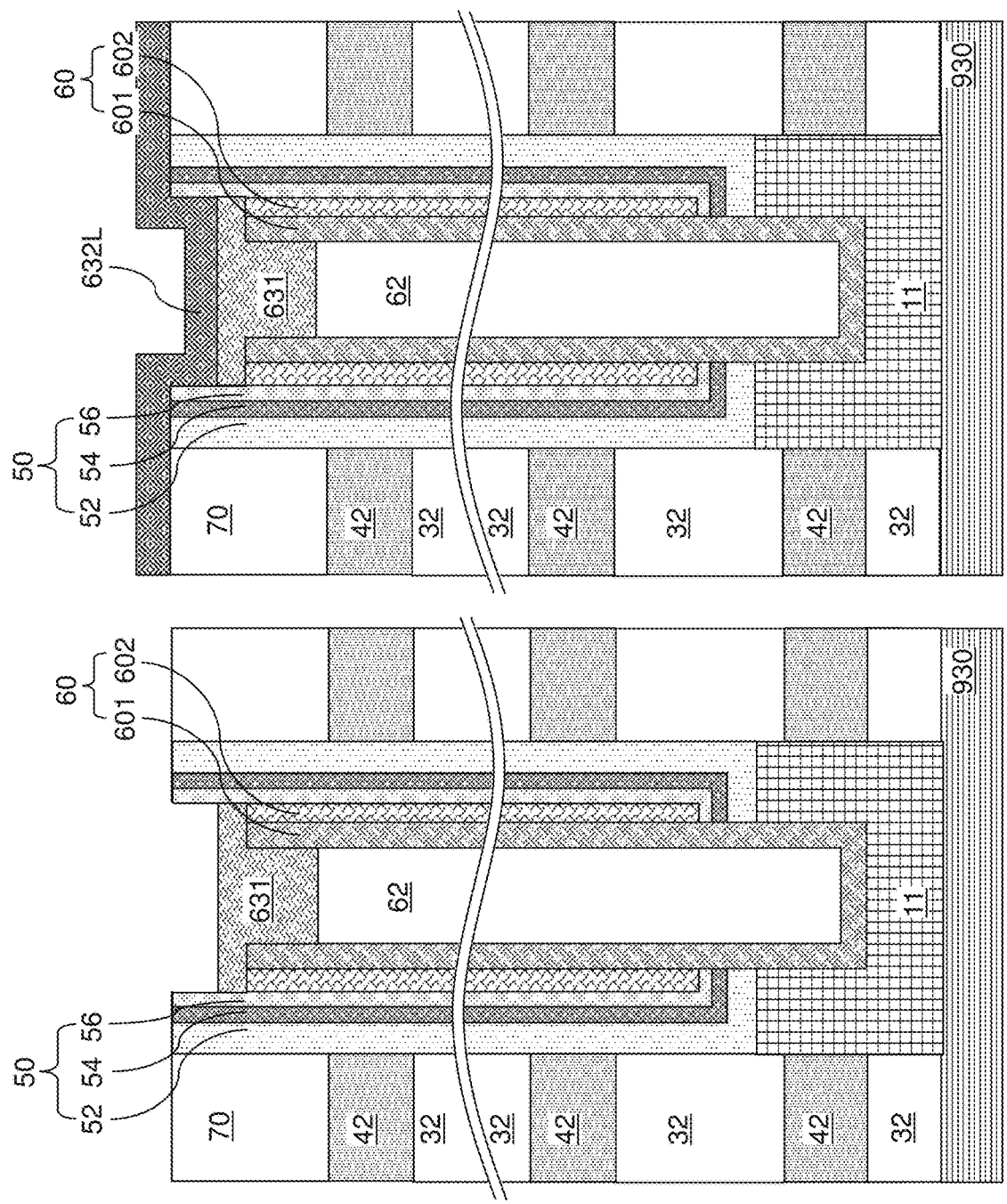

THREE-DIMENSIONAL MEMORY DEVICE WITH HIGH MOBILITY CHANNELS AND NICKEL ALUMINUM SILICIDE OR GERMANIDE DRAIN CONTACTS AND METHOD OF MAKING THE SAME

FIELD

The present disclosure relates generally to the field of semiconductor devices, and particularly to a three-dimensional memory device including strained silicon and/or silicon germanium semiconductor channels and nickel aluminum silicide and/or germanide drain contacts, and methods of making the same.

BACKGROUND

Recently, ultra-high-density storage devices employing three-dimensional (3D) memory stack structures have been proposed. Such memory stack structures can employ an architecture known as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel.

SUMMARY

According to an aspect of the present disclosure, a memory device comprises: a strained single-crystalline silicon layer; an alternating stack of insulating layers and electrically conductive layers located over the strained single-crystalline silicon layer; a memory opening vertically extending through the alternating stack; and a memory opening fill structure located in the memory opening and comprising an epitaxial silicon-containing pedestal channel portion in epitaxial alignment with the strained single-crystalline silicon layer, a vertical semiconductor channel, a vertical stack of memory elements located adjacent to the vertical semiconductor channel at levels of the electrically conductive layers, and a drain region.

According to another aspect of the present disclosure, a method of forming a memory device comprises: epitaxially growing a single-crystalline silicon-germanium compound semiconductor layer on a substrate single-crystalline silicon layer; epitaxially growing a strained single-crystalline silicon layer in epitaxial alignment with the single-crystalline silicon-germanium compound semiconductor layer; forming an alternating stack of insulating layers and spacer material layers over the strained single-crystalline silicon layer, wherein the spacer material layers are formed as, or are subsequently replaced with, electrically conductive layers; forming a memory opening through the alternating stack, wherein a top surface of the strained single-crystalline silicon layer is physically exposed; epitaxially growing an epitaxial silicon-containing pedestal channel portion in epitaxial alignment with the strained single-crystalline silicon layer at a bottom portion of the memory opening; forming a vertical stack of memory elements at a periphery of the memory opening at levels of the spacer material layers that overlie a top surface of the epitaxial silicon-containing pedestal channel portion; and forming a vertical semiconductor channel and a drain region in remaining volumes of the memory opening.

According to yet another aspect of the present disclosure, a memory device comprises: an alternating stack of insulating layers and electrically conductive layers located over a semiconductor material layer; a memory opening vertically extending through the alternating stack; and a memory opening fill structure located in the memory opening and comprising a vertical semiconductor channel, a vertical stack of memory elements located adjacent to the vertical semiconductor channel at levels of the electrically conductive layers, and a drain region, wherein the drain region comprises a semiconductor drain portion including a doped silicon-containing semiconductor material and contacting an end portion of the vertical semiconductor channel, and a nickel-aluminum-semiconductor alloy drain portion comprising silicon.

According to still another aspect of the present disclosure, a method of forming a three-dimensional memory device is provided, which comprises: forming an alternating stack of insulating layers and spacer material layers over a semiconductor material layer in a substrate, wherein the spacer material layers are formed as, or are subsequently replaced with, electrically conductive layers; forming a memory opening through the alternating stack; forming a vertical stack of memory elements at a periphery of the memory opening at levels of the spacer material layers; forming a vertical semiconductor channel over the vertical stack of memory elements; forming a semiconductor drain portion including a doped silicon-containing semiconductor material on an end portion of the vertical semiconductor channel; and converting an upper part of the semiconductor drain portion into a nickel-aluminum-semiconductor alloy drain portion by reacting the upper part of the semiconductor drain portion with a nickel-aluminum-containing material to form drain region comprising the nickel-aluminum-semiconductor alloy drain portion and a remaining lower portion of the semiconductor drain portion.

BRIEF DESCRIPTION OF THE DRAWINGS

FIG. 4 is a schematic vertical cross-sectional view of the first exemplary structure after formation of stepped terraces and a retro-stepped dielectric material portion according to the first embodiment of the present disclosure.

FIG. 5B is a top-down view of the first exemplary structure of FIG. 5A. The vertical plane A-A' is the plane of the cross-section for FIG. 5A.

FIGS. 6A-6H are sequential schematic vertical cross-sectional views of a memory opening within the first exemplary structure during formation of a memory opening fill structure therein according to the first embodiment of the present disclosure.

FIGS. 10A-10D are sequential vertical cross-sectional views of a region of the first exemplary structure during formation of electrically conductive layers in the backside recesses according to an embodiment of the present disclosure.

FIG. 14A is a schematic vertical cross-sectional view of the first exemplary structure after formation of additional contact via structures according to the first embodiment of the present disclosure.

FIGS. 15A-15I illustrate sequential vertical cross-sectional views of a memory opening during formation of a memory opening fill structure in a second exemplary structure according to a second embodiment of the present disclosure.

DETAILED DESCRIPTION

Figure 1:
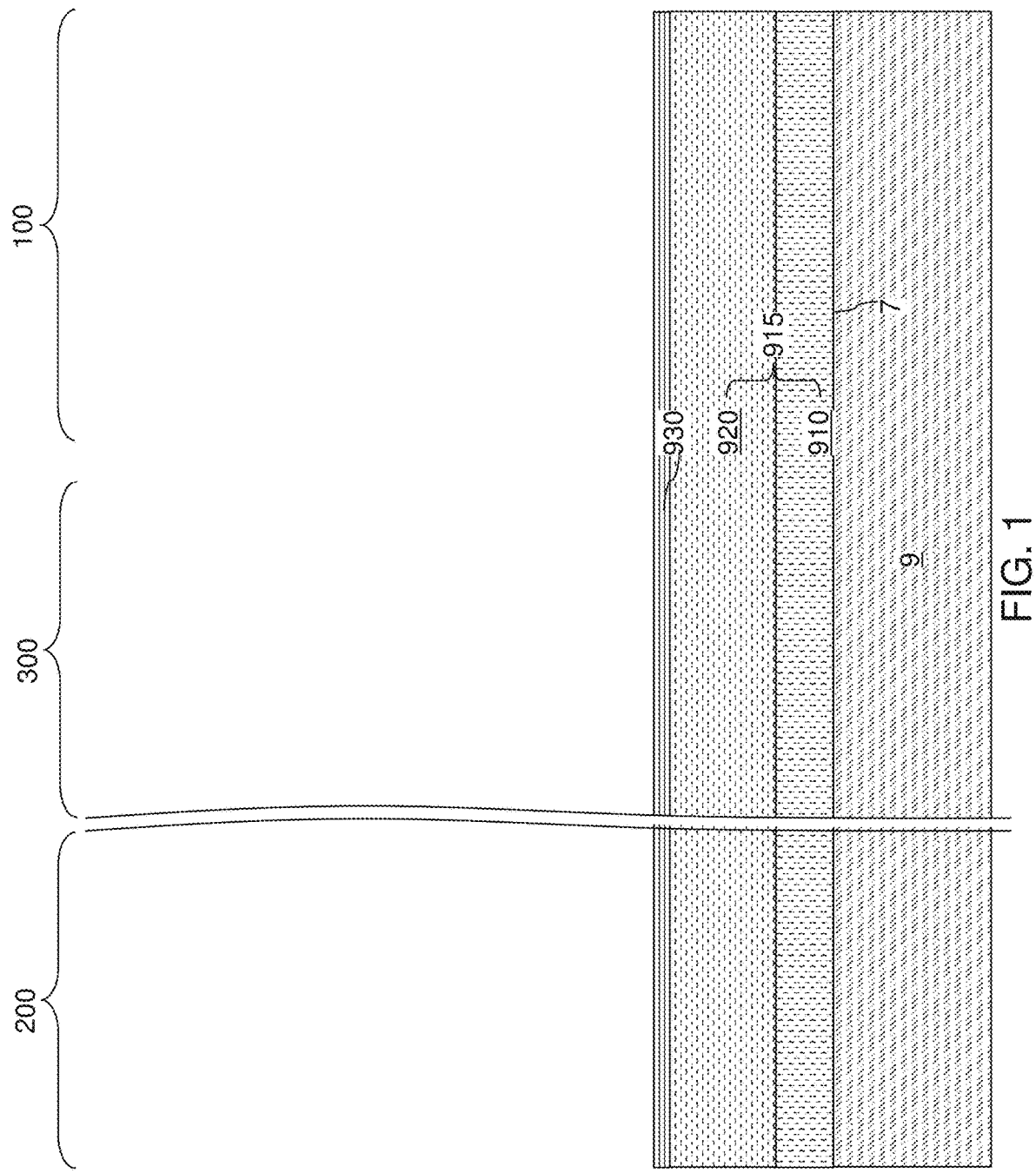
FIG. 1 is a schematic vertical cross-sectional view of a first exemplary structure after formation of a single-crystalline silicon-germanium compound semiconductor layer and a strained single-crystalline silicon layer over a substrate single-crystalline silicon layer according to a first embodiment of the present disclosure.

As discussed above, the embodiments of the present disclosure are directed to a three-dimensional memory devices including at least one of high mobility strained silicon or silicon germanium semiconductor channels and/or low resistance nickel aluminum silicide and/or germanide drain contacts to silicon germanium channels, and methods of making the same, the various aspects of which are discussed herein in detail. The cell current of the embodiment memory devices is improved by using a strained silicon on silicon germanium horizontal channel to improve the electron mobility in the horizontal portion of the channel and/or by using a nickel aluminum silicide and/or germanide drain side contacts (e.g., upper drain portions below the drain electrode) to silicon or silicon germanium drains (e.g., lower drain portions) to reduce the metal-semiconductor contact resistance for drain side contacts.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. In one embodiment, various three-dimensional memory devices of the embodiments of the present disclosure include a monolithic three-dimensional NAND string memory device, and can be fabricated employing the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded there amongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Referring to FIG. 1, a first exemplary structure according to a first embodiment of the present disclosure comprises a substrate single-crystalline silicon layer 9, which may be provided in a commercially available single-crystalline substrate. The substrate single-crystalline silicon layer 9 may comprise a portion of bulk single crystal silicon wafer, a doped well in the upper portion of the bulk single crystal silicon wafer, a single crystal silicon layer epitaxially grown on the of bulk single crystal silicon wafer, or a top silicon layer in a silicon-on-insulator (SOI) substrate. In case the substrate single-crystalline silicon layer 9 comprises a portion of the bulk silicon wafer, the thickness of the substrate single-crystalline silicon layer 9 may be in a range from 300 microns to 1 mm, although lesser and greater thicknesses may also be employed. In case the substrate single-crystalline silicon layer 9 is provided as a top silicon layer in the SOI substrate, the thickness of the substrate single-crystalline silicon layer 9 may be in a range from 100 nm to 300 nm, although lesser and greater thicknesses may also be employed.

The substrate single-crystalline silicon layer 9 can be single-crystalline throughout the entirety thereof, and can have a natural unstrained lattice constant of silicon throughout, which is the lattice constant when the material is not under any compressive or tensile stress. Single-crystalline silicon has face-centered diamond cubic crystal structure with a natural unstrained lattice constant of about 0.5431 nm as measured in the standard condition. The lattice constant along each of the [001] direction, the [010] direction, and the [001] direction is the natural unstrained lattice constant.

In one embodiment, the substrate single-crystalline silicon layer 9 has a major surface 7. The major surface 7 illustrated in FIG. 1 can be a front surface of the substrate single-crystalline silicon layer 9.

In one embodiment, the crystallographic orientations of the single-crystalline silicon within the substrate single-crystalline silicon layer 9 may be spatially oriented such that a [001] direction is aligned to the surface normal of the major surface 7. Alternatively, the crystallographic orientations of the single-crystalline silicon within the substrate single-crystalline silicon layer 9 may be oriented such that a [001] direction is tilted from the surface normal of the major plane by than 5 degrees or less, and typically by no more than 2 degrees, such as no more than 1 degree. In this case, an in-plane lattice constant can be defined within the (001) plane, i.e., the plane that is perpendicular to the [001] direction and contains the [001] direction and the [001] direction of the single-crystalline silicon. Generally, an in-plane lattice parameter of single-crystalline silicon can be defined as the average of the lattice constant for the direction and the lattice constant for the [010] direction when the [001] direction is aligned to the major direction, or is tilted from the major direction by no more than 5 degrees.

The substrate single-crystalline silicon layer 9 can be intrinsic, can have a p-type doping, or can have an n-type doping. In case the substrate single-crystalline silicon layer 9 is doped with electrical dopants, the atomic concentration of the electrical dopants in the substrate single-crystalline silicon layer 9 may be in a range from $1.0 \times 10^{14}/cm^3$ to $1.0 \times 10^{18}/cm^3$, although lesser and greater atomic concentrations may also be employed.

A single-crystalline silicon-germanium compound semiconductor layer 915 can be grown on from the major surface 7 of the substrate single-crystalline silicon layer 9 by performing an epitaxial silicon-germanium compound semiconductor deposition process. A single-crystalline silicon-germanium material can be grown in epitaxial alignment with the single-crystalline silicon material in the substrate single-crystalline silicon layer 9 by the epitaxial silicon-germanium compound semiconductor deposition process. The epitaxial silicon-germanium compound semiconductor deposition process can employ a chemical vapor deposition process in which a silicon-containing precursor gas (such as silane, dichlorosilane, trichlorosilane, disilane, silicon tetrachloride etc.) and a germanium-containing precursor gas (such as germane or digermane) are flowed into a process chamber containing the first exemplary structure concurrently with the flow of a carrier gas such as hydrogen. The ratio of the flow rate of the germanium-containing precursor gas to the flow rate of the silicon-containing precursor gas can be adjusted to vary the germanium-to-silicon ratio in the deposited single-crystalline silicon-germanium compound semiconductor material.

Generally, the single-crystalline silicon-germanium compound semiconductor material of the single-crystalline silicon-germanium compound semiconductor layer 915 can be formed with variations in the atomic percentage of germanium along the vertical direction. Thus, the single-crystalline silicon-germanium compound semiconductor layer 915 can include multiple single-crystalline silicon-germanium compound semiconductor component layers (910, 920) and/or a continuously graded single-crystalline silicon-germanium compound semiconductor layer. In one embodiment, a first single-crystalline silicon-germanium compound semiconductor component layer 910 may have a vertical composition profile in which the atomic percentage of germanium atoms increases gradually with a vertical distance from the substrate single-crystalline silicon layer 9, and a second single-crystalline silicon-germanium compound semiconductor component layer 920 may have a uniform germanium percentage throughout, which may be the same as, or may be greater than, the maximum germanium atomic percentage in the first single-crystalline silicon-germanium compound semiconductor component layer 910. While a first single-crystalline silicon-germanium compound semiconductor component layer 910 and a second single-crystalline silicon-germanium compound semiconductor component layer 920 are illustrated in FIG. 1 as component layers of the single-crystalline silicon-germanium compound semiconductor layer 915, embodiments are expressly contemplated herein which includes only one or more than two single-crystalline silicon-germanium compound semiconductor component layers.

In another embodiment, the single-crystalline silicon-germanium compound semiconductor layer 915 comprises, and/or consists essentially of, a compositionally graded single-crystalline silicon-germanium compound semiconductor material in which the atomic percentage of germanium increases monotonically with a vertical distance from the substrate single-crystalline silicon layer 9. As used herein, a function of a parameter "increases monotonically" with the parameter if the value of the function does not decrease for each increase in the value of the parameter, i.e., either results in an increase in the value of the function or the value of the function remains the same for each increase in the value of the parameter. In one embodiment, the maximum atomic percentage of germanium in the single-crystalline silicon-germanium compound semiconductor layer 915 may be in a range from 10% to 80%, such as from 15% to 75%, and/or from 20% to 50%.

In one embodiment, the single-crystalline silicon-germanium compound semiconductor layer 915 may be grown with a vertical compositional modulation such that the in-plane lattice constant (i.e., the average of the lattice constant along the [100] direction and the lattice constant of the [010] direction when the [001] direction is aligned to, or is tilted by no more than 5 degrees from, the surface normal of the major surface 7) of the single-crystalline silicon-germanium compound semiconductor layer 915 increases monotonically with a vertical distance from the substrate single-crystalline silicon layer 9. Single-crystalline germanium has face-centered diamond cubic crystal structure with a natural unstrained lattice constant of about 0.5658 nm as measured in the standard condition. As such, a silicon-germanium compound semiconductor has a greater natural unstained lattice constant than silicon, and has a lesser natural unstrained lattice constant than germanium.

The in-plane lattice constant of an interfacial portion of the single-crystalline silicon-germanium compound semiconductor layer 915 that is proximal to the substrate single-crystalline silicon layer 9 can be substantially the same as the natural unstrained lattice parameter of silicon. As the growth of the single-crystalline silicon-germanium compound semiconductor layer 915 develops, the average lattice constant of the silicon-germanium material increases with an increase in the atomic percentage of germanium, which causes formation of dislocations and gradual increase in the in-plane lattice constant of the single-crystalline silicon-germanium compound semiconductor material with a vertical distance from the major surface of the substrate single-crystalline silicon layer 9. In one embodiment, the average lattice constant of the single-crystalline silicon-germanium material increases with the vertical distance from the major surface of the substrate single-crystalline silicon layer 9 inside the first single-crystalline silicon-germanium compound semiconductor component layer 910, and remains uniform inside the second single-crystalline silicon-germanium compound semiconductor component layer 920. In this case, the dislocation density may decrease with the vertical distance from the major surface of the substrate single-crystalline silicon layer 9 inside the second single-crystalline silicon-germanium compound semiconductor component layer 920.

In one embodiment, the single-crystalline silicon-germanium compound semiconductor layer 915 can be grown to a first thickness such that the dislocation density decreases with the vertical distance from the substrate single-crystalline silicon layer 9 within an upper region of the single-crystalline silicon-germanium compound semiconductor layer 915. In other words, the single-crystalline silicon-germanium compound semiconductor layer 915 may be thick enough to induce reduction of the dislocation density (as measured in a total number of dislocations per area) in the upper region of the single-crystalline silicon-germanium compound semiconductor layer 915. In one embodiment, the first thickness of the single-crystalline silicon-germanium compound semiconductor layer 915 may be in a range from 100 nm to 2,000 nm, such as from 150 nm to 1,000 nm and/or from 200 nm to 500 nm.

The single-crystalline silicon-germanium compound semiconductor layer 915 may be deposited as an intrinsic single-crystalline silicon-germanium compound semiconductor material or as a doped single-crystalline silicon-germanium compound semiconductor material having a doping of a first conductivity type, which may be p-type or n-type. In case the substrate single-crystalline silicon layer 9 comprises a doped single-crystalline silicon material, the first conductivity type may be the same as, or may be different from, the conductivity type of the doping in the substrate single-crystalline silicon layer 9.

A strained single-crystalline silicon layer 930 can be epitaxially grown from the physically exposed top surface of the single-crystalline silicon-germanium compound semiconductor layer 915. The strained single-crystalline silicon layer 930 includes a strained single-crystalline silicon material in epitaxial alignment with the single-crystalline silicon-germanium material in the single-crystalline silicon-germanium compound semiconductor layer 915. The strained single-crystalline silicon layer 930 can be deposited by performing an epitaxy process in which a silicon-containing reactant is flowed into a process chamber including the first exemplary structure concurrently with flow of a carrier gas.

The strained single-crystalline silicon layer 930 has a second thickness, which is less than the first thickness to maintain strain in the strained single-crystalline silicon layer 930 and to minimize relaxation of the in-plane lattice constant of the strained single-crystalline silicon layer 930. In one embodiment, the ratio of the second thickness to the first thickness may be in a range from 1:1000 to 1:10, such as from 1:300 to 1:30. In one embodiment, the first thickness may be in a range from 100 nm to 2,000 nm, and the second thickness may be in a range from 5 nm to 50 nm, such as 20 nm to 30 nm.

A ratio less than one of the second thickness to the first thickness causes the silicon atoms in the strained single-crystalline silicon layer 930 to be strained along the [100] direction and along the [010] direction with an increased in-plane lattice constant. In one embodiment, the strained single-crystalline silicon layer 930 has an in-plane lattice constant that is greater than the isotropic lattice constant (i.e., the natural unstrained lattice constant) of the substrate single-crystalline silicon layer 9 by at least 0.2%, which may be at least 0.5% and/or at least 1.0% and/or at least 2.0% depending on the atomic concentration profile of germanium in the single-crystalline silicon-germanium compound semiconductor layer 915 and the first thickness and the second thickness. In one embodiment, the strained single-crystalline silicon layer may be free of germanium, or may include germanium atoms at an atomic percentage less than 0.1%, such as less than 0.01%.

In one embodiment, the strained single-crystalline silicon layer 930 may have a doping of the first conductivity type, which can be the same conductivity type as the single-crystalline silicon-germanium compound semiconductor layer 915 in case the single-crystalline silicon-germanium compound semiconductor layer 915 is doped. The atomic concentration of dopants of the first conductivity type in the strained single-crystalline silicon layer 930 may be in a range from $1.0 \times 10^{14}/cm^3$ to $1.0 \times 10^{18}/cm^3$, although lesser and greater atomic concentrations may also be employed.

The first exemplary structure may include a memory array region 100 in which a memory array is to be subsequently formed, a staircase region 300 in which contact via structures to word lines are to be subsequently formed, and an optional peripheral region 200 in which peripheral semiconductor devices are to be subsequently formed. If present, the peripheral region 200 may be employed to provide a logic (i.e., driver) circuit including field effect transistors and configured to control operation of memory elements in the memory array to be subsequently formed. Alternatively, the driver circuit may be formed below the memory array region 100 or on a separate substrate from the memory array region 100 and then bonded to the memory array region 100.

Figure 2:
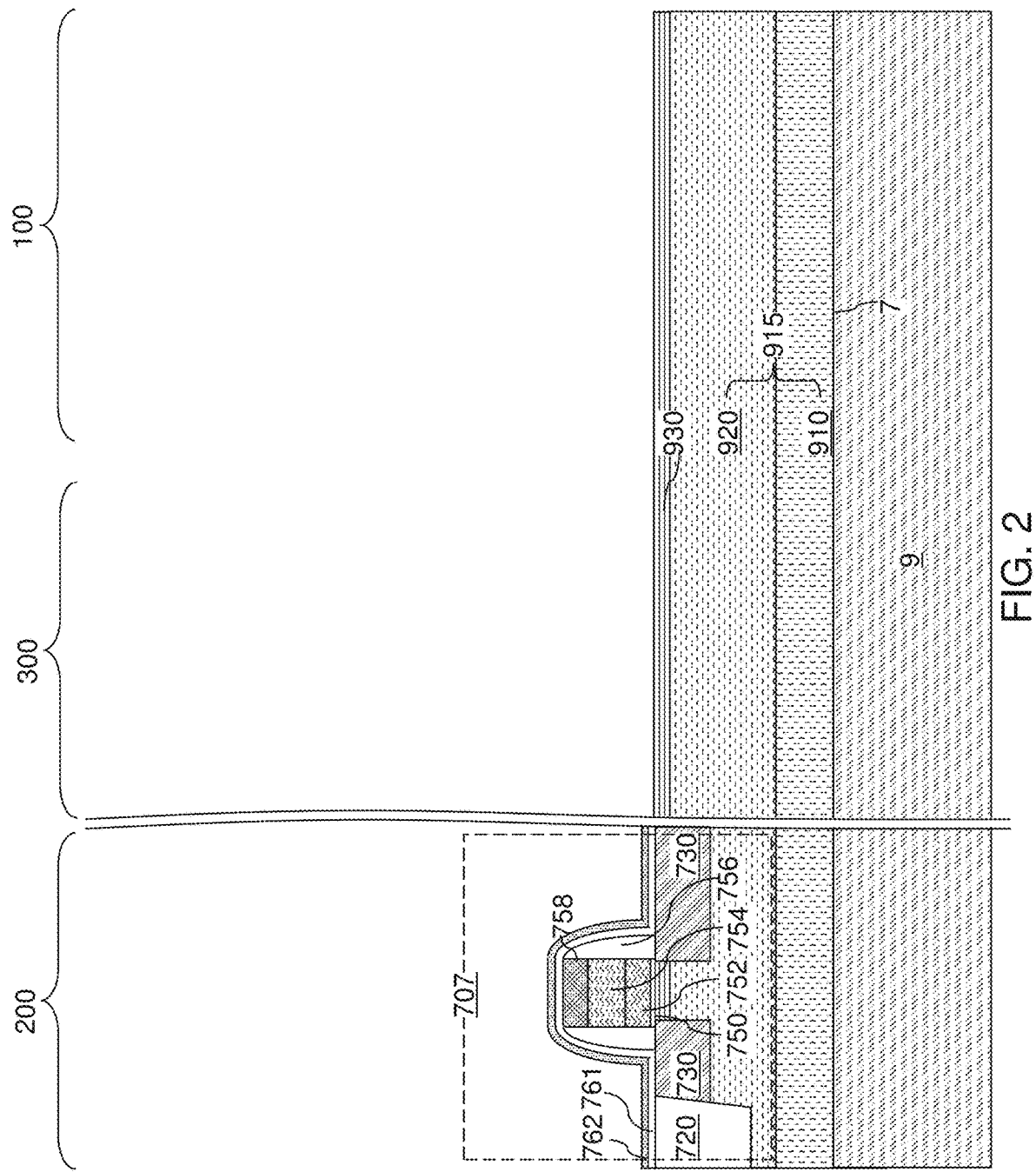
FIG. 2 is a schematic vertical cross-sectional view of the first exemplary structure after formation of semiconductor devices on the strained single-crystalline silicon layer according to the first embodiment of the present disclosure.

Referring to FIG. 2, at least one semiconductor device 707 for a peripheral circuitry can be optionally formed in the peripheral region 200. The at least one semiconductor device can include, for example, field effect transistors. For example, at least one shallow trench isolation structure 720 can be formed by etching portions of the substrate single-crystalline silicon layer 9 and depositing a dielectric material therein. A gate dielectric layer, at least one gate conductor layer, and a gate cap dielectric layer can be formed over the substrate single-crystalline silicon layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate single-crystalline silicon layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

Figure 3:
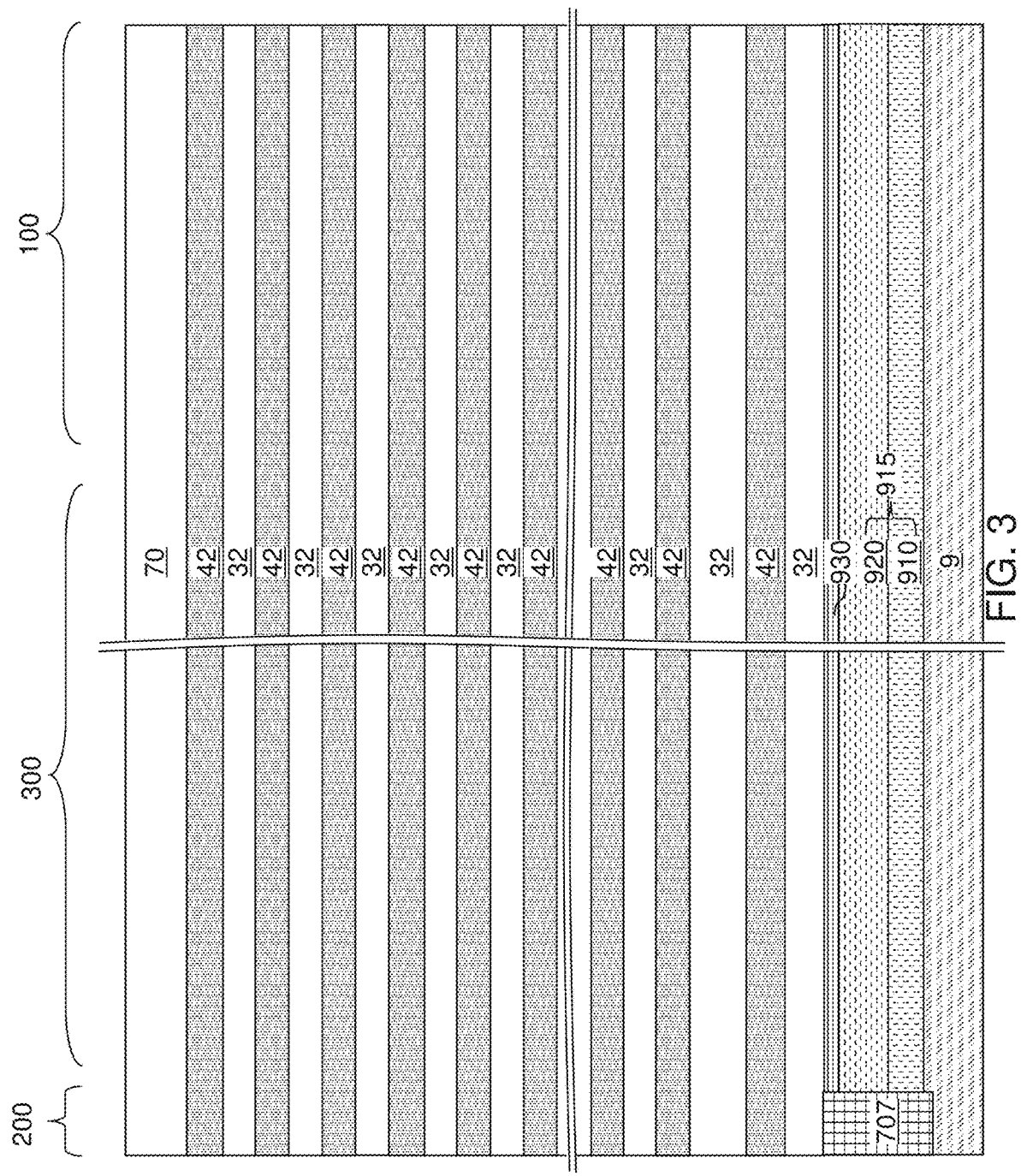
FIG. 3 is a schematic vertical cross-sectional view of the first exemplary structure after formation of an alternating stack of insulating layers and sacrificial material layers according to the first embodiment of the present disclosure.

Referring to FIG. 3, a stack of an alternating plurality of insulating layers 32 and spacer material layers can be formed over the top surface of the strained single-crystalline silicon layer 930. The spacer material layers may be formed as electrically conductive layers, or may be formed as sacrificial material layers 42 and may be subsequently replaced with electrically conductive layers. While the present disclosure is described employing an embodiment in which the spacer material layers are sacrificial material layers 42 that are subsequently replaced with electrically conductive layers, embodiments are expressly contemplated herein in which electrically conductive layers are formed instead of sacrificial material layers 42. In this case, steps for replacing the sacrificial material layers 42 with electrically conductive layers can be omitted.

The stack of the alternating plurality is herein referred to as an alternating stack (32, 42). The insulating layers 32 include a first material, which is an insulating material. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the insulating layers 32 comprise, and/or consist essentially of, silicon oxide.

The spacer material layers include a second material that is different from the first material. In case the spacer material layers are formed as the sacrificial material layers 42, the sacrificial material layers 42 include a sacrificial material that can be subsequently removed selective to the material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 comprise, and/or consist essentially of, an insulating material, a semiconductor material, or a conductive material. The sacrificial material layers 42 can be subsequently replaced with electrically conductive electrodes which can function, for example, as control gate electrodes of a vertical NAND device. Non-limiting examples of the sacrificial material that can be employed for the sacrificial material include silicon nitride, an amorphous semiconductor material (such as amorphous silicon), and a polycrystalline semiconductor material (such as polysilicon). In one embodiment, the sacrificial material layers 42 can include silicon nitride.

In one embodiment, the insulating layers 32 can include silicon oxide, and sacrificial material layers can include silicon nitride sacrificial material layers. The insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The sacrificial material layers 42 can be formed, for example, CVD or atomic layer deposition (ALD). The thicknesses of the insulating layers 32 (other than the bottommost insulating layer 32) and the sacrificial material layers 42 can be in a range from 10 nm to 60 nm, such as from 20 nm to 40 nm, although lesser and greater thicknesses can be employed for each insulating layer 32 and for each sacrificial material layer 42. The thickness of the bottommost insulating layer 32 may be in a range from 3 nm to 60 nm, such as from 6 nm to 15 nm, although lesser and greater thicknesses may also be employed. In some embodiments, the bottommost insulating layer 32 may be subsequently replaced with an electrically conductive layer that functions as a source-side electrode that turns on or turns off a horizontal semiconductor channel that is formed in the strained single-crystalline silicon layer 930.

The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer. In one embodiment, the insulating cap layer 70 may have a thickness in a range from 30 nm to 200 nm, such as from 60 nm to 120 nm, although lesser and greater thicknesses may also be employed.

Referring to FIG. 4, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces. The terrace region is formed in the staircase region 300, which is located between the memory array region 100 and the peripheral region 200 containing the at least one semiconductor device for the peripheral circuitry.

The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure. Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 5A:
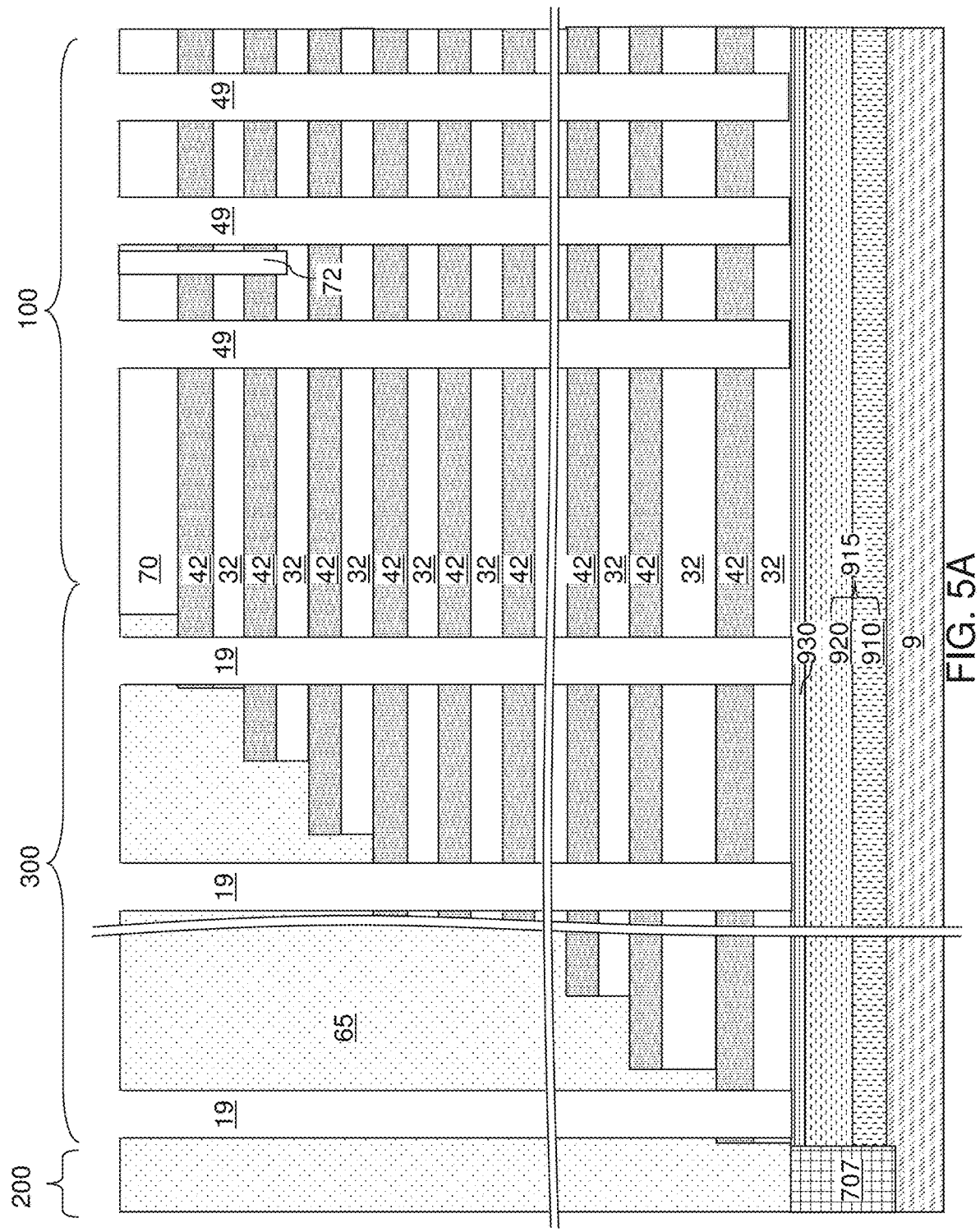
FIG. 5A is a schematic vertical cross-sectional view of the first exemplary structure after formation of memory openings and support openings according to the first embodiment of the present disclosure.

Referring to FIGS. 5A and 5B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the strained single-crystalline silicon layer 930. In one embodiment, an overetch into the strained single-crystalline silicon layer 930 may be optionally performed after the top surface of the strained single-crystalline silicon layer 930 is physically exposed at a bottom of each memory opening 49 and each support opening 19. The overetch may be performed prior to, or after, removal of the lithographic material stack. In other words, the recessed surfaces of the strained single-crystalline silicon layer 930 may be vertically offset from the un-recessed top surfaces of the strained single-crystalline silicon layer 930 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the strained single-crystalline silicon layer 930.

Each of the memory openings 49 and the support openings 19 may include a sidewall (or a plurality of sidewalls) that extends substantially perpendicular to the topmost surface of the substrate single-crystalline silicon layer 9. A two-dimensional array of memory openings 49 can be formed in the memory array region 100. A two-dimensional array of support openings 19 can be formed in the staircase region 300.

FIGS. 6A-6H illustrate structural changes in a memory opening 49, which is one of the memory openings 49 in the exemplary structure of FIGS. 5A and 5B. The same structural change occurs simultaneously in each of the other memory openings 49 and in each of the support openings 19.

Referring to FIG. 6A, a memory opening 49 in the first exemplary structure of FIGS. 5A and 5B is illustrated. The memory opening 49 extends through the insulating cap layer 70, the alternating stack (32, 42), and optionally into an upper portion of the strained single-crystalline silicon layer 930. At this processing step, each support opening 19 can extend through the retro-stepped dielectric material portion 65, a subset of layers in the alternating stack (32, 42), and optionally through the upper portion of the strained single-crystalline silicon layer 930. The recess depth of the bottom surface of each memory opening with respect to the top surface of the strained single-crystalline silicon layer 930 is less than the thickness of the strained single-crystalline silicon layer 930, and may be in a range from 0 nm to 5 nm, although greater recess depths can also be employed. Optionally, the sacrificial material layers 42 can be laterally recessed partially to form lateral recesses (not shown), for example, by an isotropic etch.

Referring to FIG. 6B, an epitaxial silicon-containing pedestal channel portion 11 can be formed at the bottom portion of each memory opening 49 and each support openings 19, for example, by performing a selective epitaxy process. The epitaxial silicon-containing pedestal channel portion 11 includes single-crystalline silicon or a single-crystalline silicon-germanium compound semiconductor. A silicon-containing precursor gas, an optional germanium-containing precursor gas, and an etchant gas can be flowed simultaneously or concurrently during the selective epitaxy process to induce growth of a single-crystalline silicon material from the physically exposed surface of the strained single-crystalline silicon layer 930 at the bottom of the memory openings 49 and the support openings 19. Each epitaxial silicon-containing pedestal channel portion 11 is formed in epitaxial alignment with the strained single-crystalline silicon layer 930 at a bottom portion of a memory opening 49 or at the bottom of a support opening 19.

In one embodiment, each epitaxial silicon-containing pedestal channel portion 11 may comprise, and/or may consist essentially of, a single-crystalline silicon material in epitaxial alignment with the single-crystalline silicon material of the strained single-crystalline silicon layer 930. In another embodiment, each epitaxial silicon-containing pedestal channel portion 11 may comprise, and/or may consist essentially of a single-crystalline silicon-germanium compound semiconductor material in epitaxial alignment with the single-crystalline silicon material of the strained single-crystalline silicon layer 930. In one embodiment, the atomic percentage of germanium within the epitaxial silicon-containing pedestal channel portion 11 may be selected to match the atomic percentage of germanium within vertical semiconductor channels to be subsequently formed. In one embodiment, the atomic percentage of germanium within the epitaxial silicon-containing pedestal channel portions 11 may be in a range from 0% to 80%, such as from 3% to 50% and/or from 6% to 30%, although lesser and greater atomic percentages may also be employed.

In one embodiment, the epitaxial silicon-containing pedestal channel portion 11 can be doped with electrical dopants of the same conductivity type as the strained single-crystalline silicon layer 930, i.e., the first conductivity type. In one embodiment, the top surface of each epitaxial silicon-containing pedestal channel portion 11 can be formed above a horizontal plane located above at least one sacrificial material layer 42 including the bottommost one of the sacrificial material layers 42. In this case, at least one source select gate electrode can be subsequently formed by replacing each sacrificial material layer 42 located below the horizontal plane including the top surfaces of the epitaxial silicon-containing pedestal channel portions 11 with a respective conductive material layer.

The epitaxial silicon-containing pedestal channel portion 11 can be a portion of a memory transistor (i.e., NAND string) channel that extends between a source region to be subsequently formed in the substrate (9, 915, 930) and a drain region to be subsequently formed in an upper portion of each memory opening 49. A memory cavity 49' is present in the unfilled portion of the memory opening 49 above the epitaxial silicon-containing pedestal channel portion 11.

Referring to FIG. 6C, a vertical stack of memory elements can be formed at a periphery of each memory opening 49 at each level of the sacrificial material layers 42 that overlie the horizontal plane including the top surfaces of the epitaxial silicon-containing pedestal channel portions 11. In one embodiment, a stack of layers including a blocking dielectric layer 52, a charge storage layer 54, and a tunneling dielectric layer 56 is formed at a periphery of each memory opening 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

A first semiconductor channel layer 601 can be optionally formed on the tunneling dielectric layer 56. The first semiconductor channel layer 601 includes a semiconductor material that has a same, or similar, material composition as the epitaxial silicon-containing pedestal channel portions 11. In one embodiment, the epitaxial silicon-containing pedestal channel portions 11 can include epitaxial single-crystalline silicon having a doping of the first conductivity type, and the first semiconductor channel layer 601 can include amorphous silicon or poly silicon having a doping of the first conductivity type. In another embodiment, the epitaxial silicon-containing pedestal channel portions 11 can include epitaxial single-crystalline silicon-germanium compound semiconductor having a doping of the first conductivity type, and the first semiconductor channel layer 601 can include an amorphous silicon-germanium compound semiconductor or a polycrystalline silicon-germanium compound semiconductor having a doping of the first conductivity type. The atomic percentage of germanium atoms in the first semiconductor channel layer 601 may be the same as, or may be within 10% such as within 2% of, the atomic percentage of germanium atoms in the epitaxial silicon-containing pedestal channel portions 11. In such cases, the electronic (i.e., conduction and valence) bands of the material of the first semiconductor channel layer 601 can be matched to the electronic bands of the epitaxial silicon-containing pedestal channel portions 11, and charge carriers passing between the first semiconductor channel layer 601 and the epitaxial silicon-containing pedestal channel portions 11 do not experience an energy barrier or experience a decreased energy barrier. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 6D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (e.g., comprising portions of the charge storage layer 54) that are insulated from surrounding materials by the blocking dielectric layer 52 and the tunneling dielectric layer 56. In some embodiments, the memory film 50 may include a layer stack containing at least a charge storage layer 54 and a tunneling dielectric layer 56, and may be formed at a periphery of each memory opening 49 over a top surface of a respective epitaxial silicon-containing pedestal channel portion 11.

The charge storage layer 54 can comprise a charge trapping material or a floating gate material. In one embodiment, each charge storage layer 54 can include a vertical stack of charge storage regions that store electrical charges upon programming. In this case, a vertical stack of memory elements may be embodied as portions of a charge storage layer 54 located at levels of the sacrificial material layers 42, which are subsequently replaced with electrically conductive layers. In one embodiment, the charge storage layer 54 can be a charge storage layer in which each portion adjacent to the sacrificial material layers 42 constitutes a charge storage region. In one embodiment, the first semiconductor channel layer 601, the tunneling dielectric layer 56, the charge storage layer 54, and the blocking dielectric layer 52 can have vertically coincident sidewalls.

A surface of the epitaxial silicon-containing pedestal channel portion 11 can be physically exposed underneath the opening through the first semiconductor channel layer 601 and the memory film 50 in each memory opening 49. Optionally, the physically exposed semiconductor surface at the bottom of each memory cavity 49' can be vertically recessed so that the recessed semiconductor surface underneath the memory cavity 49' is vertically offset from the topmost surface of the epitaxial silicon-containing pedestal channel portion 11 by a recess distance.

Referring to FIG. 6E, a second semiconductor channel layer 602 can be deposited directly on the semiconductor surface of the epitaxial silicon-containing pedestal channel portion 11 or the strained single-crystalline silicon layer 930 if the epitaxial silicon-containing pedestal channel portion 11 is omitted, and directly on the first semiconductor channel layer 601 (if present). The second semiconductor channel layer 602 includes a semiconductor material that has a same, or similar, material composition as the epitaxial silicon-containing pedestal channel portions 11. In one embodiment, the epitaxial silicon-containing pedestal channel portions 11 can include epitaxial single-crystalline silicon having a doping of the first conductivity type, and the second semiconductor channel layer 602 can include amorphous silicon or polysilicon having a doping of the first conductivity type. In another embodiment, the epitaxial silicon-containing pedestal channel portions 11 can include epitaxial single-crystalline silicon-germanium compound semiconductor having a doping of the first conductivity type, and the second semiconductor channel layer 602 can include an amorphous silicon-germanium compound semiconductor or a polycrystalline silicon-germanium compound semiconductor having a doping of the first conductivity type. The atomic percentage of germanium atoms in the second semiconductor channel layer 602 may be the same as, or may be within 10% such as within 2% of, the atomic percentage of germanium atoms in the epitaxial silicon-containing pedestal channel portions 11. In such cases, the electronic bands of the material of the second semiconductor channel layer 602 can be matched to the electronic bands of the epitaxial silicon-containing pedestal channel portions 11, and charge carriers passing between the second semiconductor channel layer 602 and the epitaxial silicon-containing pedestal channel portions 11 do not experience an energy barrier or a reduced height energy barrier. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 6F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 6G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. Generally, each vertical semiconductor channel 60 may be formed by conformally depositing at least one semiconductor material on an inner sidewall of a memory film 50 and on a physically exposed surface of an epitaxial silicon-containing pedestal channel portion 11.

Generally, the vertical semiconductor channels 60 may have a same, or similar, material composition as the epitaxial silicon-containing pedestal channel portions 11. In one embodiment, the epitaxial silicon-containing pedestal channel portions 11 can include epitaxial single-crystalline silicon having a doping of the first conductivity type, and the vertical semiconductor channels 60 can include amorphous silicon or polysilicon having a doping of the first conductivity type. In case the vertical semiconductor channels 60 include amorphous silicon, an anneal process can be subsequently performed to convert the amorphous silicon into a polysilicon. In another embodiment, the epitaxial silicon-containing pedestal channel portions 11 can include epitaxial single-crystalline silicon-germanium compound semiconductor having a doping of the first conductivity type, and the vertical semiconductor channels 60 can include an amorphous silicon-germanium compound semiconductor or a polycrystalline silicon-germanium compound semiconductor having a doping of the first conductivity type. In case the vertical semiconductor channels 60 include an amorphous silicon-germanium compound semiconductor, an anneal process can be subsequently performed to convert the amorphous silicon-germanium into a polycrystalline silicon-germanium compound semiconductor. In one embodiment, the atomic percentage of germanium within the vertical semiconductor channels 60 may be in a range from 0% to 80%, such as from 3% to 50% and/or from 6% to 30%, although lesser and greater atomic percentages may also be employed. The atomic percentage of germanium atoms in the vertical semiconductor channels 60 may be the same as, or may be within 10% such as within 2% of, the atomic percentage of germanium atoms in the epitaxial silicon-containing pedestal channel portions 11. In such cases, the electronic bands of the material of the vertical semiconductor channels 60 can be matched to the electronic bands of the epitaxial silicon-containing pedestal channel portions 11, and charge carriers passing between the vertical semiconductor channels 60 and the epitaxial silicon-containing pedestal channel portions 11 do not experience an energy barrier or a reduced energy barrier.

A tunneling dielectric layer 56 is surrounded by a charge storage layer 54, and laterally may surround a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 6H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of an epitaxial silicon-containing pedestal channel portion 11, a memory stack structure 55, a dielectric core 62, and a drain region 63 within a memory opening 49 is herein referred to as a memory opening fill structure 58. Each combination of an epitaxial silicon-containing pedestal channel portion 11, a memory film 50, a vertical semiconductor channel 60, a dielectric core 62, and a drain region 63 within each support opening 19 fills the respective support openings 19, and constitutes a support pillar structure.

Figure 7:
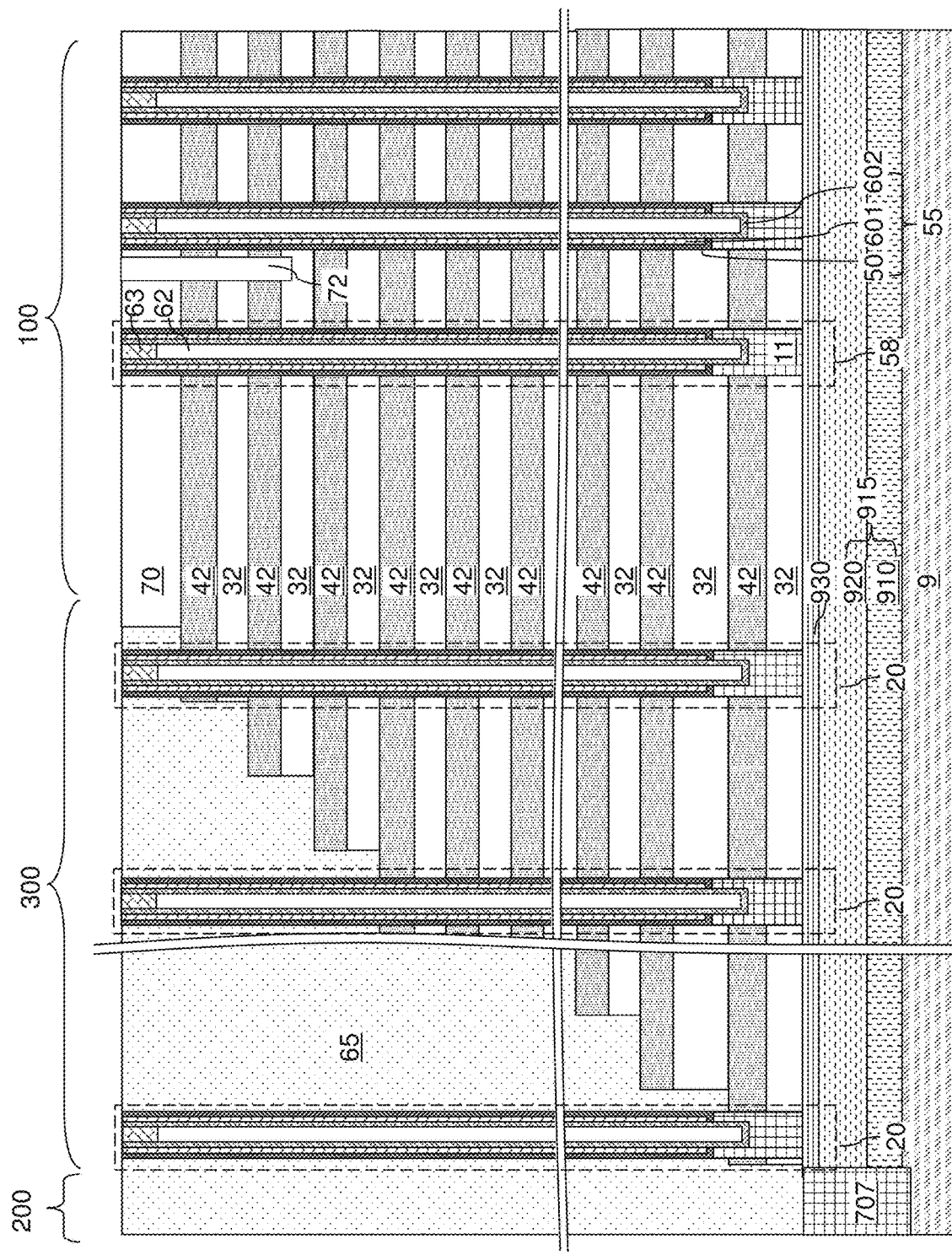
FIG. 7 is a schematic vertical cross-sectional view of the first exemplary structure after formation of memory stack structures and support pillar structures according to the first embodiment of the present disclosure.

Referring to FIG. 7, the first exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 5A and 5B. An instance of the support pillar structure 20 can be formed within each support opening 19 of the structure of FIGS. 5A and 5B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (comprising portions of a charge storage layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 8A:
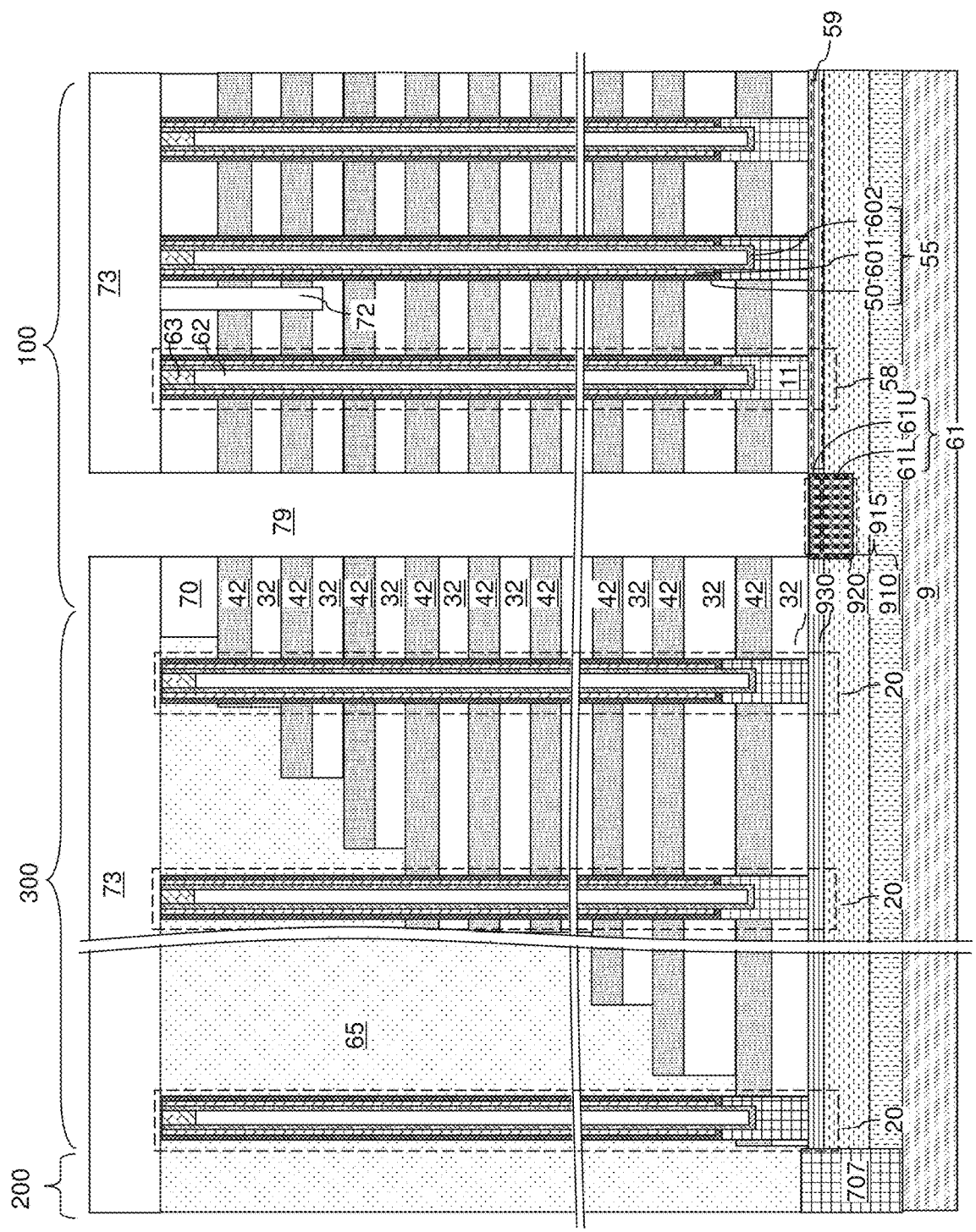
FIG. 8A is a schematic vertical cross-sectional view of the first exemplary structure after formation of backside trenches and source regions according to the first embodiment of the present disclosure.
Figure 8B:
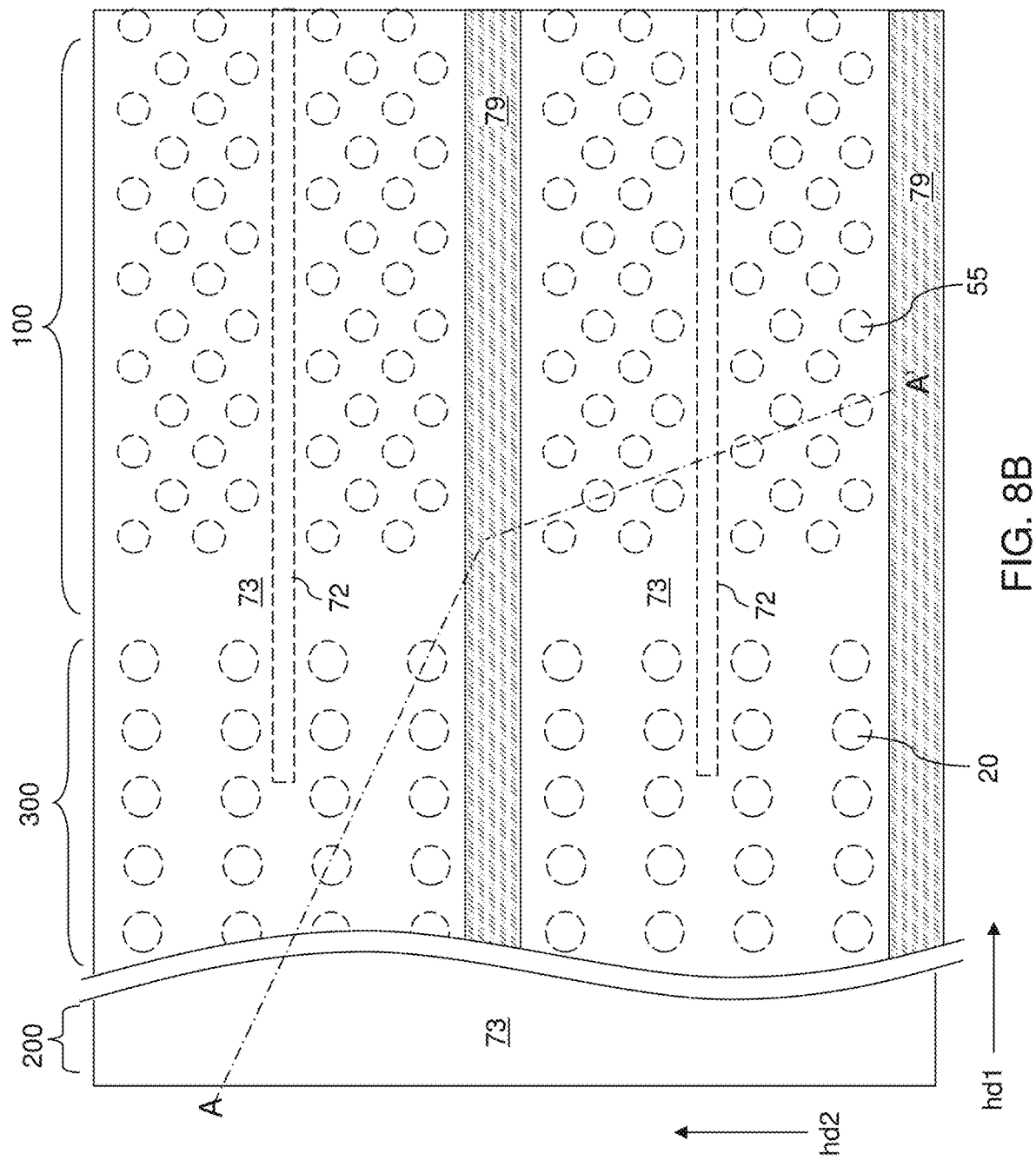
FIG. 8B is a partial see-through top-down view of the first exemplary structure of FIG. 8A. The vertical plane A-A' is the plane of the schematic vertical cross-sectional view of FIG. 8A.

Referring to FIGS. 8A and 8B, a contact-level dielectric layer 73 can be formed over the alternating stack (32, 42) of insulating layer 32 and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 915, 930), and laterally extend through the memory array region 100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the strained single-crystalline silicon layer 930 under each backside cavity 79' by implantation of electrical dopants of the second conductivity type into physically exposed portions of the strained single-crystalline silicon layer 930 and optionally into underlying portions of the single-crystalline silicon-germanium compound semiconductor layer 915. Each implanted portion of the strained single-crystalline silicon layer 930 can be converted into an upper source portion 61U, and each implanted portion (if any) of the single-crystalline silicon-germanium compound semiconductor layer 915 can be converted into an optional lower source portion 61L. Each stack of an upper source portion 61U and a lower source portion 61L constitutes a source region 61. Each source region 61 is formed in a surface portion of the substrate (9, 915, 930). Each source region 61 underlies a respective backside trench 79, and therefore, can be located outside the memory openings. Each source region 61 can have a doping of the second conductivity type, and may include dopants of the second conductivity type at an atomic concentration in a range from $5.0 \times 10^{18}/cm^3$ to $2.0 \times 10^{21}/cm^3$, although lower and higher atomic concentrations may also be employed.

Figure 9:
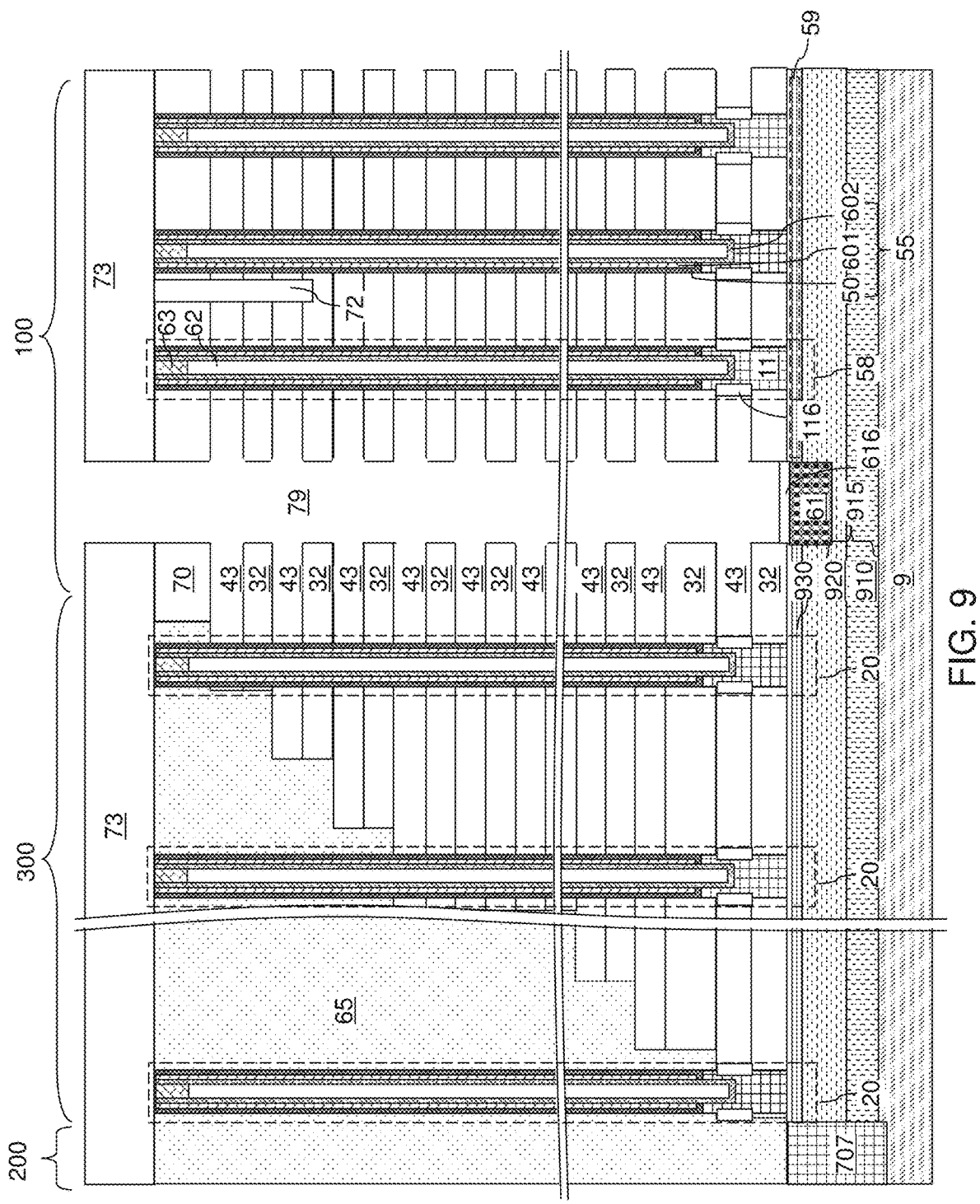
FIG. 9 is a schematic vertical cross-sectional view of the first exemplary structure after formation of backside recesses according to the first embodiment of the present disclosure.

Referring to FIGS. 9 and 10A, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the strained single-crystalline silicon layer 930, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 915, 930). In this case, each backside recess 43 can define a space for receiving a respective word line of the array of monolithic three-dimensional NAND strings.

Each of the plurality of backside recesses 43 can extend substantially parallel to the top surface of the substrate (9, 915, 930). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional epitaxial silicon-containing pedestal channel portions 11 and the strained single-crystalline silicon layer 930 can be converted into dielectric material portions by thermal conversion and/or plasma conversion of the semiconductor materials into dielectric materials. For example, thermal conversion and/or plasma conversion can be employed to convert a surface portion of each epitaxial silicon-containing pedestal channel portion 11 into a tubular dielectric spacer 116, and to convert each physically exposed surface portion of the strained single-crystalline silicon layer 930 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial silicon-containing pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the epitaxial silicon-containing pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride (i.e., silicon oxide, silicon nitride, or silicon oxynitride) of the semiconductor material of the strained single-crystalline silicon layer 930.

Referring to FIG. 10B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 10C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 11:
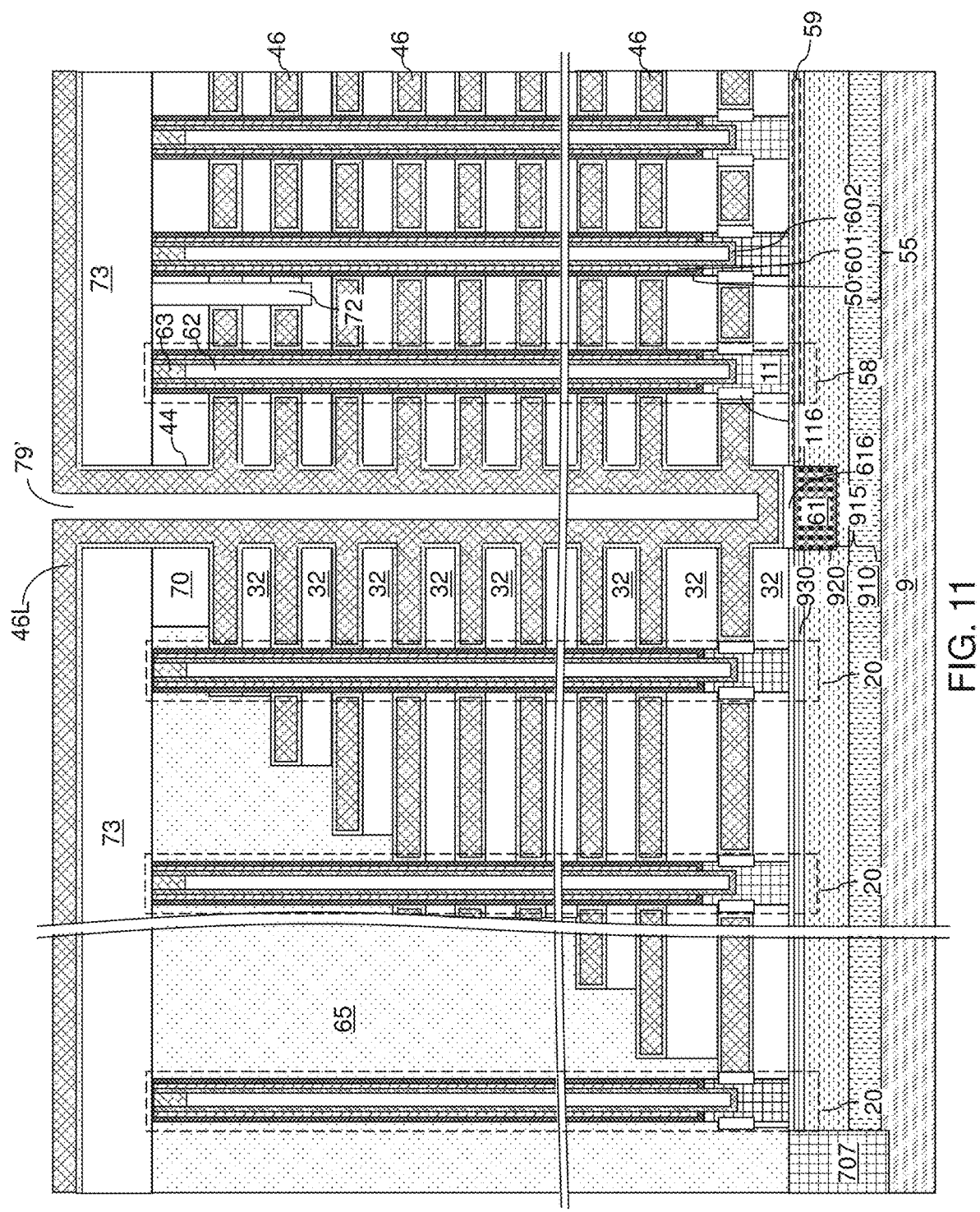
FIG. 11 is a schematic vertical cross-sectional view of the first exemplary structure after formation of electrically conductive layers according to the first embodiment of the present disclosure.

Referring to FIGS. 10D and 11, a metal fill material is deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a epitaxial silicon-containing pedestal channel portion 11. A bottommost electrically conductive layer 46 laterally surrounds each tubular dielectric spacer 116 upon formation of the electrically conductive layers 46.

Figure 12A:
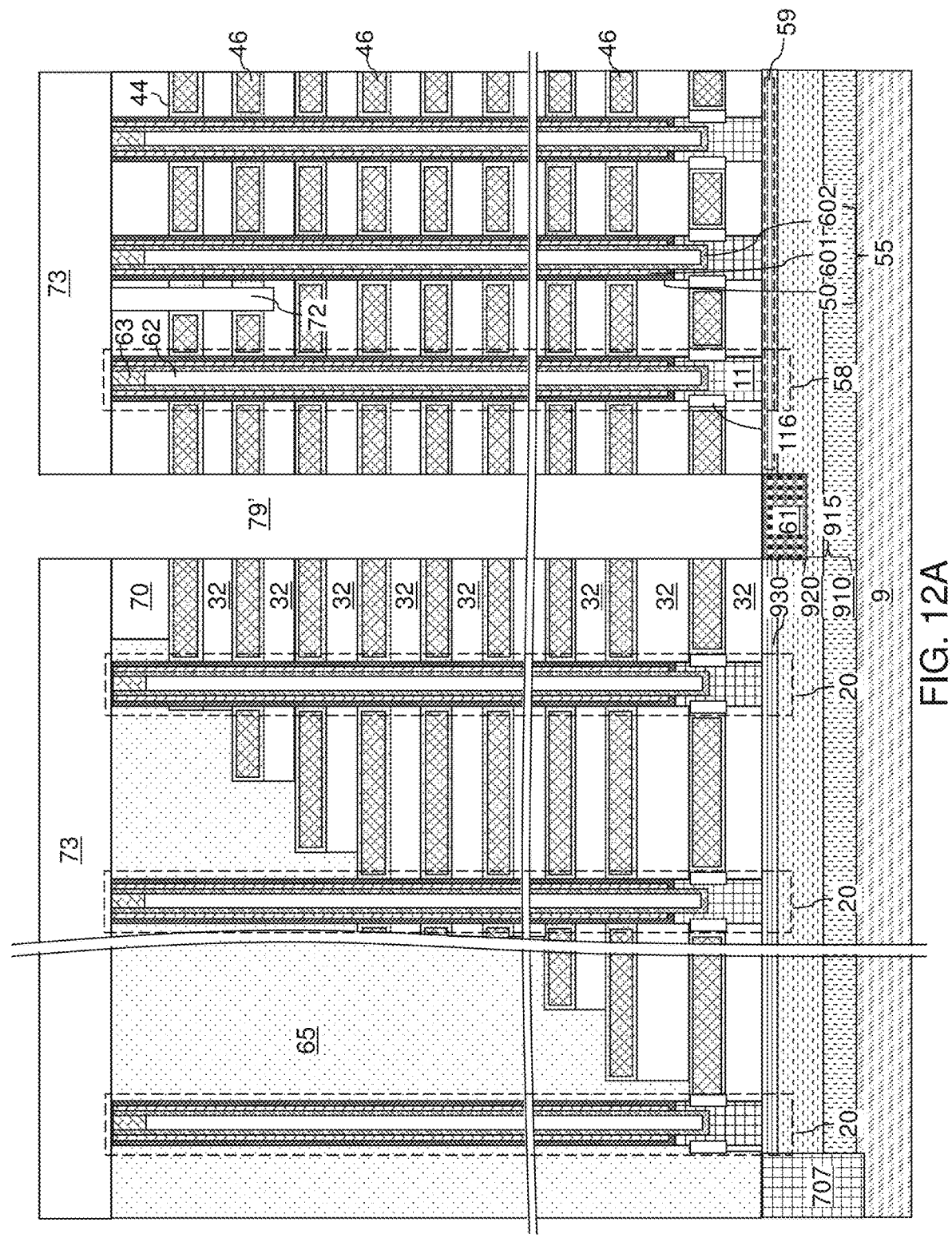
FIG. 12A is a schematic vertical cross-sectional view of the first exemplary structure after removal of an electrically conductive material from within the backside trenches according to the first embodiment of the present disclosure.
Figure 12B:
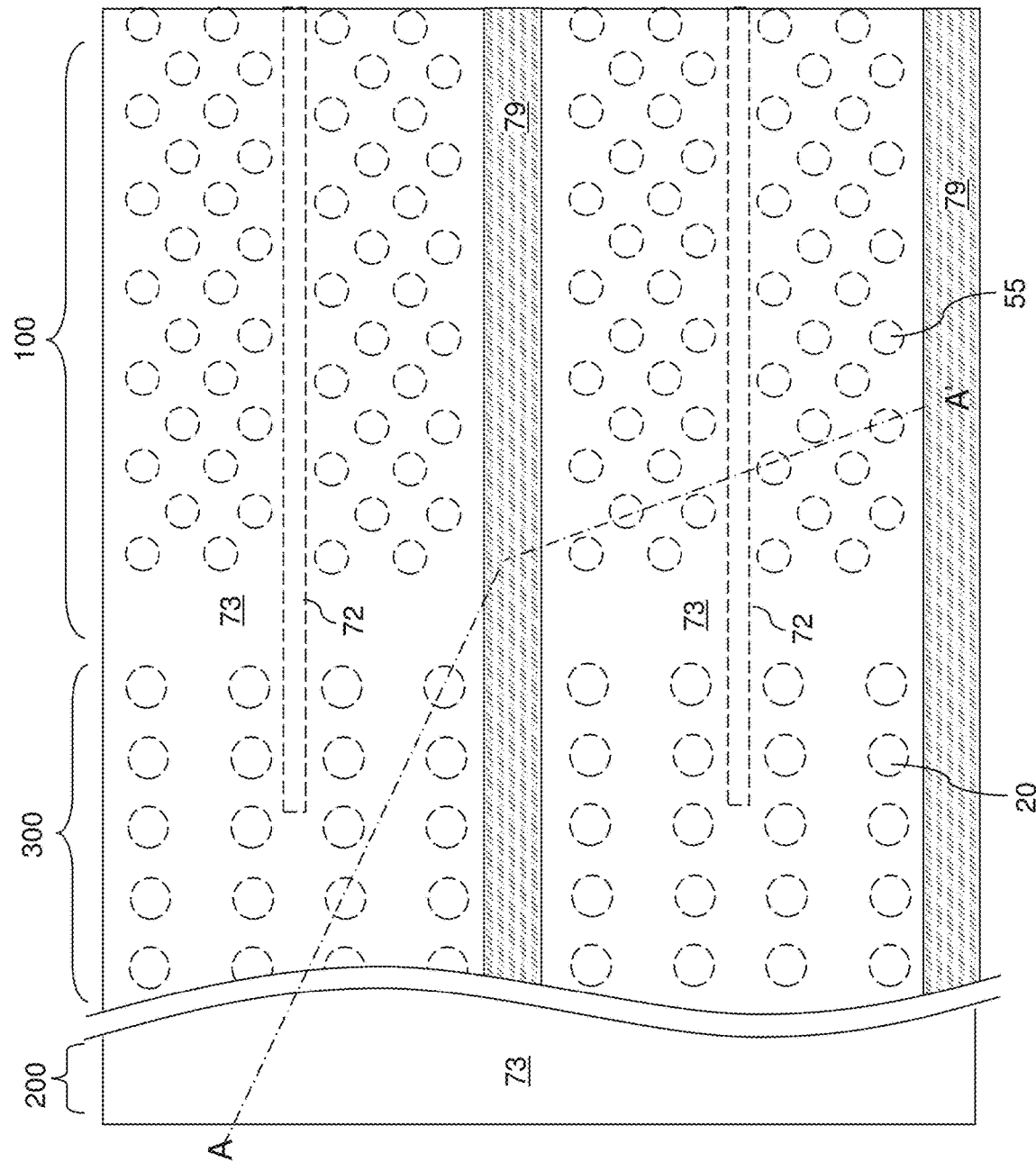
FIG. 12B is a partial see-through top-down view of the first exemplary structure of FIG. 12A. The vertical plane A-A' is the plane of the schematic vertical cross-sectional view of FIG. 12A.

Referring to FIGS. 12A and 12B, the deposited metallic material of the continuous metallic material layer 46L is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous metallic material layer 46L can be selective to the material of the backside blocking dielectric layer 44. In this case, a horizontal portion of the backside blocking dielectric layer 44 can be present at the bottom of each backside trench 79. In another embodiment, the removal of the continuous metallic material layer 46L may not be selective to the material of the backside blocking dielectric layer 44 or, the backside blocking dielectric layer 44 may not be employed. The planar dielectric portions 616 can be removed during removal of the continuous metallic material layer 46L. A backside cavity 79' is present within each backside trench 79.

Figure 13A:
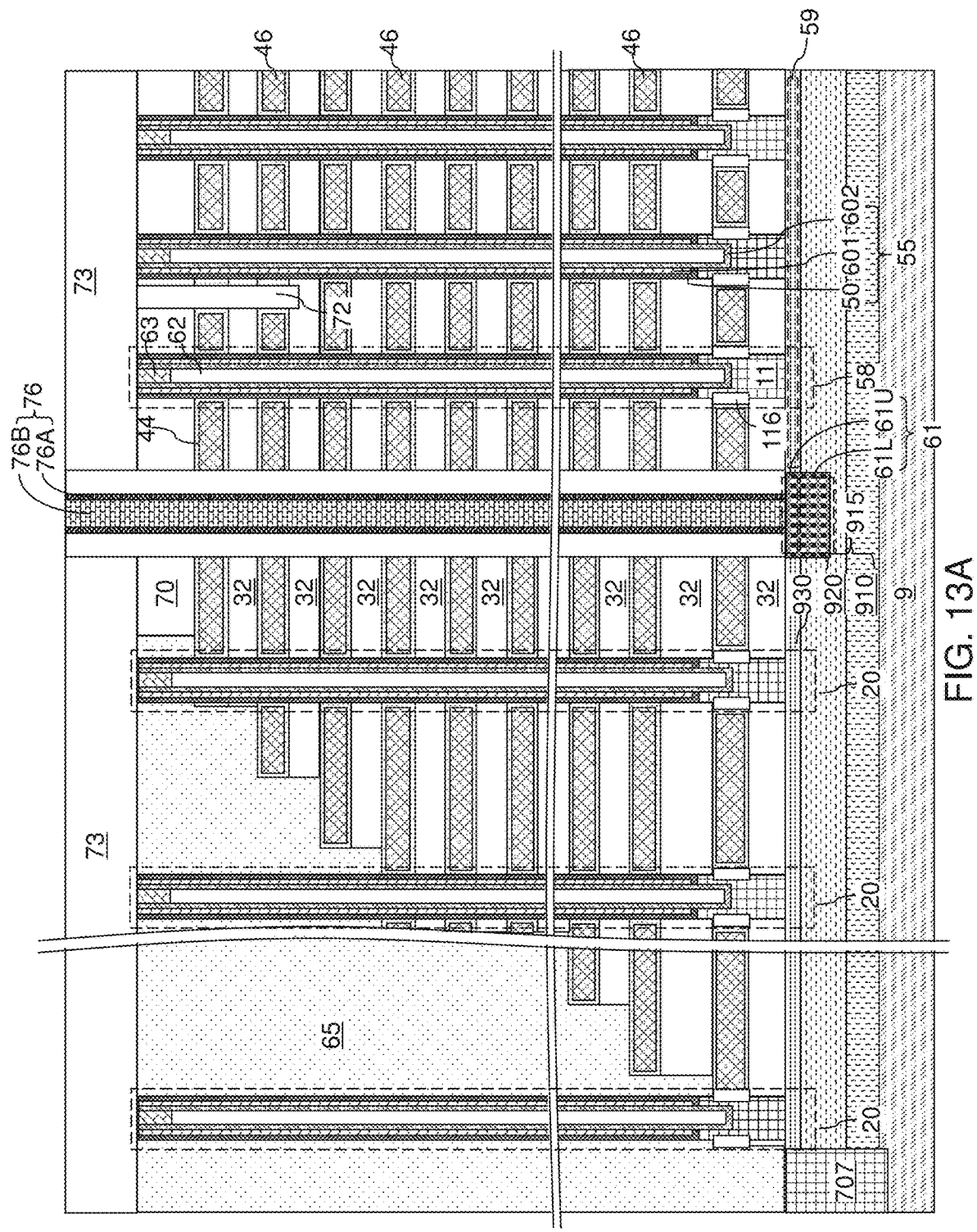
FIG. 13A is a schematic vertical cross-sectional view of the first exemplary structure after formation of an insulating spacer and a backside contact structure according to the first embodiment of the present disclosure.
Figure 13B:
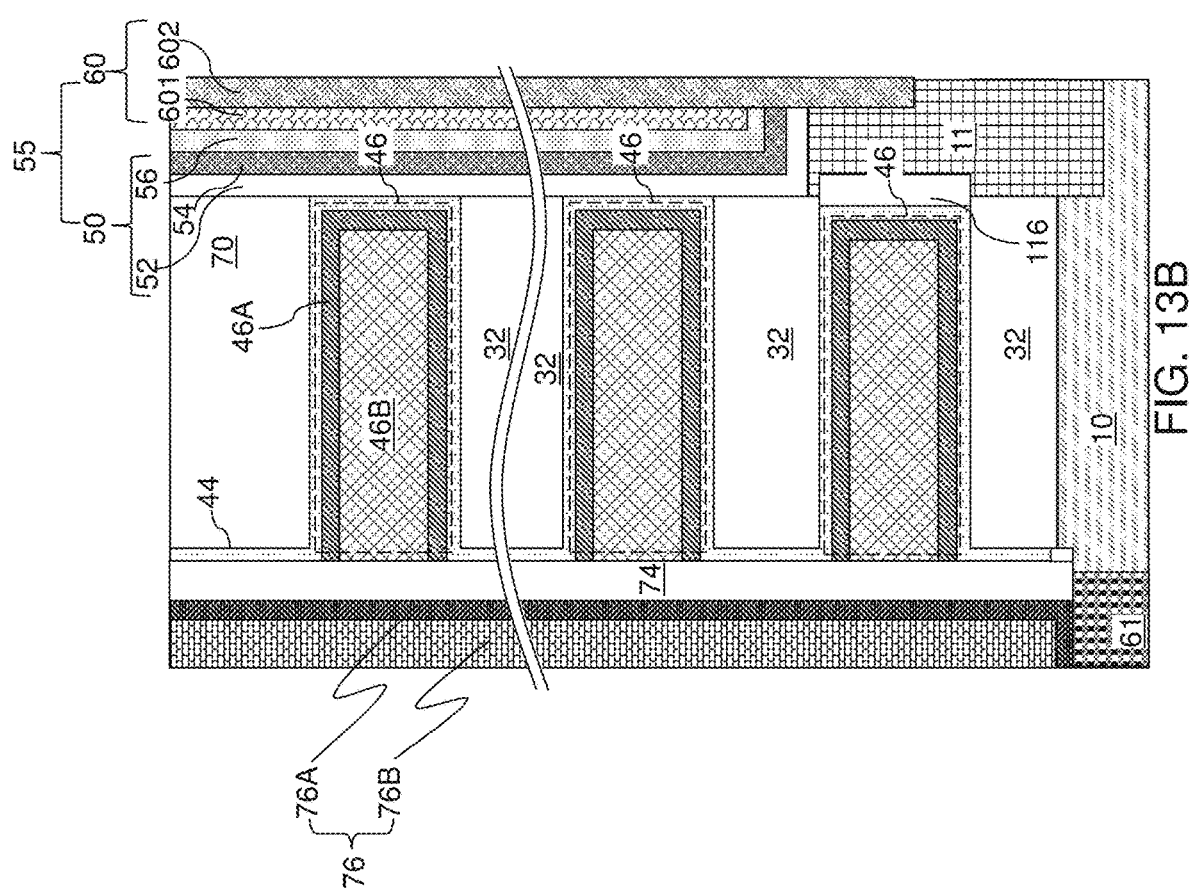
FIG. 13B is a vertical cross-sectional view of a region of the first exemplary structure of FIG. 13A.

Referring to FIGS. 13A and 13B, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the strained single-crystalline silicon layer 930 can be physically exposed at the bottom of each backside trench 79.

An upper portion of the strained single-crystalline silicon layer 930 that extends between the source region 61 and the plurality of epitaxial silicon-containing pedestal channel portions 11 constitutes a horizontal semiconductor channel 59 for a plurality of field effect transistors. The horizontal semiconductor channel 59 is connected to multiple vertical semiconductor channels 60 through respective epitaxial silicon-containing pedestal channel portions 11. The horizontal semiconductor channel 59 contacts the source region 61 and the plurality of epitaxial silicon-containing pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 915, 930).

Semiconductor channels (59, 11, 60) extend between each source region 61 and a respective set of drain regions 63. The semiconductor channels (59, 11, 60) include the vertical semiconductor channels 60 of the memory stack structures 55. Since the horizontal semiconductor channel 59 includes strained single-crystalline silicon, it has a higher electron mobility than an unstrained silicon horizontal semiconductor channel 59. The higher electron mobility reduces the external resistance of the memory device and improves the cell current of the memory device.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 14B:
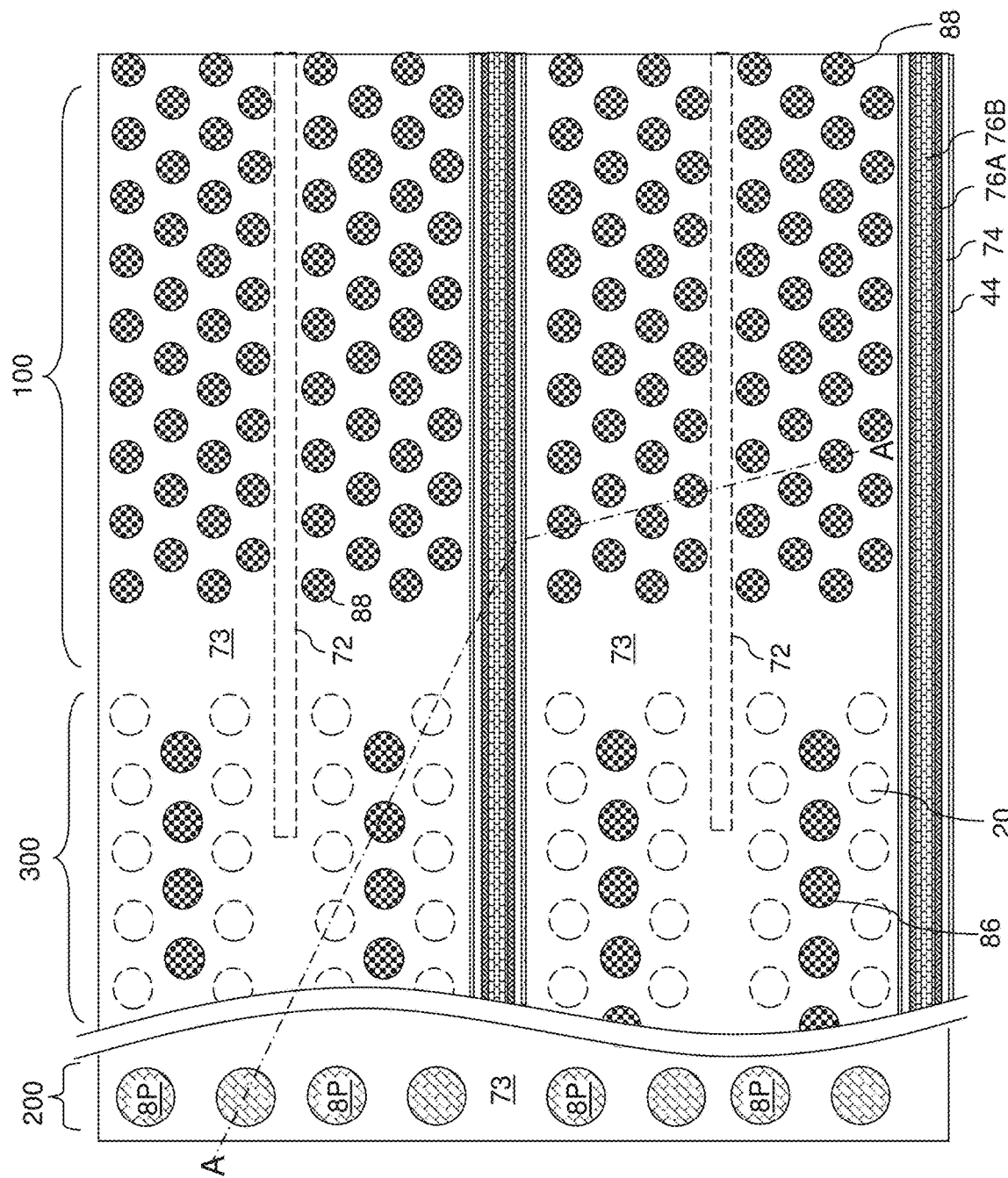
FIG. 14B is a top-down view of the first exemplary structure of FIG. 14A. The vertical plane A-A' is the plane of the schematic vertical cross-sectional view of FIG. 14A.

Referring to FIGS. 14A and 14B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

According to a second embodiment of the present disclosure, a second semiconductor structure is provided, which can be derived from the first exemplary structure illustrated in FIGS. 5A and 5B by modifying a set of processing steps for forming a memory opening fill structure 58 shown in FIG. 6H. Specifically, a set of processing steps for forming drain regions 63 of the first exemplary structure can be modified to form drain regions having different compositional and geometrical features. In the second exemplary structure, the processing steps of FIGS. 1-5B may be performed without modification. Thus, an alternating stack of insulating layers 32 and spacer material layers can be over a semiconductor material layer (such as the strained single-crystalline silicon layer 930) in a substrate (9, 915, 930). The spacer material layers may be formed as, or may be subsequently replaced with, electrically conductive layers 46. An insulating cap layer 70 may be formed over the alternating stack (32, 42), and the memory openings 49 and the support openings 19 may be formed through the insulating cap layer 70 and the alternating stack (32, 42) and down to a top surface of the semiconductor material layer (such as the strained single-crystalline silicon layer 930) in the substrate (9, 915, 930).

FIGS. 15A-15O illustrate sequential vertical cross-sectional views of a memory opening during formation of a memory opening fill structure in the second exemplary structure according to the second embodiment of the present disclosure. Generally, the processing steps of FIGS. 6A-6G can be performed in the second embodiment to provide the same structural components in each memory opening 49 and in each support opening 19 as the structural components illustrated in FIG. 6G. Generally, vertical stack of memory elements can be formed at a periphery of each memory opening 49 at levels of the spacer material layers. In case a memory film 50 is deposited on a sidewall of each memory opening 49, each vertical stack of memory elements may comprise portions of a respective memory film 50 located at levels of the spacer material layers. At least one semiconductor channel layer (601, 602) can be deposited over the vertical stack of memory elements, and a dielectric core 62 can be formed within each memory opening 49 by depositing a dielectric core layer 62L over the at least one semiconductor channel layer (601, 602) and by vertically recessing the dielectric core layer 62L to a depth, which may be located at, above, or below the horizontal plane including the bottom surface of the insulating cap layer 70.

Referring to FIG. 15A, a memory opening 49 in the second exemplary structure is illustrated after the processing steps that correspond to the processing steps of FIG. 6G. The memory opening 49 of the second embodiment may be the same as the memory opening 49 of the first embodiment illustrated in FIG. 6G.

Referring to FIG. 15B, an etch process that etches the semiconductor material (i.e., silicon or a silicon-germanium compound semiconductor) of the semiconductor channel layers (601, 602) can be performed to remove portions of the semiconductor channel layers (601, 602) located above the top surfaces of the dielectric cores 62. For example, a wet etch process using hot trimethyl-2 hydroxyethyl ammonium hydroxide ("hot TMY") or tetramethyl ammonium hydroxide (TMAH) may be used to remove the portions of the semiconductor channel layers (601, 602) located above the horizontal plane including the top surfaces of the dielectric cores 62 selective to the materials of the memory films 50. Each remaining portion of the semiconductor channel layers (601, 602) comprises a vertical semiconductor channel 60. Each vertical semiconductor channel 60 can be formed over a respective vertical stack of memory elements, which may comprise portions of a charge storage layer 54 located at levels of the sacrificial material layers 42. As discussed above, each vertical semiconductor channel 60 may comprise, and/or may consist essentially of, doped silicon having a doping of a first conductivity type, or a doped silicon-germanium compound semiconductor having a doping of the first conductivity type.

Figures 15C, 15D:
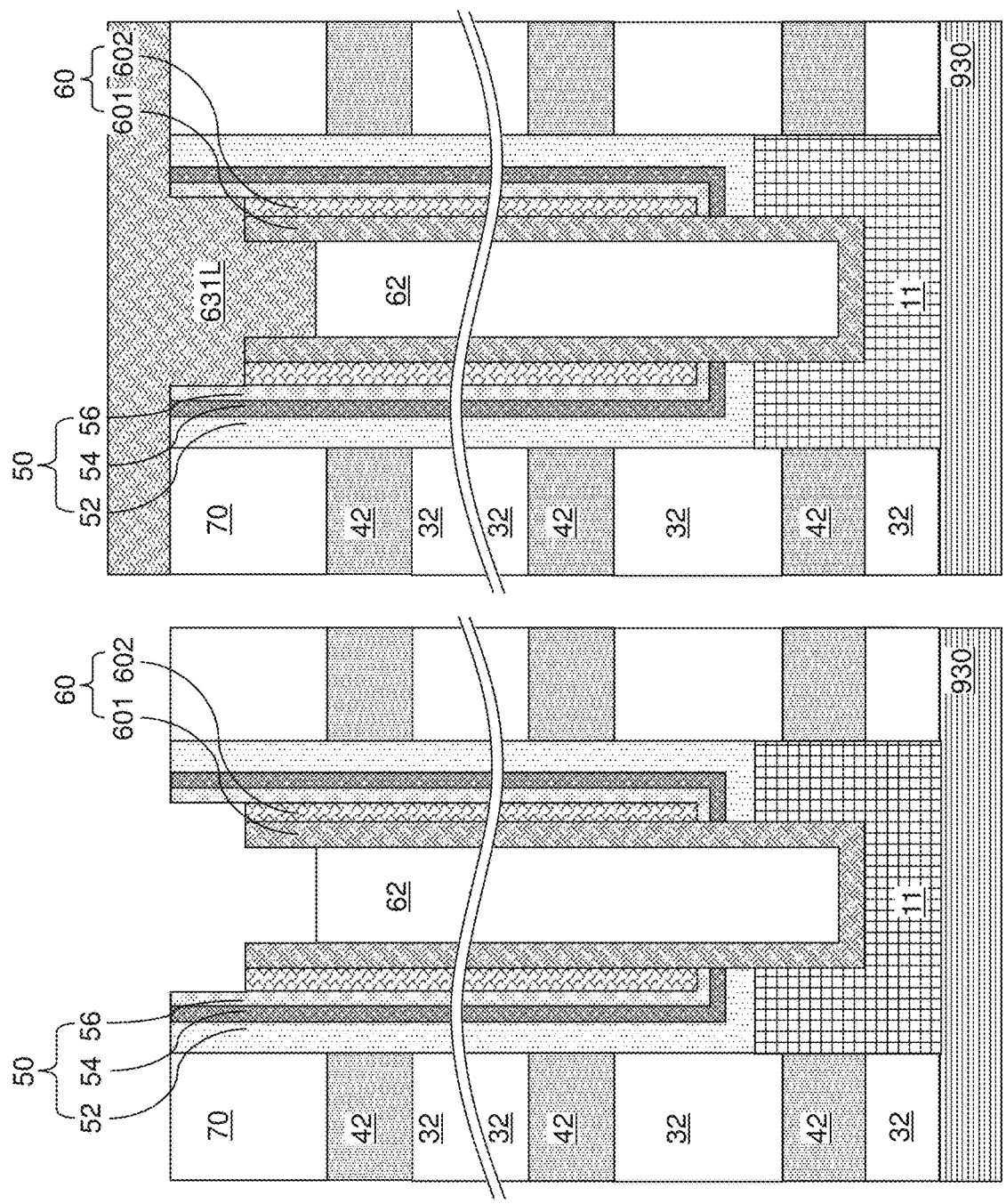

Referring to FIG. 15C, each dielectric core 62 can be vertically recessed by an etch process that etches the dielectric cores 62 selective to the dielectric material of the insulating cap layer 70. For example, if the dielectric cores 62 include borosilicate glass and if the insulating cap layer 70 includes undoped silicate glass, a wet etch process employing dilute hydrofluoric acid can be employed to vertically recess the dielectric cores 62 selective to the insulating cap layer 70. In one embodiment, each dielectric core 62 may have a top surface located above the horizontal plane including the bottom surface of the insulating cap layer 70 prior to the etch process, and may have a recessed top surface located below the horizontal plane including the bottom surface of the insulating cap layer 70 after the etch process. The vertical recess distance of the etch process may be in a range from 5 nm to 50 nm, although lesser and greater vertical recess distances may also be employed. An upper portion of a cylindrical inner sidewall of a vertical semiconductor channel can be physically exposed around each recess region that overlies the vertically recessed dielectric cores 62. The vertical recessing of the dielectric cores 62 increase the physically exposed area of each vertical semiconductor channel 60 so that the total contact area between each vertical semiconductor channel 60 and a drain region to be subsequently formed can be increased.

Referring to FIG. 15D, a doped silicon-containing semiconductor material having a doping of the second conductivity type can be deposited within each recess region overlying the dielectric cores 62. The doped silicon-containing semiconductor material forms a semiconductor drain layer 631L, which fill the volumes of the recess regions overlying the dielectric cores 62 and continuously extends over the insulating cap layer 70. The doped silicon-containing semiconductor material of the semiconductor drain layer 631L includes dopants of the second conductivity type. The atomic concentration of the dopants of the second conductivity type in the doped silicon-containing semiconductor material of the semiconductor drain layer 631L may be in a range from $5.0 \times 10^{18}/cm^3$ to $2.0 \times 10^{21}/cm^3$, although lower and higher dopant concentrations may also be employed.

The doped silicon-containing semiconductor material of the semiconductor drain layer 631L includes a semiconductor material that has a same, or similar, material composition as the vertical semiconductor channels 60 except for a change in the dopant conductivity type. In one embodiment, the vertical semiconductor channels 60 can include amorphous silicon or polysilicon having a doping of the first conductivity type (e.g., p-type), and the semiconductor drain layer 631L includes amorphous silicon or poly silicon having a doping of the second conductivity type (e.g., n-type). In another embodiment, the first semiconductor channel layer 601 can include an amorphous silicon-germanium compound semiconductor or a polycrystalline silicon-germanium compound semiconductor having a doping of the first conductivity type, and semiconductor drain layer 631L includes an amorphous silicon-germanium compound semiconductor or a polycrystalline silicon-germanium compound semiconductor having a doping of the second conductivity type. The atomic percentage of germanium atoms in the semiconductor drain layer 631L may be the same as, or may be within 10% such as within 2% of, the atomic percentage of germanium atoms in the vertical semiconductor channel. In such cases, the electronic bands of the material of the semiconductor drain layer 631L can be nearly matched to the electronic bands of the vertical semiconductor channels 60 except for the effect introduced by differences in doping, and energy barrier for charge carriers passing between the vertical semiconductor channels 60 and the semiconductor drain layer 631L may be minimized, thereby minimizing interfacial resistance effects. The semiconductor drain layer 631L can be formed by a conformal deposition method such as low pressure chemical vapor deposition (LPCVD).

Referring to FIG. 15E, an etch back process may be performed to vertically recess the semiconductor drain layer 631L. The etch back process may employ as dry etch process (such as a reactive ion etch process or a chemical dry etch process), or may employ a wet etch process. The etch back process may employ an etch chemistry that is selective to the materials of the insulating cap layer 70 and the memory films 50, i.e., has an etch chemistry that etches the material of the semiconductor drain layer 631L without significant collateral etching of the materials of the insulating cap layer 70 and the memory films 50. For example, a timed wet etch process using hot trimethyl-2 hydroxyethyl ammonium hydroxide ("hot TMY") or tetramethyl ammonium hydroxide (TMAH) may be employed as the etch back process to vertically recess the silicon-containing material of the semiconductor drain layer 631L. The duration of the etch back process may be selected such that the material of the semiconductor drain layer 631L is removed from above the horizontal plane including the top surface of the insulating cap layer 70. Further, additional material of the semiconductor drain layer 631L below the horizontal plane including the top surface of the insulating cap layer 70 so that a cylindrical sidewall segment of the inner sidewall of each memory film 50 is physically exposed within each memory opening 49. The height of each physically exposed cylindrical sidewall segment of an inner sidewall of a memory film 50 may be in a range from 20 nm to 150 nm, such as from 40 nm to 80 nm, although lesser and greater heights may also be employed.

Each remaining portion of the semiconductor drain layer 631L that remains within a respective memory opening 49 constitutes a semiconductor drain region 631. Each semiconductor drain portion 631 includes a doped silicon-containing semiconductor material having a doping of the second conductivity type, and can be formed on an end portion of a respective vertical semiconductor channel 60. Each semiconductor drain region 631 may be formed on the inner sidewall of the respective vertical semiconductor channel 60 and an annular top surface of the respective vertical semiconductor channel 60. Each semiconductor drain region 631 can contact a first cylindrical sidewall segment of an upper portion of a respective memory film 50. Generally, a vertical semiconductor channel 60 within a memory opening 49 comprises, and/or consists essentially of, a doped polycrystalline silicon or silicon-germanium compound semiconductor material having a doping of the first conductivity type, and a semiconductor drain portion 631 within the memory opening 49 comprises a doped silicon or silicon-germanium compound semiconductor including at least one electrical dopant species, and has a doping of the second conductivity type that is the opposite of the first conductivity type. For example, if the vertical semiconductor channel 60 is p-doped with boron, the semiconductor drain portion 631 is n-doped with n-type dopants such as phosphorus, arsenic, and/or antimony. The thickness of the center portion of each semiconductor drain portion 631 may be in a range from 20 nm to 120 nm, such as from 30 nm to 80 nm, although lesser and greater thicknesses may also be employed.

Referring to FIG. 15F, a nickel-aluminum alloy or an alternating layer stack including thin aluminum layers and thin nickel layers may be deposited to form a nickel-aluminum-containing layer 632L. In one embodiment, the nickel-aluminum-containing layer 632L may include nickel at an atomic percentage in a range from 50% to 90%, such as from 60% to 80%, although lesser and greater atomic percentages of nickel may also be employed. In one embodiment, the nickel-aluminum-containing layer 632L may be nickel-rich, i.e., may include nickel at an atomic percentage greater than 50%. In case the nickel-aluminum-containing layer 632L includes an alternating layer stack of thin aluminum layers and thin nickel layers, each aluminum layer and each nickel layer may have a thickness that is less than an average diffusion distance of each atom during a subsequent anneal process. In one embodiment, the thickness of each aluminum layer may be less than 0.6 nm, and the thickness of each nickel layer may be less than 0.6 nm. The nickel-aluminum-containing layer 632L may be deposited by physical vapor deposition. The thickness of the nickel-aluminum-containing layer 632L may be in a range from 10% to 60% of the thickness of the center portion of each semiconductor drain portion 631. In one embodiment, the thickness of the nickel-aluminum-containing layer 632L may be in a range from 5 nm to 60 nm, such as from 12 nm to 30 nm, although lesser and greater thicknesses may also be employed.

Figure 15H:
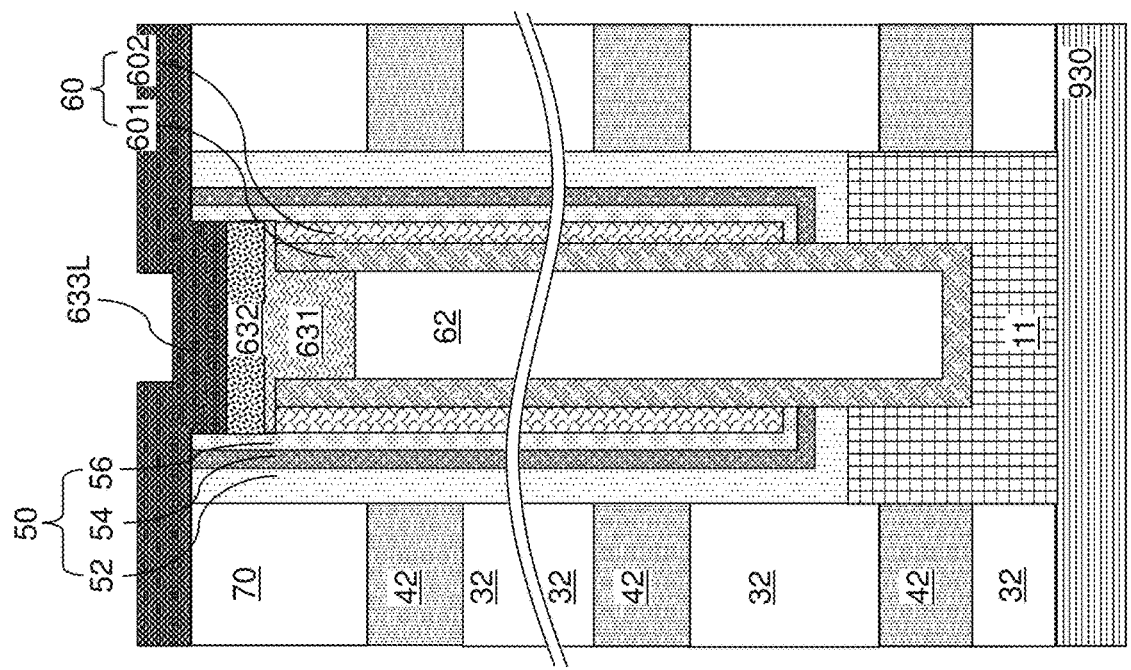
Figure 15G:
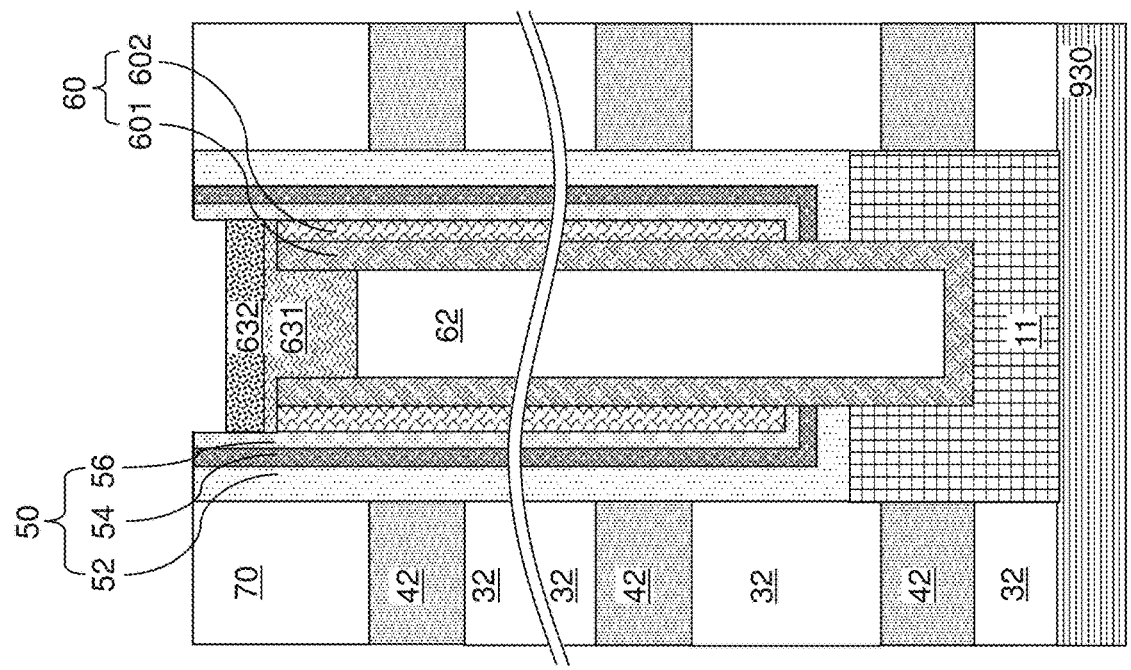

Referring to FIG. 15G, an anneal process can be performed at an elevated temperature to induce reaction between the silicon-containing semiconductor material of the semiconductor drain portion 631 and the metallic material of the nickel-aluminum-containing layer 632L. The elevated temperature of the anneal process may be in a range from 340 degrees Celsius to 460 degrees Celsius, such as from 370 degrees Celsius to 430 degrees Celsius. A nickel-aluminum-semiconductor alloy drain portion 632 comprising silicon can be formed by reacting a surface region of a respective semiconductor drain portion 631 with a nickel-aluminum-containing material of the nickel-aluminum-containing layer 632L within each memory opening.

A wet etch process that etches the metallic material of the nickel-aluminum-containing layer 632L selective to the metal-semiconductor alloy material of the nickel-aluminum-semiconductor alloy drain portion 632 can be performed to remove unreacted portions of the nickel-aluminum-containing layer 632L. Each nickel-aluminum-semiconductor alloy drain portion 632 can contact a cylindrical sidewall segment of a respective memory film 50, and a top surface of an underlying semiconductor drain portion 631. Generally, an upper portion of each semiconductor drain portion 631 can be converted into a nickel-aluminum-semiconductor alloy drain portion 632 by reacting the upper portion of the semiconductor drain portion 631 with a nickel-aluminum-containing material. A drain region comprising a lower portion of the semiconductor drain portion 631 and a nickel-aluminum-semiconductor alloy drain portion 632 can be formed.

In one embodiment, each vertical semiconductor channel 60 can comprise, and/or can consist essentially of, doped polysilicon having a doping of the first conductivity type, each semiconductor drain portion 631 can comprise, and/or can consist essentially of, doped polysilicon including at least one electrical dopant species and can have a doping of a second conductivity type that is the opposite of the first conductivity type, and each nickel-aluminum-semiconductor alloy drain portion 632 can comprise, and/or can consist essentially of, nickel, aluminum, silicon, and the at least one electrical dopant species, i.e., a doped nickel aluminum silicide. In another embodiment, each vertical semiconductor channel 60 can comprise, and/or can consist essentially of, a doped polycrystalline silicon-germanium compound semiconductor material having a doping of the first conductivity type, each semiconductor drain portion 631 can comprise, and/or can consist essentially of, a doped polycrystalline silicon-germanium compound semiconductor material including at least one electrical dopant species and can have a doping of a second conductivity type that is the opposite of the first conductivity type, and each nickel-aluminum-semiconductor alloy drain portion 632 can comprise, and/or can consist essentially of, nickel, aluminum, silicon, germanium, and the at least one electrical dopant species, i.e., a doped nickel aluminum silicide, a doped nickel aluminum germanide or a doped nickel aluminum silicide-germanide, depending on the amount of germanium in the semiconductor drain portion 631.

In one embodiment, the nickel-aluminum-semiconductor alloy drain portion 632 may have a formula $Ni[Al_{1-x}(Si_{1-y}Ge_y)_x]_2$, where $0.5 \leq x \leq 0.9$, such as $0.6 \leq x \leq 0.8$, and $0 \leq y \leq 0.8$, such as $0.03 \leq y \leq 0.5$. The remaining portion of each semiconductor drain portion 631, which is herein referred to as a semiconductor drain portion 631, can be formed on a first cylindrical sidewall segment of a memory film 50 within a respective memory opening 49. A nickel-aluminum-semiconductor alloy drain portion 632 can be formed on a second cylindrical sidewall segment of the memory film 50 that overlies the first cylindrical sidewall segment. As such, a sidewall of a semiconductor drain portion 631 may be vertically coincident with a sidewall of a nickel-aluminum-semiconductor alloy drain portion 632. The nickel-aluminum-semiconductor alloy drain portion 632 forms an Ohmic contact with a low Schottky barrier, which the lowers drain side contact resistance and improves the cell current of the memory device.

Referring to FIG. 15H, a metallic drain electrode material can be deposited directly on the top surfaces of the nickel-aluminum-semiconductor alloy drain portions 632 and over the insulating cap layer 70 to form a metallic drain electrode material layer 633L. The metallic drain electrode material comprises an elemental metal or a conductive metallic nitride material. In one embodiment, the metallic drain electrode material may include a refractory metal, such as tungsten, tantalum, niobium or molybdenum. Alternatively, the metallic drain electrode material may include a conductive metal nitride material such as TaN, TiN, and/or WN, which does not react with the underlying nickel-aluminum-semiconductor alloy material of the nickel-aluminum-semiconductor alloy drain portions 632, and thus, provides a stable metal-to-metal-containing-alloy interface. The metallic drain electrode material may be deposited by physical vapor deposition and/or by chemical vapor deposition. The thickness of the deposited metallic drain electrode material can be selected such that an entire volume of each recess within the memory openings 49 can be filled with the metallic drain electrode material. For example, the thickness of the deposited metallic drain electrode material may be in a range from 20 nm to 120 nm, such as from 30 nm to 80 nm, although lesser and greater thicknesses may also be employed.

Figure 15I:
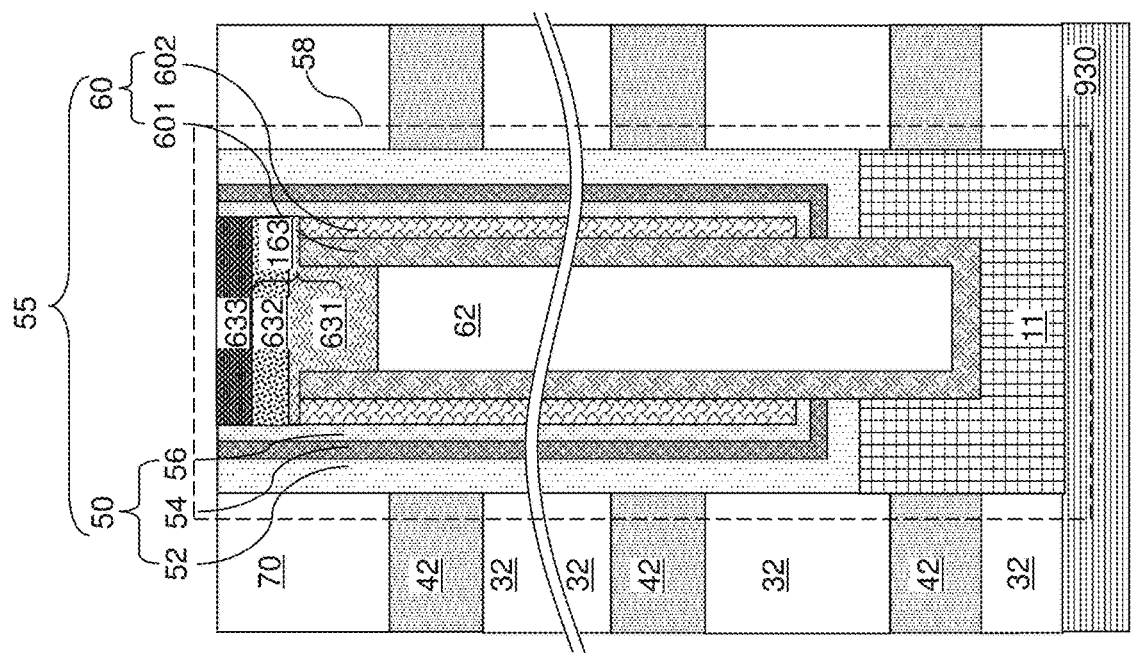

Referring to FIG. 15I, portions of the metallic drain electrode material overlying the horizontal plane including the top surface of the insulating cap layer 70 can be removed by a planarization process such as a chemical mechanical planarization process. Each remaining portion of the metallic drain electrode material layer 633L comprises a metallic drain electrode 633. Generally, each metallic drain electrode 633 comprises, and/or consists essentially of, an elemental metal or a conductive metallic nitride material, and contacts a top surface of a nickel-aluminum-semiconductor alloy drain portion 622. In one embodiment, each metallic drain electrode 633 comprises, and/or consists essentially of, a material selected from W, Mo, Ta, Nb, TaN, TiN, and/or WN. In one embodiment, each metallic drain electrode 633 comprises, and/or consists essentially of, of W. A metallic drain electrode 633 can contact a third cylindrical sidewall segment of a respective memory film 50. Each metallic drain region 633 may have a top surface located within a horizontal plane including the top surface of the insulating cap layer 70.

A drain region 163 including a vertical stack of a semiconductor drain portion 631 and a nickel-aluminum-semiconductor alloy drain portion 622, and a metallic drain electrode 633 can be provided in each memory opening 49 directly on a top end of a respective vertical semiconductor channel 60. The energy bands within each stack of an epitaxial silicon-containing pedestal channel portion 11, a vertical semiconductor channel 60, a semiconductor drain portion 631, a nickel-aluminum-semiconductor alloy drain portion 622, and a metallic drain electrode 633 change gradually so that scattering of charge carriers at each metallurgical junction is minimized, and the charge carriers (such as electrons) can have high electrical mobility through the stack of material portions between the epitaxial silicon-containing pedestal channel portion 11 and the metallic drain electrode 633.

Figure 16:
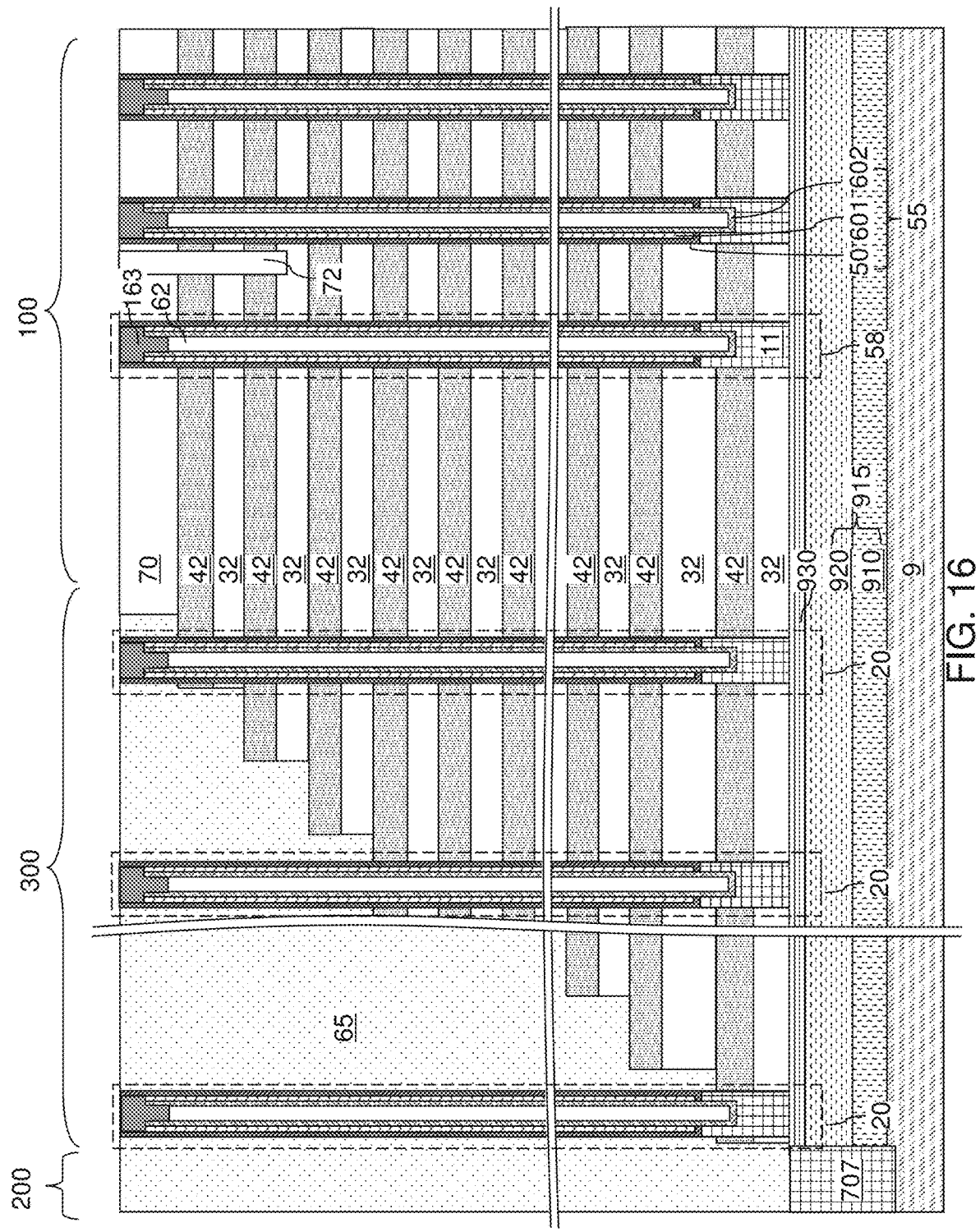
FIG. 16 is a vertical cross-sectional view of the second exemplary structure after formation of memory opening fill structures and support pillar structures according to the second embodiment of the present disclosure.

Referring to FIG. 16, the second exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 5A and 5B. An instance of the support pillar structure 20 can be formed within each support opening 19 of the structure of FIGS. 5A and 5B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (comprising portions of a charge storage layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 17:
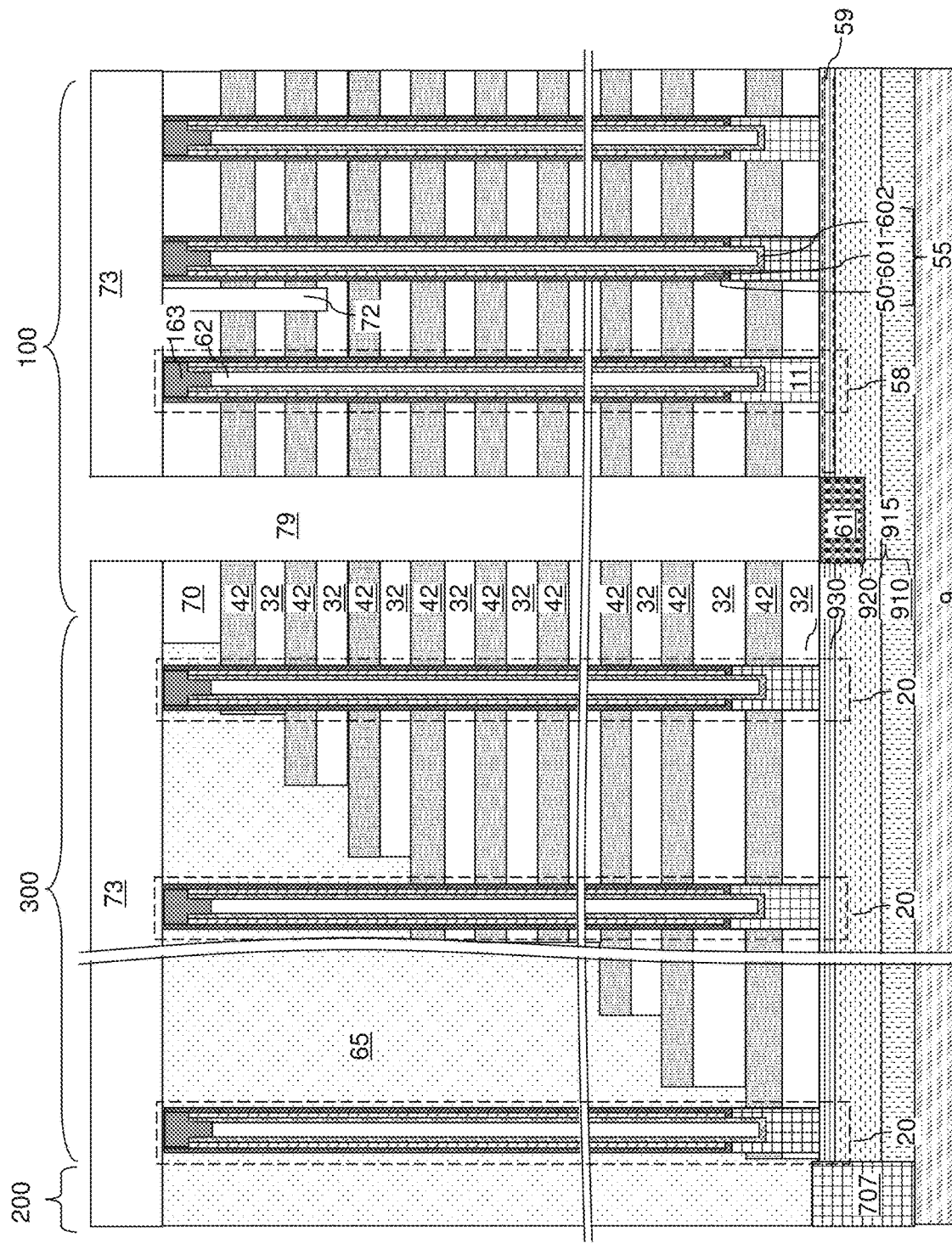
FIG. 17 is a vertical cross-sectional view of the second exemplary structure after formation of backside trenches according to the second embodiment of the present disclosure.

Referring to FIG. 17, the processing steps of FIGS. 8A and 8B can be performed to form a contact-level dielectric layer 73, backside trenches 79, and source regions 61. As in the first embodiment, each source region 61 may include a vertical stack of an upper source portion 61U and a lower source portion 61L. Each source region 61 is formed in a surface portion of the substrate (9, 915, 930). Each source region 61 underlies a respective backside trench 79, and therefore, can be located outside the memory openings 49. Each source region 61 can have a doping of the second conductivity type, and may include dopants of the second conductivity type at an atomic concentration in a range from $5.0 \times 10^{18}/cm^3$ to $2.0 \times 10^{21}/cm^3$, although lower and higher atomic concentrations may also be employed.

Figure 18:
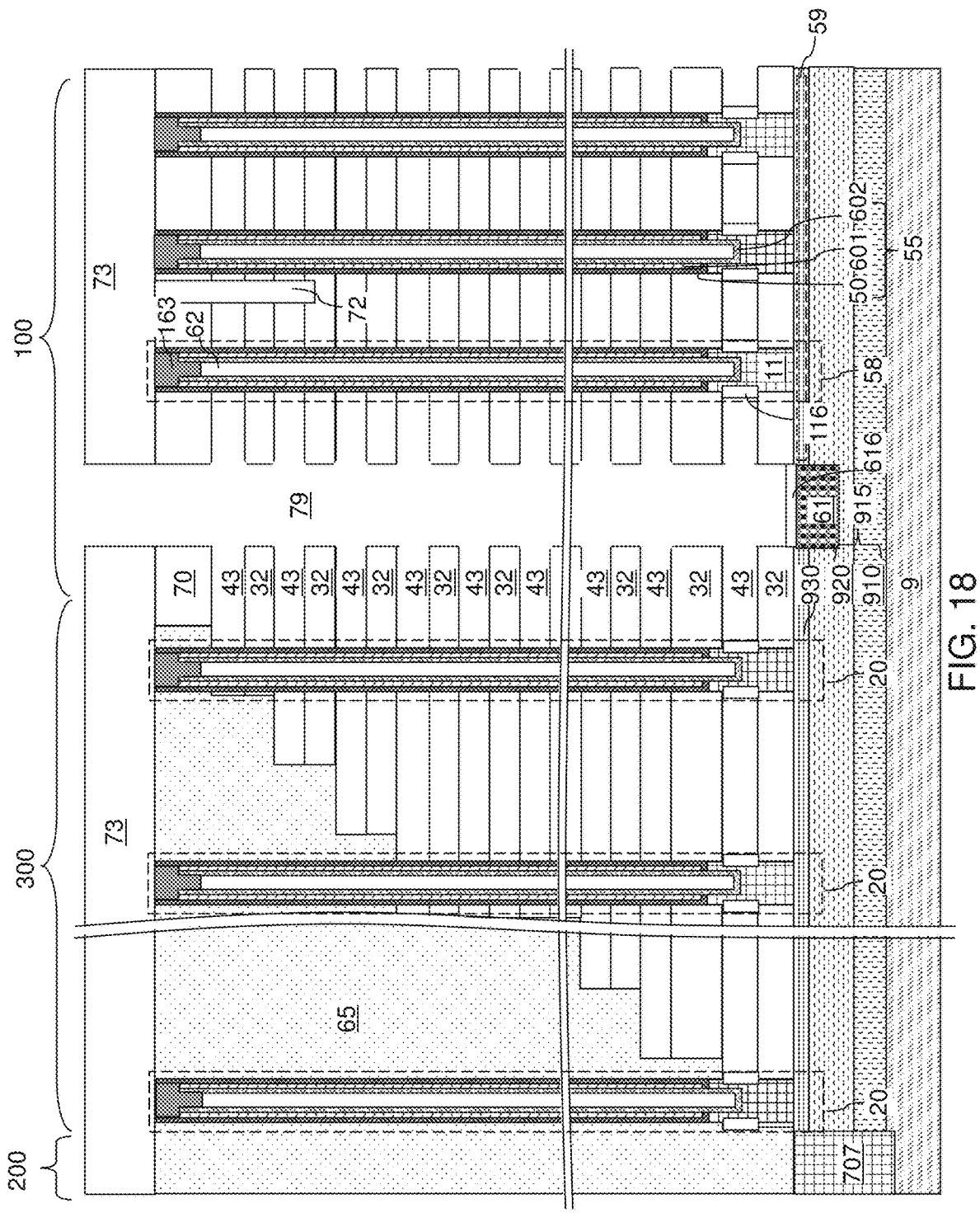
FIG. 18 is a vertical cross-sectional view of the second exemplary structure after formation of backside recesses according to the second embodiment of the present disclosure.

Referring to FIG. 18, the processing steps of FIGS. 9 and 10A may be performed to form backside recesses 43, tubular dielectric spacers 116, and planar dielectric portions 616.

Figure 19:
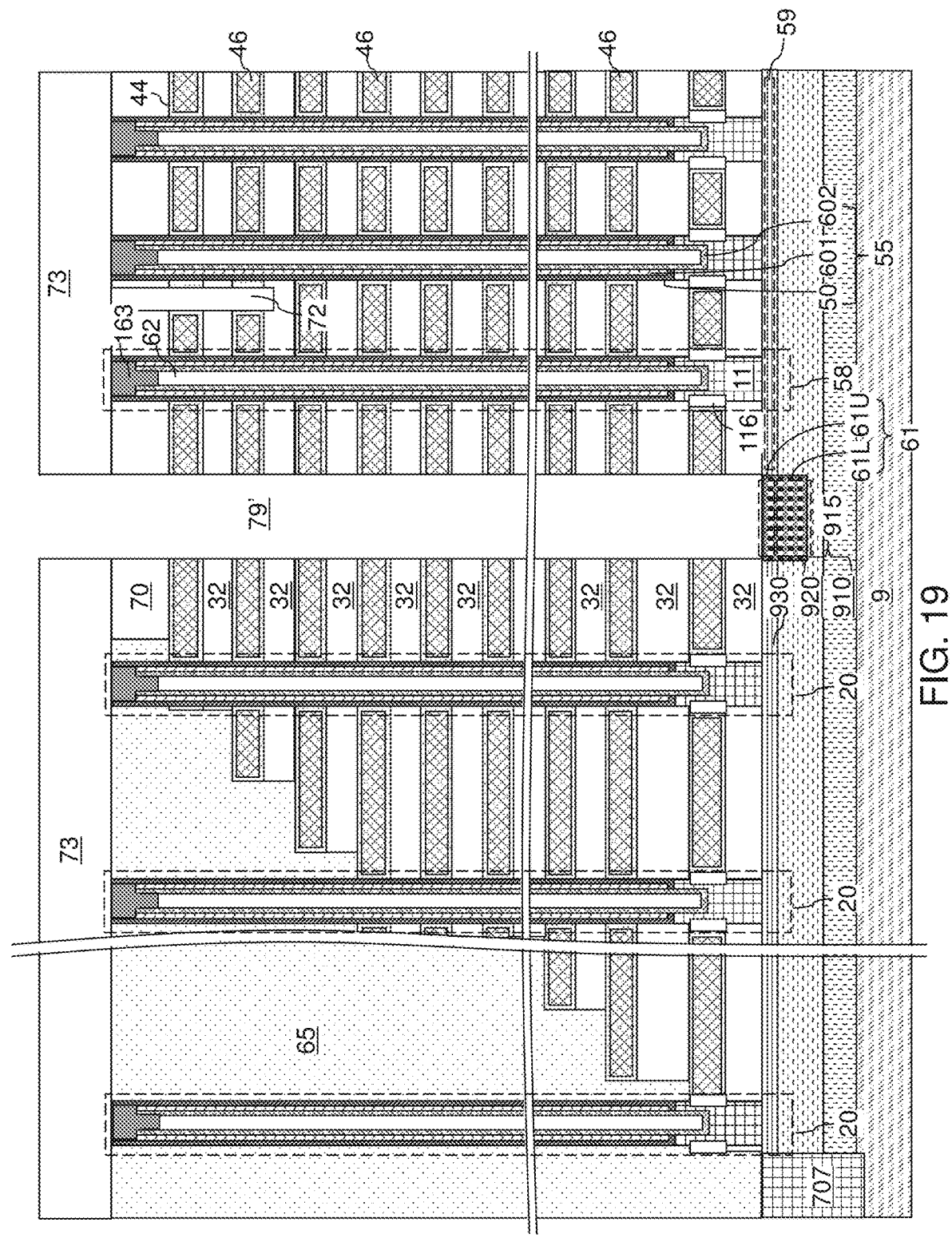
FIG. 19 is a vertical cross-sectional view of the second exemplary structure after formation of electrically conductive layers according to the second embodiment of the present disclosure.

Referring to FIG. 19, the processing steps of FIGS. 10B, 10C, 10D, 11, 12A, and 12B can be performed to deposit an optional backside blocking dielectric layer 44, a metallic barrier layer 46A, and a metallic fill material layer 46B, and to remove the deposited metallic material from the sidewalls of each backside trench 79 and from above the contact-level dielectric layer 73. The sacrificial material layers 42 are replaced with the electrically conductive layers 46. A backside cavity 79' is present within each backside trench 79.

Figure 20A:
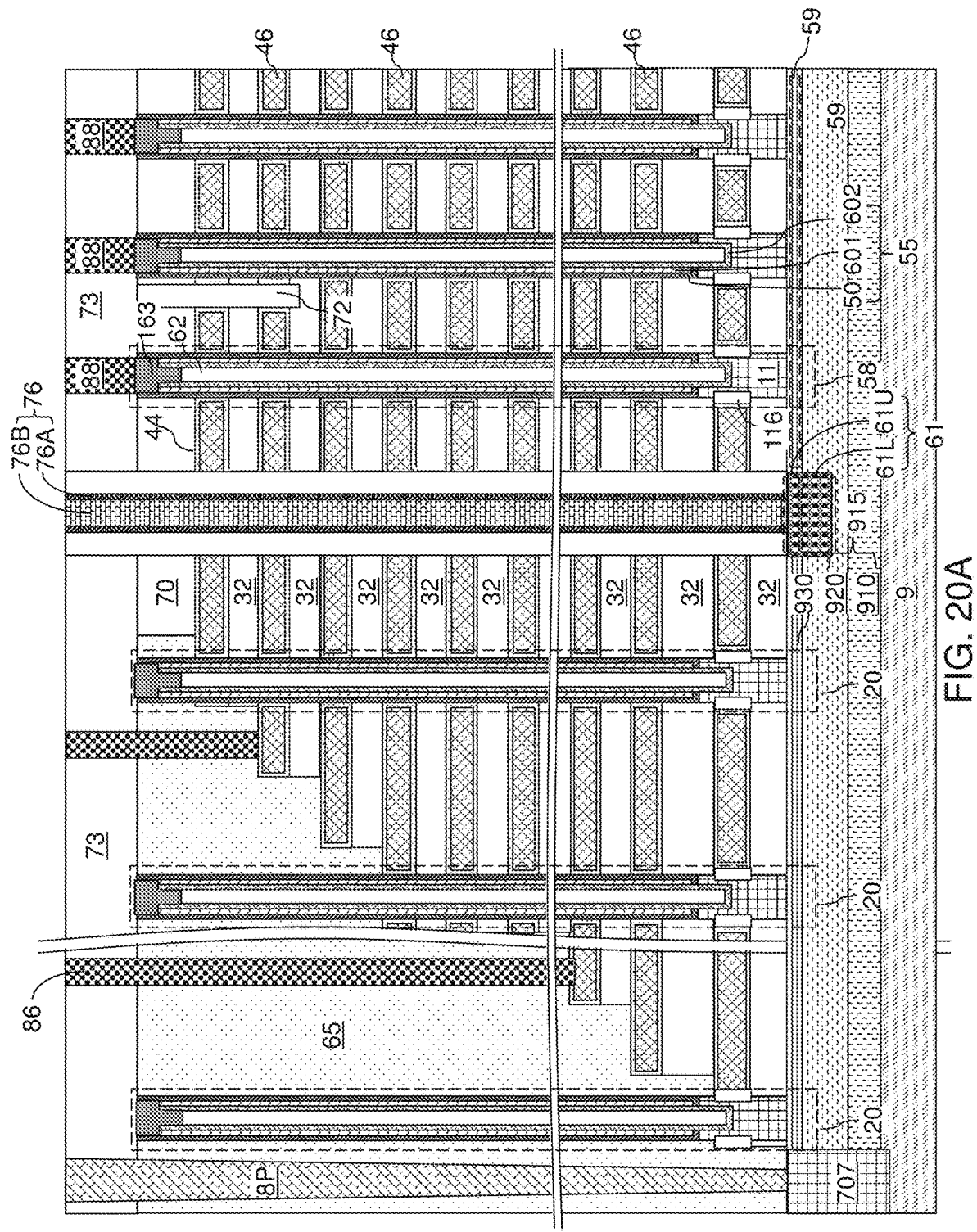
FIG. 20A is a schematic vertical cross-sectional view of the second exemplary structure after formation of additional contact via structures according to the first embodiment of the present disclosure.
Figure 20B:
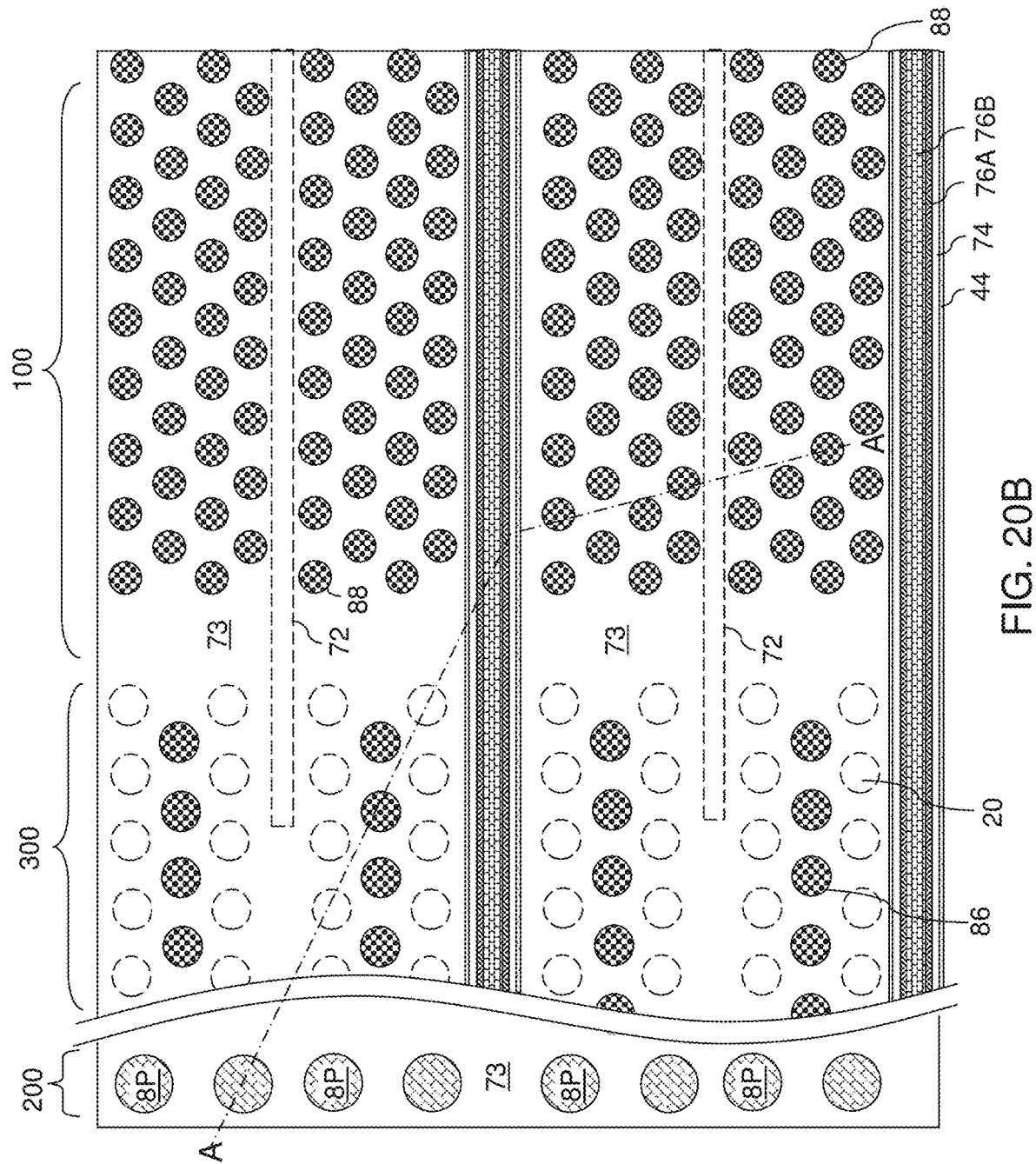
FIG. 20B is a top-down view of the first exemplary structure of FIG. 20A. The vertical plane A-A' is the plane of the schematic vertical cross-sectional view of FIG. 20A.

Referring to FIGS. 20A and 20B, the processing steps of FIGS. 13A and 13B can be performed to form an insulating spacer 74 and a backside contact via structure 76 within each backside trench 79. Subsequently, the processing steps of FIGS. 14A and 14B can be performed to form additional contact via structures (88, 86, 8P) through the contact-level dielectric layer 73, and optionally through the retro-stepped dielectric material portion 65.

According to a third embodiment of the present disclosure, a third semiconductor structure is provided, which can be derived from the second exemplary structure by employing a semiconductor material layer 10 in lieu of the combination of a single-crystalline silicon-germanium compound semiconductor layer 915 and a strained single-crystalline silicon layer 930. In this case, the third exemplary structure provides the benefit of the lower drain side contact resistance.

Figure 21A:
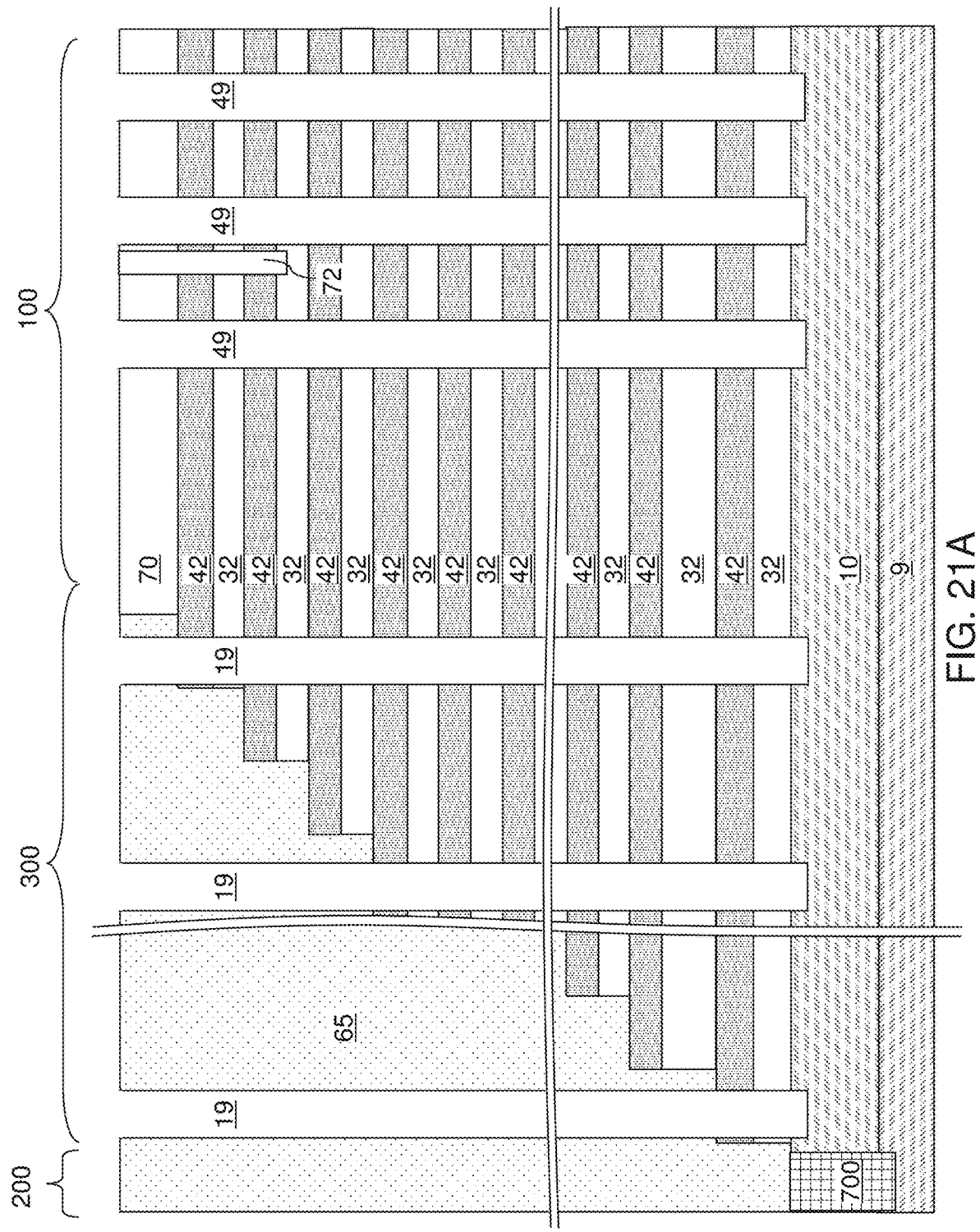
FIG. 21A is a schematic vertical cross-sectional view of the third exemplary structure after formation of memory openings and support openings according to the third embodiment of the present disclosure.
Figure 21B:
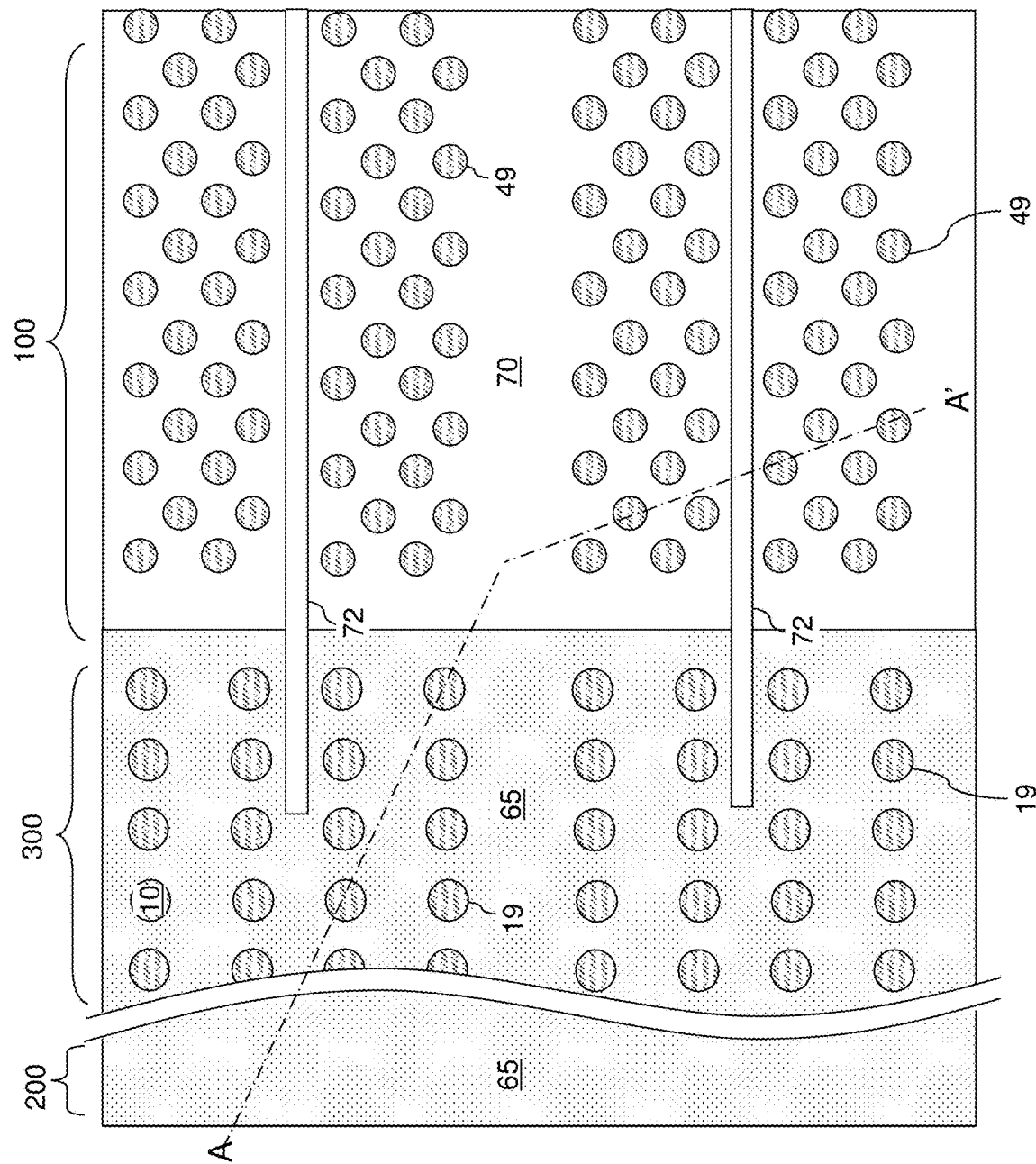
FIG. 21B is a top-down view of the third exemplary structure of FIG. 21A. The vertical plane A-A' is the plane of the cross-section for FIG. 21A.

Referring to FIGS. 21A and 21B, the third exemplary structure is illustrated in a processing step that corresponds to the processing step of FIGS. 5A and 5B. The semiconductor material layer 10 that replaces the combination of a single-crystalline silicon-germanium compound semiconductor layer 915 and a strained single-crystalline silicon layer 930 can include a single-crystalline semiconductor material such as single-crystalline silicon that is epitaxially aligned to the substrate single-crystalline silicon layer 9. In one embodiment, the semiconductor material layer 10 comprises an unstrained single-crystalline silicon layer. In one embodiment, the semiconductor material layer 10 may be provided as a surface portion or a doped well in the surface portion of a bulk single-crystalline silicon wafer. In this case, the semiconductor material layer 10 may have the same single-crystalline silicon material composition and the crystalline structure as the substrate single-crystalline silicon layer 9, and thus, may be indistinguishable from the substrate single-crystalline silicon layer 9. In an alternative embodiment, the semiconductor material layer 10 may be formed by epitaxial growth of single-crystalline silicon layer on a major surface of the substrate single-crystalline silicon layer (e.g., of a silicon wafer) 9. In this case, the semiconductor material layer 10 may have a different dopant concentration than the substrate single-crystalline silicon layer 9, and/or may have a lower dislocation density than the substrate single-crystalline silicon layer 9 due to the enhanced crystalline quality that results from epitaxial growth of silicon. Generally, the semiconductor material layer 10 can have a doping of the first conductivity type. In one embodiment, the atomic concentration of dopants of the first conductivity type in the semiconductor material layer 10 may be in a range from $1.0 \times 10^{14}/cm^3$ to $1.0 \times 10^{18}/cm^3$, although lesser and greater atomic concentrations may also be employed. The thickness of the semiconductor material layer 10, if epitaxially grown, may be in a range from 50 nm to 2,000 nm, although lesser and greater thicknesses may also be employed. Generally, the set of processing steps illustrated in FIGS. 2-5B may be performed to provide the third exemplary structure illustrated in FIGS. 21A and 21B.

Figure 22:
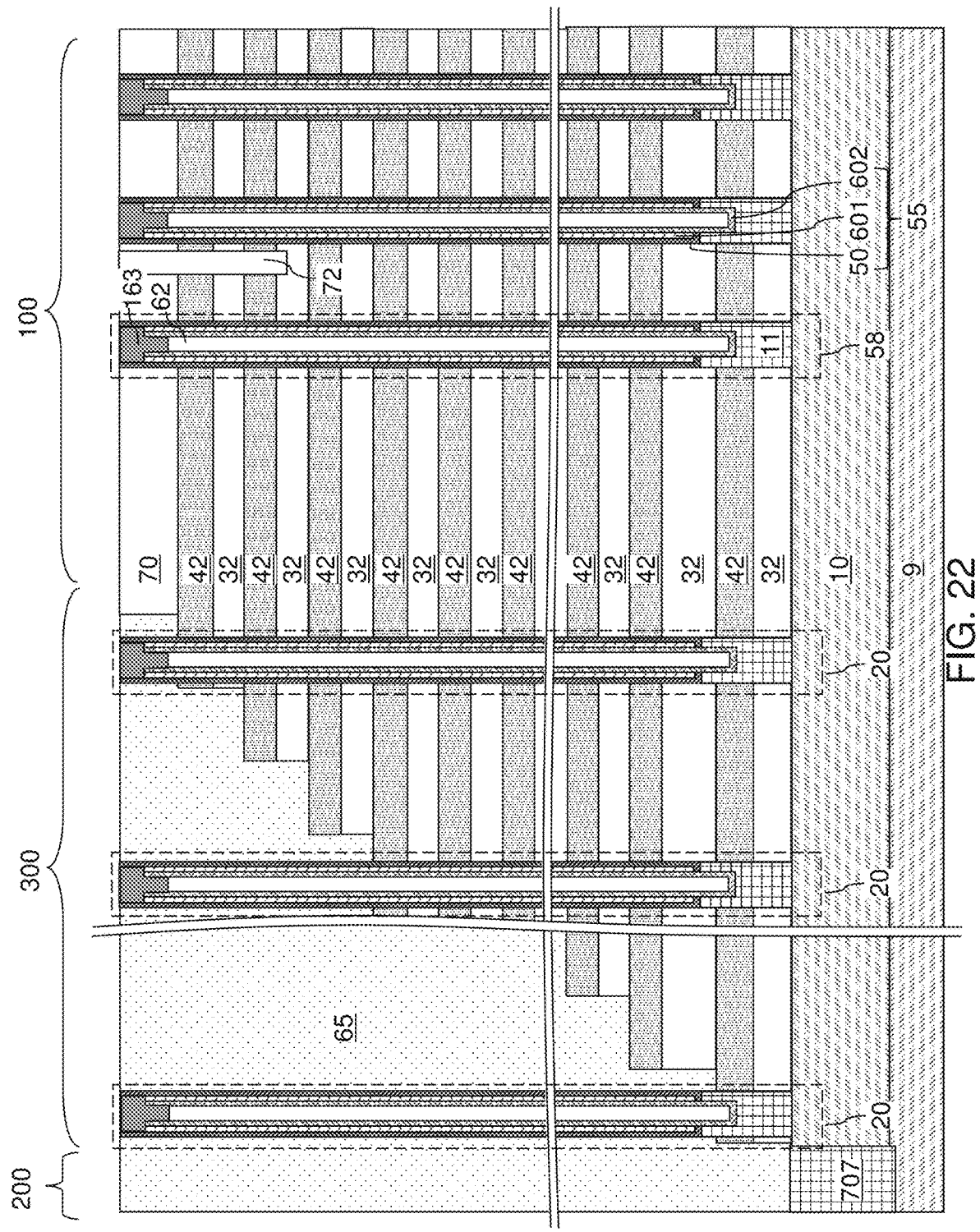
FIG. 22 is a schematic vertical cross-sectional view of the third exemplary structure after formation of memory stack structures and support pillar structures according to the third embodiment of the present disclosure.

Referring to FIG. 22, the processing steps of FIGS. 6A-6G and FIGS. 15B-15I can be performed to form a memory opening fill structure 58 in each memory opening 49 and to form a support pillar structure 20 in each support opening. Each of the memory opening fill structures 58 and the support pillar structures 20 may have the same structure as in the second embodiment with the modification that each epitaxial silicon-containing pedestal channel portion 11 is formed on a respective surface of the semiconductor material layer 10.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (comprising portions of a charge storage layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 23:
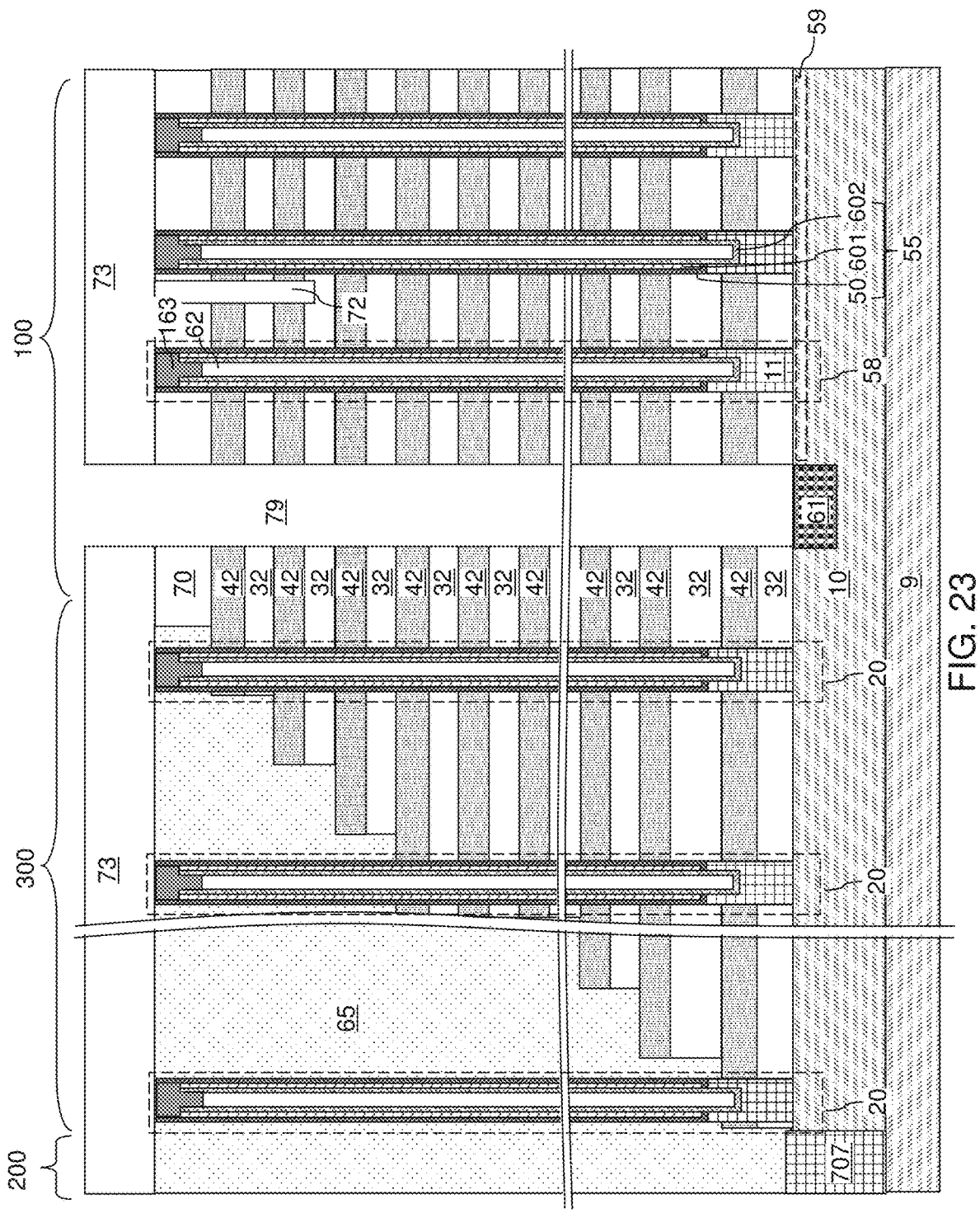
FIG. 23 is a schematic vertical cross-sectional view of the third exemplary structure after formation of backside trenches and source regions according to the third embodiment of the present disclosure.

Referring to FIG. 23, the processing steps of FIGS. 8A and 8B can be performed to form a contact-level dielectric layer 73, backside trenches 79, and source regions 61. As in the first embodiment, each source region 61 may include a vertical stack of an upper source portion 61U and a lower source portion 61L. Each source region 61 is formed in a surface portion of the substrate (9, 915, 930). Each source region 61 underlies a respective backside trench 79, and therefore, can be located outside the memory openings 49. Each source region 61 can have a doping of the second conductivity type, and may include dopants of the second conductivity type at an atomic concentration in a range from $5.0 \times 10^{18}/cm^3$ to $2.0 \times 10^{21}/cm^3$, although lower and higher atomic concentrations may also be employed.

Figure 24:
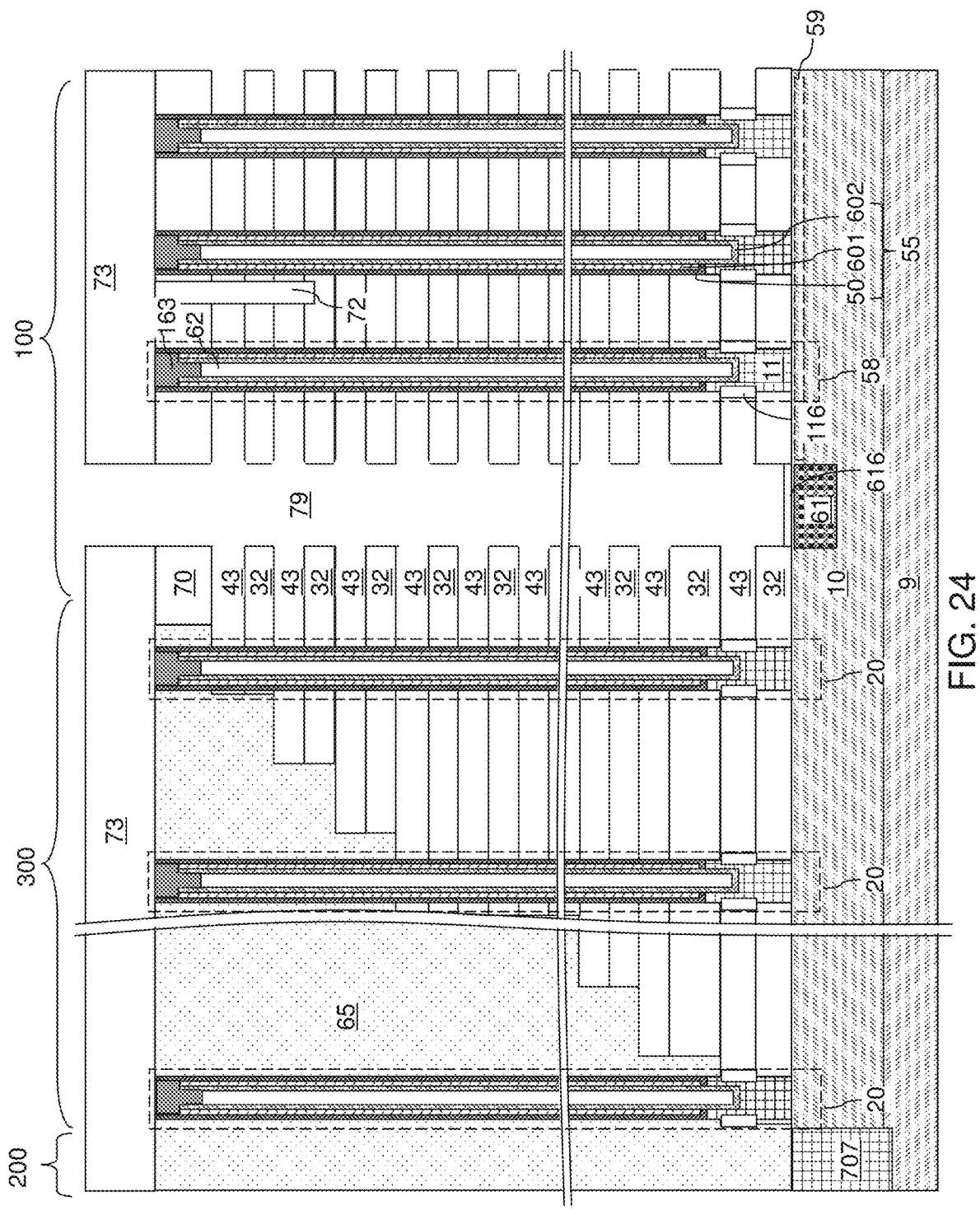
FIG. 24 is a schematic vertical cross-sectional view of the third exemplary structure after formation of backside recesses according to the third embodiment of the present disclosure.

Referring to FIG. 24, the processing steps of FIGS. 9 and 10A may be performed to form backside recesses 43, tubular dielectric spacers 116, and planar dielectric portions 616.

Figure 25:
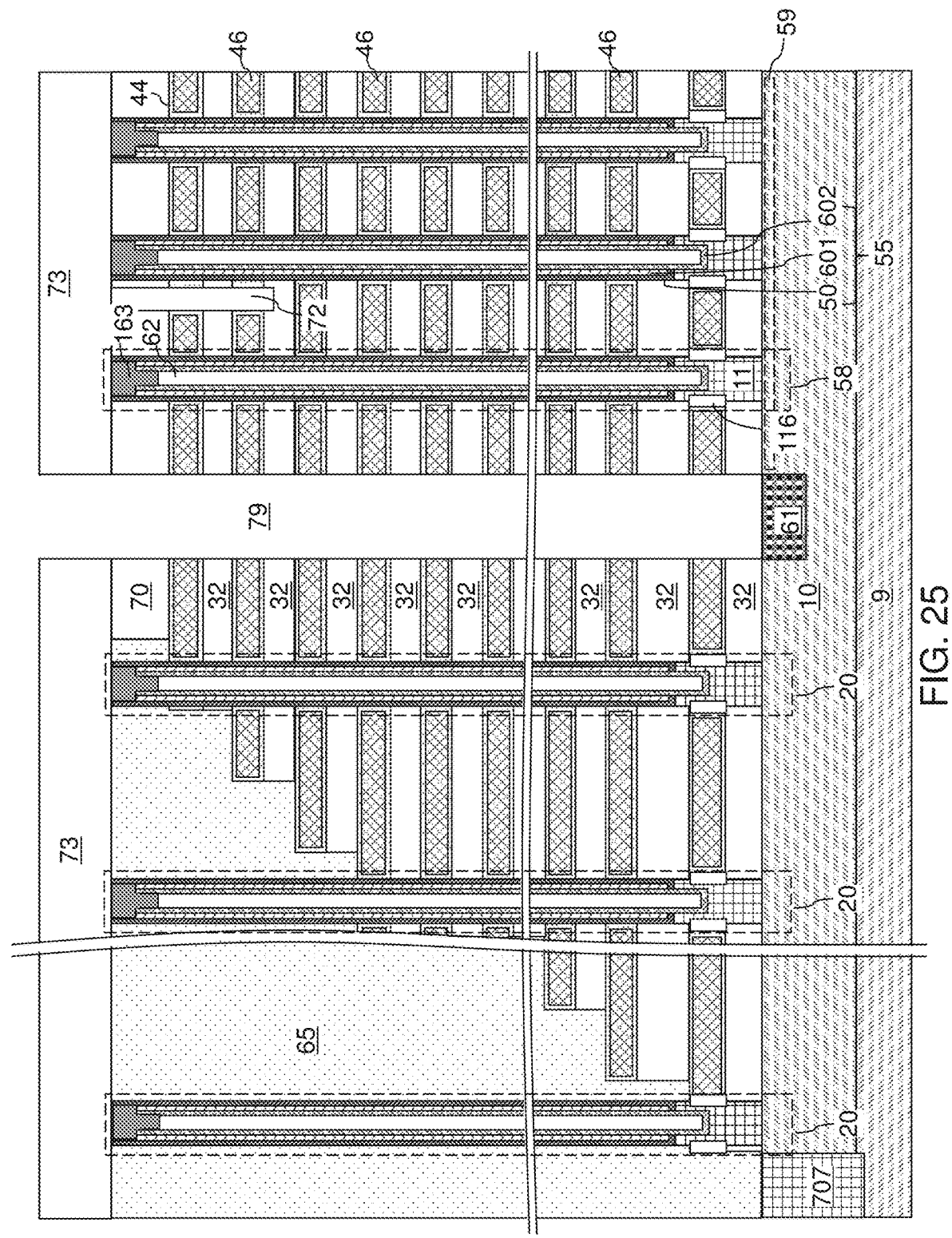
FIG. 25 is a schematic vertical cross-sectional view of the third exemplary structure after formation of electrically conductive layers according to the third embodiment of the present disclosure.

Referring to FIG. 25, the processing steps of FIGS. 10B, 10C, 10D, 11, 12A, and 12B can be performed to deposit an optional backside blocking dielectric layer 44, a metallic barrier layer 46A, and a metallic fill material layer 46B, and to remove the deposited metallic material from the sidewalls of each backside trench 79 and from above the contact-level dielectric layer 73. The sacrificial material layers 42 are replaced with the electrically conductive layers 46. A backside cavity 79' is present within each backside trench 79.

Figure 26A:
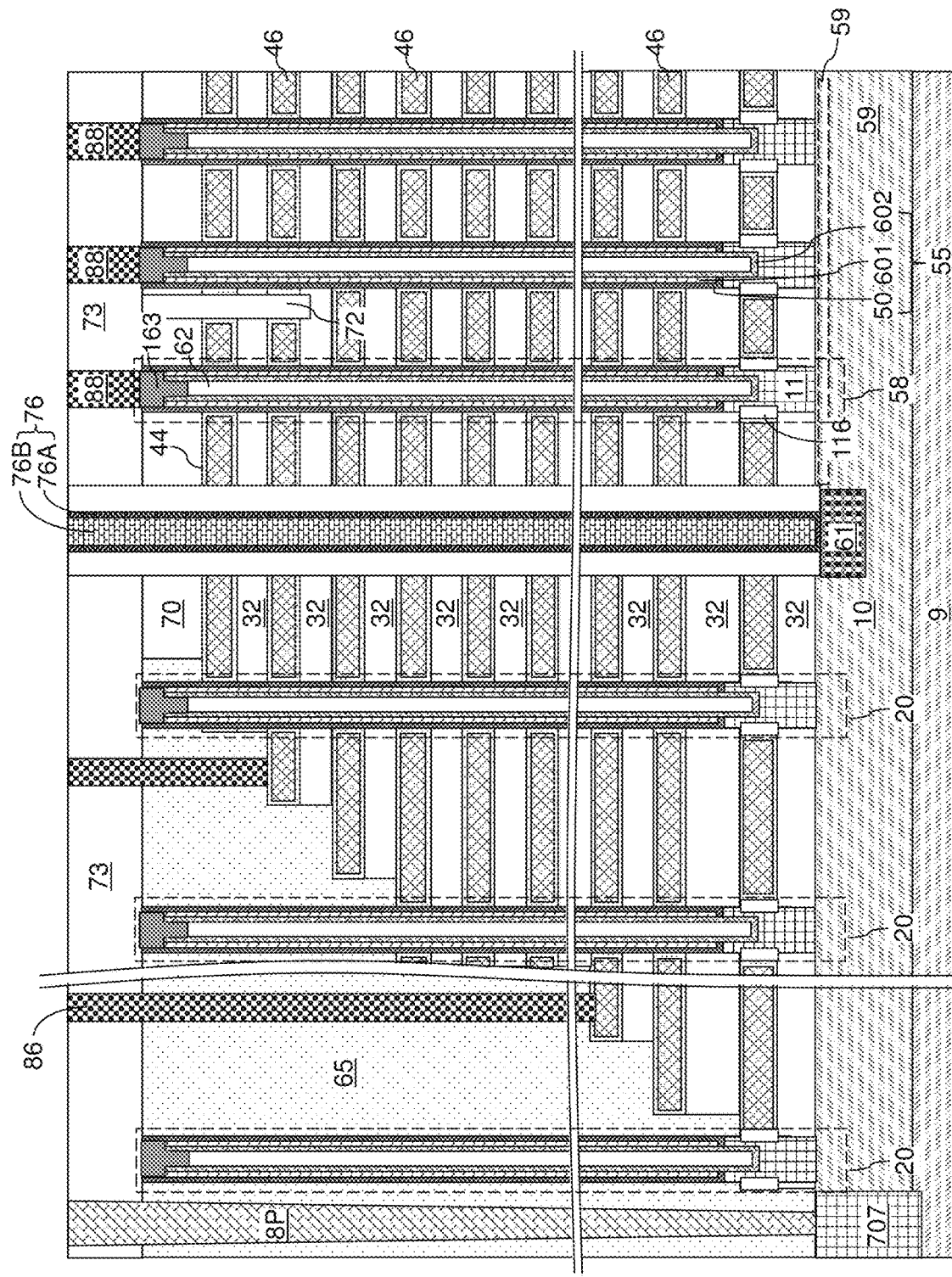
FIG. 26A is a schematic vertical cross-sectional view of the third exemplary structure after formation of additional contact via structures according to the third embodiment of the present disclosure.
Figure 26B:
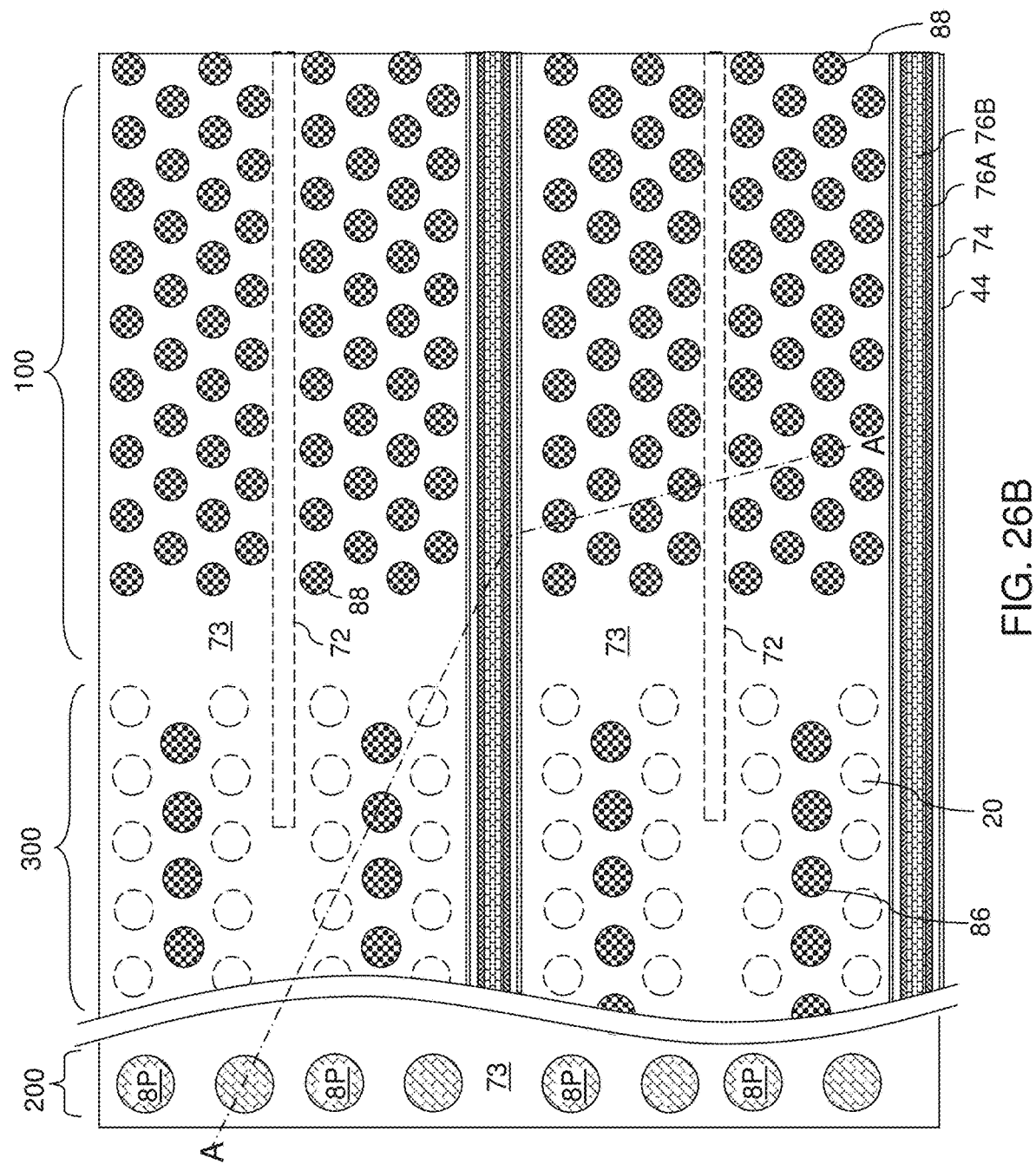
FIG. 26B is a top-down view of the third exemplary structure of FIG. 26A. The vertical plane A-A' is the plane of the schematic vertical cross-sectional view of FIG. 26A.

Referring to FIGS. 26A and 26B, the processing steps of FIGS. 13A and 13B can be performed to form an insulating spacer 74 and a backside contact via structure 76 within each backside trench 79. Subsequently, the processing steps of FIGS. 14A and 14B can be performed to form additional contact via structures (88, 86, 8P) through the contact-level dielectric layer 73, and optionally through the retro-stepped dielectric material portion 65.

Referring to FIGS. 1-20B and according to the first and second embodiments of the present disclosure, a memory device comprises: a strained single-crystalline silicon layer 930; an alternating stack of insulating layers 32 and electrically conductive layers 46 located over the strained single-crystalline silicon layer 930; a memory opening 49 vertically extending through the alternating stack (32, 46); a memory opening fill structure 58 located in the memory opening 49 and comprising an epitaxial silicon-containing pedestal channel portion 11 in epitaxial alignment with the strained single-crystalline silicon layer 930, a vertical semiconductor channel 60, a vertical stack of memory elements located adjacent to the vertical semiconductor channel 60 at levels of the electrically conductive layers 46, and a drain region (63 or 163). The vertical semiconductor channel 60 may be a polycrystalline vertical semiconductor channel.

In one embodiment, the memory device further comprises a single-crystalline silicon-germanium compound semiconductor layer 915, wherein the strained single-crystalline silicon layer 930 is located on and in epitaxial alignment with the single-crystalline silicon-germanium compound semiconductor layer 915.

In one embodiment, the strained single-crystalline silicon layer 930 and the epitaxial silicon-containing pedestal channel portion 11 have a doping of a first conductivity type; and a source region 61 having a doping of a second conductivity type opposite to the first conductivity type is in contact with the strained single-crystalline silicon layer 930 and is located outside the memory opening 49. In one embodiment, the source region 61 comprises: a lower source portion 61L comprising a doped single-crystalline silicon-germanium compound semiconductor material having a doping of the second conductivity type; and an upper source portion 61U comprising a doped single-crystalline strained silicon material and having a doping of the second conductivity type.

In one embodiment, the single-crystalline silicon-germanium compound semiconductor layer 915 has a doping of the first conductivity type or is intrinsic; the vertical semiconductor channel 60 has a doping of the first conductivity type; and the drain region (63 or 163) comprises a semiconductor material having a doping of the second conductivity type.

In one embodiment, the single-crystalline silicon-germanium compound semiconductor layer 915 comprises a compositionally graded single-crystalline silicon-germanium compound semiconductor material in which an atomic percentage of germanium increases monotonically with a vertical distance from the substrate single-crystalline silicon layer 9; and an atomic percentage of germanium in the single-crystalline silicon-germanium compound semiconductor layer 915 is in a range from 10% to 80%. In one embodiment, the strained single-crystalline silicon layer 930 is free of germanium or includes germanium atoms at an atomic percentage less than 0.1%.

In one embodiment, the single-crystalline silicon-germanium compound semiconductor layer 915 has a variable in-plane lattice constant that increases monotonically with a vertical distance from the substrate single-crystalline silicon layer 9; and a dislocation density decreases with the vertical distance from the substrate single-crystalline silicon layer 9 within an upper region of the single-crystalline silicon-germanium compound semiconductor layer 915.

In one embodiment, the single-crystalline silicon-germanium compound semiconductor layer 915 has a first thickness; the strained single-crystalline silicon layer 930 has a second thickness; and a ratio of the second thickness to the first thickness is in a range from 1:1000 to 1:10. In one embodiment, the first thickness is in a range from 100 nm to 2,000 nm; and the second thickness is in a range from 5 nm to 50 nm. In one embodiment, the single-crystalline silicon-germanium compound semiconductor layer 915 is formed on a single-crystalline silicon substrate 9.

In one embodiment, the drain region 163 comprises: a semiconductor drain portion 631 including a doped silicon-containing semiconductor material and contacting an end portion of the vertical semiconductor channel 60; and a nickel-aluminum-semiconductor alloy drain portion 632 comprising silicon and optionally comprising germanium. In one embodiment, a metallic drain electrode 633 comprising an elemental metal or a conductive metallic nitride material is in contact with a top surface of the nickel-aluminum-semiconductor alloy drain portion 632.

In one embodiment, the epitaxial silicon-containing pedestal channel portion 11 comprises single-crystalline silicon or single-crystalline silicon-germanium compound semiconductor layer. In one embodiment, the memory device may comprise a tubular dielectric spacer 116 laterally surrounding, and contacting, the epitaxial silicon-containing pedestal channel portion 11, and laterally surrounded by a bottommost one of the electrically conductive layers 46.

In one embodiment, the memory opening fill structure 58 comprises a memory film 50 including a layer stack containing at least a charge storage layer 54 and a tunneling dielectric layer 56; and the vertical stack of memory elements comprises portions of the charge storage layer 54 located at levels of the electrically conductive layers 46.

Referring to FIGS. 1-5H and FIGS. 15A-26B and related drawings and according the second and third embodiments of the present disclosure, a memory device comprises: an alternating stack of insulating layers 32 and electrically conductive layers 46 located over a semiconductor material layer {10 or (915, 930)}; a memory opening 49 vertically extending through the alternating stack (32, 46); and a memory opening fill structure 58 located in the memory opening 49 and comprising a vertical semiconductor channel 60, a vertical stack of memory elements located adjacent to the vertical semiconductor channel 60 at levels of the electrically conductive layers 46, and a drain region 163, wherein the drain region 163 comprises a semiconductor drain portion 631 including a doped silicon-containing semiconductor material and contacting an end portion of the vertical semiconductor channel 60, and a nickel-aluminum-semiconductor alloy drain portion 632 comprising silicon.

In one embodiment, a memory film 50 vertically extends through a subset of the electrically conductive layers 46 of the alternating stack (32, 46); and the vertical stack of memory elements comprises portions of the memory film 50 that are located at levels of the subset of the electrically conductive layers 46 (i.e., the electrically conductive layers 46 that are located above the horizontal plane including the top surfaces of the epitaxial silicon-containing pedestal channel portions 11). In one embodiment, the semiconductor drain portion 631 contacts a first cylindrical sidewall segment of the memory film 50; and the nickel-aluminum-semiconductor alloy drain portion 632 contacts a second cylindrical sidewall segment of the memory film 50.

In one embodiment, a metallic drain electrode 633 comprising, and/or consisting essentially of, an elemental metal or a conductive metallic nitride material is in contact with a top surface of the nickel-aluminum-semiconductor alloy drain portion 632 and a cylindrical sidewall segment of the memory film 50 (such as a third cylindrical sidewall segment that is located above, and is adjoined to, the second cylindrical sidewall segment). In one embodiment, the memory device may comprise an insulating cap layer 70 overlying the alternating stack (32, 46), wherein a top surface of the memory opening fill structure 58 comprises a top surface of the metallic drain electrode 633, and is located within a horizontal plane including a top surface of the insulating cap layer 70. In one embodiment, the metallic drain electrode 633 consists essentially of a material selected from W, Mo, Ta, Nb, TaN, TiN, and WN. In one embodiment, the metallic drain electrode 633 consists essentially of W.

In one embodiment, the semiconductor drain portion 631 comprises, and/or consists essentially of, a doped polysilicon including at least one electrical dopant species; and the nickel-aluminum-semiconductor alloy drain portion 632 comprises, and/or consists essentially of a nickel aluminum silicide, and the at least one electrical dopant species. In another embodiment, the vertical semiconductor channel 60 comprises, and/or consists essentially of, polysilicon having a doping of a first conductivity type; and the semiconductor drain portion 631 has a doping of a second conductivity type that is the opposite of the first conductivity type.

In one embodiment, the semiconductor drain portion 631 comprises, and/or consists essentially of, a doped silicon-germanium compound semiconductor including at least one electrical dopant species; and the nickel-aluminum-semiconductor alloy drain portion 632 comprises, and/or consists essentially of a nickel aluminum silicide, a nickel aluminum germanide or a nickel aluminum silicide germanide, and the at least one electrical dopant species. In one embodiment, the vertical semiconductor channel 60 comprises, and/or consists essentially of, a doped polycrystalline silicon-germanium compound semiconductor material having a doping of a first conductivity type; and the semiconductor drain portion has a doping of a second conductivity type that is the opposite of the first conductivity type.

In one embodiment, the memory opening fill structure 58 comprises a dielectric core 62 in contact with an inner sidewall of the vertical semiconductor channel 60 and in contact with a bottom surface of the drain region 63.

Each of the memory devices of the embodiments of the present disclosure may comprise three-dimensional array of memory devices including a plurality of memory openings 49 and a plurality of memory opening fill structures 58 that fills a respective one of the memory openings 49. The three-dimensional array of memory devices may be formed as a three-dimensional array of NAND memory devices including a two-dimensional array of vertical NAND strings. Each vertical NAND string may include an epitaxial silicon-containing pedestal channel portions 11, a vertical semiconductor channel 60, and a drain region (63, 163). The external resistance of each vertical NAND string can be reduced by including the nickel-aluminum-semiconductor alloy drain portion 632 in the drain region 163 to reduce the Schottky barrier between the vertical semiconductor channel 60 and the drain region 163 and/or by using the high electron mobility strained single-crystalline silicon layer 930 in the horizontal semiconductor channels 59 adjoined to the vertical NAND strings.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device comprising:
a strained single-crystalline silicon layer;
an alternating stack of insulating layers and electrically conductive layers located over the strained single-crystalline silicon layer;
a memory opening vertically extending through the alternating stack; and
a memory opening fill structure located in the memory opening and comprising an epitaxial silicon-containing pedestal channel portion in epitaxial alignment with the strained single-crystalline silicon layer, a vertical semiconductor channel, a vertical stack of memory elements located adjacent to the vertical semiconductor channel at levels of the electrically conductive layers, and a drain region;
wherein:
the single-crystalline silicon-germanium compound semiconductor layer has a first thickness;
the strained single-crystalline silicon layer has a second thickness; and
a ratio of the second thickness to the first thickness is in a range from 1:1000 to 1:10.

2. The memory device of claim 1, further comprising a single-crystalline silicon-germanium compound semiconductor layer, wherein the strained single-crystalline silicon layer is located on and in epitaxial alignment with the single-crystalline silicon-germanium compound semiconductor layer.

3. The memory device of claim 2, wherein:
the strained single-crystalline silicon layer and the epitaxial silicon-containing pedestal channel portion have a doping of a first conductivity type; and
a source region having a doping of a second conductivity type opposite to the first conductivity type is in contact with the strained single-crystalline silicon layer and is located outside the memory opening.

4. The memory device of claim 3, wherein the source region comprises:
a lower source portion comprising a doped single-crystalline silicon-germanium compound semiconductor material having a doping of the second conductivity type; and
an upper source portion comprising a doped single-crystalline strained silicon material and having a doping of the second conductivity type.

5. The memory device of claim 3, wherein:
the single-crystalline silicon-germanium compound semiconductor layer has a doping of the first conductivity type or is intrinsic;
the vertical semiconductor channel is intrinsic or has a doping of the first conductivity type; and
the drain region comprises a semiconductor material having a doping of the second conductivity type.

6. The memory device of claim 2, wherein:
the single-crystalline silicon-germanium compound semiconductor layer comprises a compositionally graded single-crystalline silicon-germanium compound semiconductor material in which an atomic percentage of germanium increases monotonically with a vertical distance from the substrate single-crystalline silicon layer;

an atomic percentage of germanium in the single-crystalline silicon-germanium compound semiconductor layer is in a range from 10% to 80%; and the strained single-crystalline silicon layer is free of germanium or includes germanium atoms at an atomic percentage less than 0.1%.

7. The memory device of claim 2, wherein the single-crystalline silicon-germanium compound semiconductor layer is formed on a single-crystalline silicon substrate.

8. The memory device of claim 1, wherein:
the single-crystalline silicon-germanium compound semiconductor layer has a variable in-plane lattice constant that increases monotonically with a vertical distance from the substrate single-crystalline silicon layer; and a dislocation density decreases with the vertical distance from the substrate single-crystalline silicon layer within an upper region of the single-crystalline silicon-germanium compound semiconductor layer.

9. The memory device of claim 1, wherein the drain region comprises:
a semiconductor drain portion including a doped silicon-containing semiconductor material and contacting an end portion of the vertical semiconductor channel; and a nickel-aluminum-semiconductor alloy drain portion comprising silicon.

10. The memory device of claim 9, further comprising a metallic drain electrode comprising an elemental metal or a conductive metallic nitride material in contact with a top surface of the nickel-aluminum-semiconductor alloy drain portion.

11. The memory device of claim 1, wherein the epitaxial silicon-containing pedestal channel portion comprises single-crystalline silicon or single-crystalline silicon-germanium compound semiconductor layer.

12. The memory device of claim 1, wherein:
the memory opening fill structure comprises a memory film including a layer stack containing at least a charge storage layer and a tunneling dielectric layer; and the vertical stack of memory elements comprises portions of the charge storage layer located at levels of the electrically conductive layers.

13. A memory device comprising:
a strained single-crystalline silicon layer;
an alternating stack of insulating layers and electrically conductive layers located over the strained single-crystalline silicon layer;
a memory opening vertically extending through the alternating stack;
a memory opening fill structure located in the memory opening and comprising an epitaxial silicon-containing pedestal channel portion in epitaxial alignment with the strained single-crystalline silicon layer, a vertical semiconductor channel, a vertical stack of memory elements located adjacent to the vertical semiconductor channel at levels of the electrically conductive layers, and a drain region; and
a single-crystalline silicon-germanium compound semiconductor layer,
wherein:
the strained single-crystalline silicon layer is located on and in epitaxial alignment with the single-crystalline silicon-germanium compound semiconductor layer;

the strained single-crystalline silicon layer and the epitaxial silicon-containing pedestal channel portion have a doping of a first conductivity type;

a source region having a doping of a second conductivity type opposite to the first conductivity type is in contact with the strained single-crystalline silicon layer and is located outside the memory opening; and the source region comprises:
a lower source portion comprising a doped single-crystalline silicon-germanium compound semiconductor material having a doping of the second conductivity type; and an upper source portion comprising a doped single-crystalline strained silicon material and having a doping of the second conductivity type.

14. A memory device comprising:
a strained single-crystalline silicon layer;
an alternating stack of insulating layers and electrically conductive layers located over the strained single-crystalline silicon layer;
a memory opening vertically extending through the alternating stack; and
a memory opening fill structure located in the memory opening and comprising an epitaxial silicon-containing pedestal channel portion in epitaxial alignment with the strained single-crystalline silicon layer, a vertical semiconductor channel, a vertical stack of memory elements located adjacent to the vertical semiconductor channel at levels of the electrically conductive layers, and a drain region;
wherein:
the single-crystalline silicon-germanium compound semiconductor layer has a variable in-plane lattice constant that increases monotonically with a vertical distance from the substrate single-crystalline silicon layer; and
a dislocation density decreases with the vertical distance from the substrate single-crystalline silicon layer within an upper region of the single-crystalline silicon-germanium compound semiconductor layer.

15. A memory device comprising:
a strained single-crystalline silicon layer;
an alternating stack of insulating layers and electrically conductive layers located over the strained single-crystalline silicon layer;
a memory opening vertically extending through the alternating stack; and
a memory opening fill structure located in the memory opening and comprising an epitaxial silicon-containing pedestal channel portion in epitaxial alignment with the strained single-crystalline silicon layer, a vertical semiconductor channel, a vertical stack of memory elements located adjacent to the vertical semiconductor channel at levels of the electrically conductive layers, and a drain region;
wherein the drain region comprises:
a semiconductor drain portion including a doped silicon-containing semiconductor material and contacting an end portion of the vertical semiconductor channel; and
a nickel-aluminum-semiconductor alloy drain portion comprising silicon.

* * * * *